US006330574B1

United States Patent

(12) United States Patent
Murashita
(10) Patent No.: US 6,330,574 B1
(45) Date of Patent: Dec. 11, 2001

(54) COMPRESSION/DECOMPRESSION OF TAGS IN MARKUP DOCUMENTS BY CREATING A TAG CODE/DECODE TABLE BASED ON THE ENCODING OF TAGS IN A DTD INCLUDED IN THE DOCUMENTS

(75) Inventor: Kimitaka Murashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/050,104

(22) Filed: Mar. 30, 1998

(30) Foreign Application Priority Data

Aug. 5, 1997 (JP) .................................................. 9-210915

(51) Int. Cl.[7] ........................................................ G06F 7/00

(52) U.S. Cl. ........................ 707/513; 707/501.1; 707/101

(58) Field of Search .................................... 707/501, 513, 707/101, 532

(56) References Cited

U.S. PATENT DOCUMENTS 5,179,378 * 1/1993 Ranganathan et al. ................ 341/51
5,590,317 12/1996 Iguchi et al. ............................. 707/2
5,663,721 * 9/1997 Rossi ...................................... 341/51
5,673,322 * 9/1997 Pepe et al. ............................ 705/52
5,832,126 * 11/1998 Tanaka ................................. 382/239
5,854,597 * 12/1998 Murashita et al. ..................... 341/51
5,890,172 * 3/1999 Borman et al. ...................... 707/501
5,893,109 * 4/1999 Derose et al. ....................... 707/104
5,946,697 * 8/1999 Shen ..................................... 707/104
5,991,713 * 11/1999 Unger et al. ............................ 704/9
5,999,949 * 12/1999 Crandall .............................. 707/523
6,055,544 * 4/2000 Derose et al. ....................... 707/104

FOREIGN PATENT DOCUMENTS 0 595 064 5/1994 (EP) .
0928070-A2 * 7/1999 (GB) .
8-255155 10/1996 (JP) .

OTHER PUBLICATIONS

Performance Analysis of the Wireless Hypermedia System, Satoh et al, ICPWC'97 IEEE, p.293–296.*
"Text File Compression For Computer Programs", *IBM Technical Disclosure Bulletin*, vol. 37, No. 6A, Jun. 1, 1994, p. 375.
Katajainen, J. et al., "An Approximation Algorithm for Space–Optimal Encoding of a Text", *Computer Journal*, vol. 32, No. 3, Jun. 1, 1989 pp. 228–237.
Kadach, A.V., "Text and Hypertext Compression", *Programming and Computer Software, vol. 23, No. 4, Jul. 1997, pp. 212–219.*

* cited by examiner

*Primary Examiner*—Stephen S. Hong
*Assistant Examiner*—Cesar B Paula
(74) *Attorney, Agent, or Firm*—Staas & Halsey LLP

(57) ABSTRACT

In a tag document compressing/decompressing technique, a tag document compressing apparatus, for example, has a tag extracting unit for scanning document type definition of an inputted tag document to extract a tag, a tag code table creating unit for assigning a predetermined code to the tag in the document type definition on the basis of the tag extracted by the tag extracting unit to create a tag code table, and a tag coding unit for coding the tag in document instance on the basis of the tag code table created by the tag code table creating unit so as to compress the document in consideration of the tag in the tag document, thereby improving a compression rate of the tag document and decreasing a quantity of data of the same.

42 Claims, 32 Drawing Sheets

FIG. 31
PRIOR ART

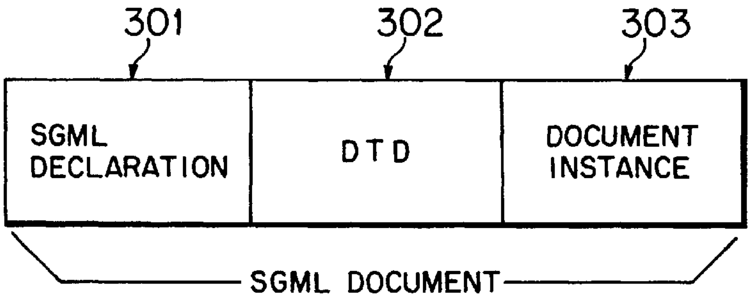

FIG. 32
PRIOR ART

AN EXAMPLE OF DTD

```
<! --HTML. DTD-->
<! ENTITY % ACONTENT "( % HEADINGL% TEXT )* ">
<! ELEMENT A -- % A . CONTENT-(A)>
<! ATTLIST A
      HREF CDATA #IMPLIED
      NAME CDATA # IMPLIED
      % LINK EXTRA ATTRIBUTES;
      % SDAPREF; "<ANCHOR. #ATTLIST>"
      >
<!__<A>   ANCHOR. SOURCE / DESTINATION OF LINK -->
<!__<A NAME="___"> NAME OF THIS ANCHOR -->
<!__<A HREF="___"> ADDRESS OF LINK DESTINATION -->
<!__<A URN=___>PERMANENT ADDRESS OF DESTINATION-->
<!__<A REL=___> RELATIONSHIP TO DESTINATION-->
<!__<A REV=___> RELATIONSHIP OF DESTINATION TO THIS -->
<!__<A TITLE="___"> TITLE OF DESTINATIORR (ADVISARY)-->
<!__<A METHODS="___"> OPERATIONS ON DESTINATION (ADVISORY)-->
```

<TITLE>発明(考案)説明書 </TITLE><P>
<SECTION>発明(考案)の名称 </SECTION>
　　データ圧縮・復元方法及び装置並びに文書管理システム <P>
<SECTION>請求項目の範囲</SECTION>
<SUBSECTION>入力データを符号化するデータ圧縮装置において,</SUBSECTION>
<LIST>
　<ITEM>符号表を保持する手段と
　<ITEM>符号表を元に入力データを符号化する過程と
</LIST>を有することを特徴としたデータ圧縮方法。<P>

COMPRESSION/DECOMPRESSION OF TAGS IN MARKUP DOCUMENTS BY CREATING A TAG CODE/DECODE TABLE BASED ON THE ENCODING OF TAGS IN A DTD INCLUDED IN THE DOCUMENTS

BACKGROUND OF THE INVENTION (1) Field of the Invention

The present invention relates to a technique of compressing and decompressing data, particularly, to an apparatus, a method and a recording medium suitable for use when a document (a tag document) structured and described according to control characters (strings) called tags defining a document structure is compressed and decompressed.

(2) Description of the Related Art

A recent trend is to unify formats of documents handled by computers, an aim of which is to be able to handle formats of documents, which have been different from computer to computer, or from application to application, in different computer environments.

For example, there is an international standard (IS08879) for a document format called SGML (Standard Generalized Markup Language) established by ISO in 1986. An SGML document consists of, as schematically shown in FIG. 31, three portions, that is, SGML declaration 301, document type definition (DTD: Document Type Definition) 302 and document instance 303.

The SGML declaration 301 is a portion declaring a character set and the like necessary to process an SGML document in another system. The DTD 302 is a portion defining a structure of a document such as chapter, paragraph, title, etc., which is described in a format as shown in FIG. 32, for example. The DTD 302 shown in FIG. 32 is a portion of DTD of HTML (Hyper Text Markup Language), which is a kind of SGML spread as a description format of WWW (World Wide Web) of Internet.

The document instance 303 is a body of the SGML document, which is made by a writer (user) using an editor of the computer while referring to the DTD 302. The document instance 303 is described using controlling characters (strings) showing elements generally called tags. Each of the tags is defined in the above DTD 302, which represents what is an element in a document instance 303 (for example, whether the element is a title, a chapter, or the like).

FIG. 33 is a diagram showing an example of description of the document instance 303. In FIG. 33, a character string (<TITLE>, </TITLE>, <SECTION>, </SECTION>, etc.) sandwiched between “<” and “>”, or “</” and “>” is a tag. As shown in FIG. 33, a portion described as:

<TITLE> 発明(考案)明 細書 </TITLE>represents that characters (strings) sandwiched between <TITLE> which is a start-tag and </TITLE> which is an end-tag is an element (a name of title).

There is now a strong movement to employ SGML. In particular, the National Military Establishment of U.S.A. imposes a duty on a person to describe a document in SGML to submit it. In Japan, the Patent Office has decided to employ SGML for CD-ROM publications.

Meanwhile, various types of data such as character codes, vector information, image information, etc. are handled in computers, with the quantity of data being rapidly increasing, in these years. With this, a computer generally eliminates redundant portions in data to compress a quantity of the data so as to decrease a storage capacity for the data, or enable a high-speed data transmission, when handling a large quantity of data.

There are several manners of data compressing. Herein are described an archiver and a compressing drive as examples of application of data compression used in computers.

The archiver is a manner of compressing one or a plurality of data files, and collecting them into one file. By using the archiver on a file rarely used or an old file, it is possible to decrease a capacity of the file. When a server supplies files (data, application or the like) through a personal computer communication or Internet, it is possible to save communication cost, and reduce labor required in transferring collecting all the files into one, using the archiver.

On the other hand, the compressing drive is a manner of compressing data by disk drive such as a hard disk (HD), a floppy disk (FD) or the like of a computer, as a unit. By designating an arbitrary disk drive, all files in the designated drive are compressed and held. In the compressing drive, a compressing/decompressing process is generally performed in a background of the computer, so that compression/decompression (decompression at the time of reading, and compression at the time of writing) is automatically performed in ordinary operations (read/write) by the user. Therefore, it looks to the user that a size of the designated disk system is increased since the user is not at all conscious of compression/decompression of data.

As a coding system used in these examples of application, there is often used universal coding system in which the efficiency of compression is not dependent much upon characters of data, since various data such as character, machine language, image, voice, etc. are handled in the computer.

The universal coding is classified into LZ-coding which utilizes repeatability of a character, and statistical coding which codes a probability of occurrence of a character. The LZ-coding stores a character (string) that occurred in the past in a buffer, and outputs a start position in the buffer and a coinciding length as coded data when the same character (string) occurs. The statistical coding calculates a probability (frequency) of occurrence of a character having occurred in the past, and outputs a code according to the probability of occurrence. The LZ-coding can accomplish a high-speed process, whereas the statistical coding can accomplish a high-compression rate.

The data compressing techniques are ordinarily used to decrease a data amount in the computer or a communication cost. As to a document file, it is possible to compress the whole document so as to manage a large volume of documents.

In the document instance 303 of the SGML document, a quantity of data of the document is increased since tags defining elements in the document are added to the document itself. A study on an SGML document revealed that a proportion of tags in the document exceeds forty percent. Not only documents submitted to public agencies but also manuals attached to products are more being and more changed to SGML documents, recently. Such manual are of several tens to, sometimes, several hundred pages, and are frequently revised. If a history of the revision is included, a quantity of data of the manual is enormous.

If the SGML document is compressed using the above universal coding or other coding system as well as ordinary documents or documents in another format, it is possible to decrease a quantity of the data to some extent. However, the above manners are quite inefficient since a coding system heretofore used is merely applied to the SGML document in any case, in which no consideration is made regarding tags occupying a large portion in the document in the compression.

SUMMARY OF THE INVENTION

In the light of the above problems, an object of the present invention is to improve a compression rate of a tag document and decrease a quantity of data thereof by compressing and decompressing the document in consideration of tags in the tag document.

The present invention therefore provides a tag document compressing apparatus for coding a tag document having a document type definition defining a tag showing a document structure and a document instance described using the tag defined in the document type definition to compress the tag document comprising a tag extracting unit for scanning the document definition of an inputted tag document to extract the tag, a tag code table creating unit for assigning a predetermined code to the tag in the document definition on the basis of the tag extracted by the tag extracting unit to create a tag code table, and a tag coding unit for coding the tag in the document instance on the basis of the tag code table created by the tag code table creating unit.

The present invention also provide a tag document compressing method for coding a tag document having a document type definition defining a tag showing a document structure and a document instance described using the tag defined in the document type definition to decompress the tag document comprising the steps of assigning a predetermined code to the tag in the document type definition to create a tag code table, and decoding the tag in the document instance on the basis of the tag code table.

According to the tag document compressing apparatus and compressing method of this invention, a predetermined code is assigned to a tag in the document type definition to create a tag code table, the tag in the document type definition is coded on the basis of the tag code table. It is therefore possible to compress tags in a tag document very efficiently, and largely decrease a quantity of data of the tag document.

If a plurality of tag documents having the same document type definition are coded, it is possible to code tags in the document type definitions of all of the tag documents on the basis of a tag code table created with respect to the first document.

Accordingly, it is unnecessary to create a tag code table for each tag document so that the tag coding process can be performed at a very high speed.

The present invention further provides a tag document compressing apparatus for coding a tag document having a document type definition defining a tag showing a document structure and a document instance described using the tag defined in the document type definition to compress the tag document comprising a tag extracting unit for scanning the document type definition of an inputted tag document to extract the tag, a tag code creating unit for assigning a predetermined code to the tag in the document type definition on the basis of the tag extracted by the tag extracting unit to create a tag code table, a tag discriminating unit for determining whether data in the inputted document instance is the tag extracted by the tag extracting unit, a coding process unit for coding the inputted data on the basis of the tag code table when the tag discriminating unit determines that the inputted data is the tag, whereas coding the inputted data in a predetermined coding system when the tag discriminating unit determines that the inputted data is not the tag, and a special code outputting unit for outputting a special code showing coding of a tag to a decoding side of the tag before the inputted data is coded when the tag discriminating unit discriminates that the inputted data is the tag.

The present invention also provides a tag document compressing method for coding a tag document having a document type definition defining a tag showing a document structure and a document instance described using the tag defined in the document type definition to decompress the tag document comprising the steps of assigning a predetermined code to the tag in the document type definition to create a tag code tag, outputting a special code showing coding of a tag to a decoding side of the tag when inputted data of the document instance is the tag and coding the inputted data on the basis of the tag code table, whereas coding the inputted data in a predetermined coding system when the inputted data is not the tag.

The tag document compressing apparatus and compressing method according to this invention can compress very efficiently not only tags in a tag document but also the document other than the tags. It is therefore possible to more largely decrease a quantity of data of a tag document. Further, the decoding side can readily discriminate a tag by the above special code. This largely contributes to speeding-up of the tag decoding process.

The above coding process unit may have a first coding unit for coding the inputted data on the basis of the tag code table, a second coding unit for coding the inputted data in a predetermined coding system, and a switching control unit for outputting the inputted data to the first coding unit when the tag discriminating unit determines that the inputted data is the tag, whereas outputting the inputted data to the second coding unit when the tag discriminating unit determines that the inputted data is not the tag. In such case, the coding process unit can be realized with a simple structure.

The above tag code table is created in such a manner that a tag is stored in the tag storing unit, and information on a storing position in the tag storing unit is assigned as a code of the tag. Accordingly, a code is assigned to a tag only by successively storing tags in the tag storing unit. It is therefore possible to create the above tag code table with an extremely simple structure, and at a high speed.

If the above information on a storing position is information including address information of the above tag storing unit, the tag coding can be performed at a higher speed since the address information of the tag storing unit is used as it is as a code of a tag.

If the above information on a storing position is, for example, the above address information and information of a length of a tag, the tag coding side can readily specify a tag to be decoded since the length of the tag is also assigned as a code of the tag. This largely contributes to speeding up of the tag decoding process.

Alternatively, the above tag code table may be created in such a manner that a predetermined initial code is assigned to a tag extracted by the tag extracting unit to create a first coding dictionary, and a code in the first coding dictionary is updated according to a frequency of occurrence of a corresponding tag when the tag is coded. Accordingly, as the coding of tags is proceeded, a shorter code is assigned to a tag more frequently occurring, for example. This largely improves a compression rate of tags.

Still alternatively, the above tag code table may be created in such a manner that the frequency of occurrence of a tag in the document instance is counted, and a code according to a result of the counting is assigned to the tag to create a second coding dictionary. Accordingly, it is possible to assign in advance a short code to a tag frequently occurring before the tag is coded so as to improve a compression rate of tags and speed up the compressing process.

In the above case, the compressing apparatus of this invention may have an occurrence frequency information outputting unit for outputting information on the frequency of occurrence of the above tag to the decoding side of the tag, whereby the decoding side can readily create the same dictionary as the second coding dictionary. This largely improves accuracy of the tag decoding process on the decoding side.

The above second coding dictionary creating unit may have a tag counting unit for determining whether the tag extracted by the tag extracting unit coincides with the tag in the document instance to count the frequency of occurrence of the tag in the document instance, a code generating unit for generating a code according to a result of the counting by the tag counting unit, and a code holding unit for holding the code generated by the code generating unit to create the second coding dictionary.

In the above case, it is possible to readily create the second coding dictionary.

The present invention still further provides a tag document compressing apparatus for coding a tag document having a document type definition defining a tag showing a document structure and a document instance described using the tag defined in the document type definition to compress the tag document comprising a tag extracting unit for scanning the document type definition of an inputted tag document to extract the tag, a tag code table creating unit for assigning a predetermined code to the tag in the document type definition on the basis of the tag extracted by the tag extracting unit to create a tag code table, a tag discriminating unit for determining whether inputted data in the document instance is the tag extracted by the tag extracting unit, and a coding process unit for coding the inputted data on the basis of the tag code table when the tag discriminating unit determines that the inputted data is the tag, whereas coding the inputted data in a predetermined coding system when the tag discriminating unit determines that the inputted data is not the tag.

The present invention also provides a tag document compressing method for coding a tag document having a document type definition defining a tag showing a document structure and a document instance described using the tag defined in the document type definition to compress the tag document comprising the steps of assigning a predetermined code to the tag to create a tag code table, coding inputted data in the document instance on the basis of the tag code table when the inputted data is the tag, whereas coding the inputted data in a predetermined coding system when the inputted data is not the tag.

According to the tag document compressing apparatus and compressing method of this invention, a predetermined code is assigned to a tag in the document type definition to create a tag code table, and inputted data is coded on the basis of the above tag code table when the inputted data in the document instance is the tag, whereas the inputted data is coded in a predetermined coding system when the inputted data is not the tag. Accordingly, it is possible to more increase a compression rate since no special code is outputted.

The above tag discriminating unit may detect a start-tag showing a start of a tag on the basis of the tag extracted by the tag extracting unit to determine that the inputted data is the tag.

In the above case, it is possible to discriminate a tag with a simpler structure and at a higher speed, thus the tag compressing process can be sped up.

The present invention still further provides a tag document decompressing apparatus for decoding a coded tag document having a document type definition defining a tag showing a document structure and a document instance described using the tag defined in the document type definition to decompress the coded tag document comprising a tag extracting unit for scanning the document type definition of an inputted tag document to extract the tag, a tag decode table creating unit for assigning a predetermined code to the tag in the document type definition on the basis of the tag extracted by the tag extracting unit to create a tag decode table, and a tag decoding unit for decoding the tag in the coded document instance on the basis of the tag decode table created by the tag decode table creating unit.

The present invention also provides a tag document decompressing method for decoding a coded tag document having a document type definition defining a tag showing a document structure and a document instance described using the tag defined in the document type definition to decompress the coded tag document comprising the steps of assigning a predetermined code to the tag in the document type definition to create a tag decode table, and decoding the tag in the coded document instance on the basis of the tag decode table.

According to the tag document decompressing apparatus and method of this invention, a predetermined code is assigned to a tag in the document type definition to create a tag decode table, and the tag in the coded document instance is decoded on the basis of the tag decode table. Accordingly, it is possible to decode (decompress) tags in a coded tag document very efficiently and accurately.

When a plurality of tag documents having the same document type definition are decoded, the above tag decoding unit may decode tags in the document instances of all of the tag documents on the basis of the tag decode table created with respect to the first tag document by the tag extracting unit and the tag decode table creating unit.

In the above case, it is unnecessary to create a tag decode table for each tag document so that the tag decoding process can be performed at a very high speed.

The present invention still further provides a tag document decompressing apparatus for decoding a coded tag document having a document type definition defining a tag showing a document structure and a document instance described using the tag defined in the document type definition to decompress the coded tag document comprising a tag extracting unit for scanning the document definition of an inputted tag document to extract the tag, a tag decode table creating unit for assigning a predetermined code to the tag in the document type definition on the basis of the tag extracted by the tag extracting unit to create a tag decode table, a special code discriminating unit for determining whether inputted coded data is a special code showing inputting of coded data of a tag, and a decoding process unit for decoding coded data following the special code on the basis of the decode table when the special code discriminating unit determines that the coded data is the special code, whereas decoding the coded data in a predetermined decoding system when the special code discriminating unit determines that the coded data is not the special code.

The present invention also provides a tag document decompressing method for decoding a coded tag document having a document type definition defining a tag showing a document structure and a document instance described using the tag defined in the document type definition to decompress the coded tag document comprising the steps of assigning a predetermined code to the tag in the document type definition to create a tag decode table, and decoding coded data inputted following a special code showing that coded data is inputted on the basis of the tag decode table when the inputted coded data is the special code, whereas decoding the coded data in a predetermined decoding system when the inputted coded data is not the special code.

According to the tag document decompressing apparatus and method of this invention, not only tags but also a document other than the tags can be decompressed very efficiently and accurately. The tag document decompressing apparatus and method of this invention can also determine whether coded data that is an object of the decompressing is a tag or not only by detecting the special code. This largely speeds up the tag decompressing process.

The above decoding process unit may have a first decoding unit for decoding the inputted coded data on the basis of the tag decode table, a second decoding unit for decoding the inputted coded data in a predetermined decoding system, and a switching control unit for outputting coded data following the special code to the first decoding unit when the special code discriminating unit determines that the coded data is the special code, whereas outputting the coded data to the second decoding unit when the special code discriminating unit determines that the coded data is not the special code.

In the above case, the decoding process may be readily realized in a simple structure.

Alternatively, the tag decode table creating unit may have a tag storing unit for storing the tag extracted by the tag extracting unit, and assign information on a position in which the tag is stored in the tag storing unit as a code of the tag to create tag decode table.

In the above case, a code is assigned to each tag only by successively storing tags in the tag storing unit so that the above tag decode table can be created with a simple structure and at a high speed.

The above information on a storing position may be information including address information of the tag storing unit. In such case, the tag decoding side can readily fetch a tag corresponding to coded data from the tag storing unit so long as the tag is coded as information including the address information on the coding side since the address information of the tag storing unit is used as it is as a code of the tag. This largely speeds up the tag decoding process.

If the information on a storing position is the above address information and information on a length of a tag, the length of the tag is also assigned as a code of the tag. So long as a tag is coded with the address information and the information on a length of the tag on the coding side, it is possible to fetch a tag corresponding to the coded data from the tag storing unit more accurately. This largely contributes to speeding-up and improvement in accuracy of the tag decoding process.

Still alternatively, the above tag decode table creating unit may have a first decoding dictionary creating unit for assigning a predetermined initial code to the tag extracted by the tag extracting unit to create a first decoding dictionary of the tag as the tag decode table, and a decoding dictionary updating unit for updating the code in the first decoding dictionary created by the first decoding dictionary creating unit according to the frequency of occurrence of a corresponding tag when the decoding process unit decodes the tag.

In the above case, a shorter code is re-assigned to a tag more frequently occurring as the decoding of tags is proceeded. This largely improves efficiency of the tag decoding.

The above tag decode table may be created as a second decoding dictionary in such a manner that a code is assigned to a tag in the document instance according to the frequency of occurrence of the tag on the basis of the tag in the document type definition and information on the frequency of occurrence of the tag. In such case, a short code is in advance assigned to a tag frequently occurring before the tag is decoded so that an efficiency of the tag decoding may be improved and the decoding process may be sped up.

The present invention still further provides a tag document decompressing apparatus for decoding a coded tag document having a document type definition defining a tag showing a document structure and a document instance described using the tag defined in the document type definition to decompress the coded tag document comprising a tag extracting unit for scanning the document type definition of an inputted tag document to extract the tag, a tag decode table creating unit for assigning a predetermined code to the tag in the document type definition on the basis of the tag extracted by the tag extracting unit to create a tag decode table, a tag code discriminating unit for determining whether inputted coded data is coded data of the tag, and a decoding process unit for decoding the coded data on the basis of the tag decode table when the tag code discriminating unit determines that the coded data is the tag, whereas decoding the coded data in a predetermined decoding system when the code discriminating unit determines that the coded data is not the tag.

The present invention also provides a tag document decompressing method for decoding a coded tag document having a document type definition defining a tag showing a document structure and a document instance described using the tag defined in the document type definition to decompress the coded tag document comprising the steps of assigning a predetermined code to the tag in the document type definition to create a tag decode table, and decoding inputted coded data on the basis of the tag decode table when the inputted coded data is coded data of the tag, whereas decoding the inputted coded data in a predetermined decoding system when the inputted coded data is not coded data of the tag.

According to the tag document decompressing apparatus and method of this invention, it is possible to accurately perform the tag decompressing process while increasing efficiency of the compression on the coding side since no special code is received.

At this time, the tag code discriminating unit may detect a start-tag showing a start of a tag to determine that the coded data is the tag. In such case, it is possible to discriminate a tag with a simple structure and at a high speed so as to speed up the tag decompressing process.

The present invention still further provides a tag document compressing/decompressing apparatus for coding tag document having a document type definition defining a tag showing a document structure and a document instance described using the tag defined in the document type definition to compress the tag document, and decoding the coded tag document to decompress the same comprising a tag extracting unit for scanning the document type definition of an inputted tag document to extract the tag, a tag code/decode table creating unit for assigning a predetermined code to the tag in the document type definition on the basis of the tag extracted by the tag extracting unit to create a tag code/decode table, a tag coding unit for coding the tag in the document instance on the basis of the tag code/decode table created by the tag code/decode table creating unit, and a tag decoding unit for decoding the tag in the document instance coded by the tag coding unit on the basis of the tag code/decode table created by the tag code/decode table creating unit.

The present invention also provides a tag document compressing/decompressing method for coding a tag document having a document type definition defining a tag showing a document structure and a document instance described using the tag defined in the document type definition to compress the tag document, and decoding the coded tag document to decompress the same comprising the steps of assigning a predetermined code to the tag in the document type definition to create a tag code/decode table, coding the tag in the document instance on the basis of the tag code/decode table, and decoding the coded tag on the basis of the tag code/decode table.

According to the tag document compressing/decompressing apparatus and method of this invention, a predetermined code is assigned to a tag in the document instance to create a tag code/decode table, and, when the tag is decoded, the tag is decoded on the basis of the above tag code/decode table used when the tag is coded. It is thereby unnecessary to create at least a decode table for decoding a tag separately from a code table for coding the tag. This largely contributes to speeding-up of the tag decoding (decompressing) process and a decrease of a scale of the apparatus.

The present invention still further provides a tag document compressing/decompressing apparatus for coding a tag document having a document type definition defining a tag showing a document structure and a document instance described using the tag defined in the document type definition to compress the tag document, and decoding the coded tag document to decompress the same comprising a tag extracting unit for scanning the document type definition of an inputted tag document to extract the tag, a tag code/decode table creating unit for assigning a predetermined code to the tag in the document type definition on the basis of the tag extracted by the tag extracting unit to crate a tag code/decode table, a tag discriminating unit for determining whether inputted data in the document instance is the tag extracted by the tag extracting unit, a coding process unit for coding the inputted data on the basis of the tag code/decode table when the tag discriminating unit determines that the inputted data is the tag, whereas coding the inputted data in a predetermined coding system when the tag discriminating unit determines that the inputted data is not the tag, a special code outputting unit for outputting a special code showing coding of a tag before the inputted data is coded when the tag discriminating unit determines that the inputted data is the tag, a special code discriminating unit for determining whether coded data outputted from the coding process unit is the special code, and a decoding process unit for decoding coded data following the special code outputted from the coding process unit on the basis of the tag code/decode table when the special code discriminating unit determines that the coded data is the special code, whereas decoding the coded data outputted from the coding process unit in a predetermined decoding system when the special code discriminating unit determines that the coded data is not the special code.

The present invention also provides a tag document compressing/decompressing method for coding a tag document having a document type definition defining a tag showing a document structure and a document instance described using the tag defined in the document type definition to compress the tag document, and decoding the coded tag document to decompress the same comprising the steps of assigning a predetermined code to the tag in the document type definition to create a tag code/decode table, outputting a special code showing coding of a tag when inputted data in the document instance is the tag and coding the inputted data on the basis of the tag code/decode table, whereas coding the inputted data in a predetermined coding system when the inputted data is not the tag, and when coded data is decoded, decoding coded data following the special code on the basis of the tag code/decode table when the coded data is the special code, whereas decoding the coded data in a predetermined decoding system when the coded data is not the special code.

According to the tag document compressing/decompressing apparatus and method of this invention, a predetermined code is assigned to a tag in the document instance to create a tag code/decode table, and the tag is decoded on the basis of the tag code/decode table when a special code similar to the above is detected in the event of tag decoding. Similarly to the above case, this largely contributes to speeding-up of the tag decoding (decompressing) process and a decrease of a scale of the apparatus. With the above special code, it is possible to specify a tag that is an object of the decoding and decode the tag at a high speed and accurately.

The present invention still further provides a recording medium readable by a computer storing a tag document compressing program for coding a tag document having a document type definition defining a tag showing a document structure and a document instance described using the tag defined in the document type definition to compress the tag document, characterized by that the tag document compressing program makes the computer function as a tag extracting unit for scanning the document type definition of an inputted tag document to extract the tag, a tag code table creating unit for assigning a predetermined code to the tag on the basis of the tag extracted by the tag extracting unit to create a tag code table, and a tag coding unit for coding the tag in the document instance on the basis of the tag code table created by the tag code table creating unit.

The present invention also provides a recording medium readable by a computer storing a tag document compressing program for coding a tag document having a document type definition defining a tag showing a document structure and a document instance described using the tag defined in the document type definition to compress the tag document, characterized by that the tag document compressing program makes the computer function as a tag extracting unit for scanning the document type definition of an inputted tag document to extract the tag, a tag code table creating unit for assigning a predetermined code to the tag in the document type definition on the basis of the tag extracted by the tag extracting unit to create a tag code table, a tag discriminating unit for determining whether inputted data in the document instance is the tag extracted by the tag extracting unit, a coding process unit for coding the inputted data on the basis of the tag code table when the tag discriminating unit determines that the inputted data is the tag, whereas coding the inputted data in a predetermined coding system when the tag discriminating unit determines that the inputted data is not the tag, and a special code outputting unit for outputting a special code showing coding of a tag to a decoding side of the tag before the inputted data is coded when the tag discriminating unit determines that the inputted data is the tag.

The present invention still further provides a recording medium readable by a computer storing a tag document decompressing program for decoding a coded tag document having a document type definition defining a tag showing a document structure and a document instance described using the tag defined in the document type definition to decompress the coded tag document, characterized by that the tag document decompressing program makes the computer function as a tag extracting unit for scanning the document type definition of an inputted tag document to extract the tag, a tag decode table creating unit for assigning a predetermined code to the tag in the document type definition on the basis of the tag extracted by the tag extracting unit to create a tag decode table, and a tag decoding unit for decoding the tag in the coded document instance on the basis of the tag decode table created by the tag decode table creating unit.

The present invention also provides a recording medium readable by a computer storing a tag document decompressing program for decoding a coded tag document having a document type definition defining a tag showing a document structure and a document instance described using the tag defined in the document type definition to decompress the tag document, characterized by that the tag document decompressing program makes the computer function as a tag extracting unit for scanning the document type definition of an inputted tag document to extract the tag, a tag decode table creating unit for assigning a predetermined code to the tag in the document type definition on the basis of the tag extracted by the tag extracting unit, a special code discriminating unit for determining whether inputted coded data is a special code showing that coded data of a tag is inputted, and a decoding process unit for decoding coded data inputted following the special code on the basis of the tag decode table when the special code discriminating unit determines that the coded data is the special code, whereas decoding the coded data in a predetermined decoding system when the special code discriminating unit determines that the coded data is not the special code.

The present invention still further provides a recording medium readable by a computer storing a tag document compressing/decompressing program for coding a tag document having a document type definition defining a tag showing a document structure and a document instance described using the tag defined in the document type definition to compress the tag document and decoding the coded tag document to decompress the same, characterized by that the tag document compressing/decompressing program makes the computer function as a tag extracting unit for scanning the document type definition of an inputted tag document to extract the tag, a tag code/decode table creating unit for assigning a predetermined code to the tag on the basis of the tag extracted by the tag extracting unit to create a tag code/decode table, a tag coding unit for coding the tag in the document instance on the basis of the tag code/decode table created by the tag code/decode table creating unit, and a tag decoding unit for decoding the tag in the document instance coded by the tag coding unit on the basis of the tag code/decode table created by the tag code/decode table creating unit.

The present invention also provides a recording medium readable by a computer storing a tag document compressing/decompressing program for coding a tag document having a document type definition defining a tag showing a document structure and a document instance described using the tag defined in the document type definition to compress the tag document and decoding the coded tag document to decompress the same, characterized by that the tag document compressing/decompressing program makes the computer function as a tag extracting unit for scanning the document type definition of an inputted tag document to extract the tag, a tag code/decode table creating unit for assigning a predetermined code to the tag in the document type definition on the basis of the tag extracted by the tag extracting unit to create a tag code/decode table, a tag discriminating unit for determining whether inputted data of the document instance is the tag extracted by the tag extracting unit, a coding process unit for coding the inputted data on the basis of the tag code/decode table when the tag discriminating unit determines that the inputted data is the tag, whereas coding the inputted data in a predetermined system when the tag discriminating unit determines that the inputted data is not the tag, a special code outputting unit for outputting a special code showing coding of a tag before the inputted data is coded when the tag discriminating unit determines that the inputted is one of the tags, and a decoding process unit for decoding coded data following the special code outputted from the coding process unit on the basis of the tag code/decode table when the special code discriminating unit determines that the coded data is the special code, whereas decoding the coded data in a predetermined decoding system when the special code discriminating unit determines that the coded data is not the special code.

Each of the above tag document compressing apparatus, the tag document decompressing apparatus and the tag document compressing/decompressing apparatus may be readily realized by storing a compressing program, a decompressing program or a compressing/decompressing program in a recording medium readable by a computer, and providing the recording medium to a desired computer. This largely improve versatility of this invention, leading to a spread of this invention.

BRIEF DESCRIPTION OF THE DRAWINGS

FIG. 31 is a diagram schematically showing a format of an SGML document;

FIG. 32 is a diagram showing an example of description of document type definition (DTD) of an SGML document; and FIG. 33 is a diagram showing an example of description of document instance of an SGML document.

DESCRIPTION OF THE PREFERRED EMBODIMENTS (a) Description of a First Embodiment of This Invention As shown in FIG. 1, the system according to this embodiment is configured with personal computers 2 and 3 connected to a certain network 6 such as Internet or the like via network connecting apparatus 4 such as modems or TAs (Terminal Adapters).

Figure 1:
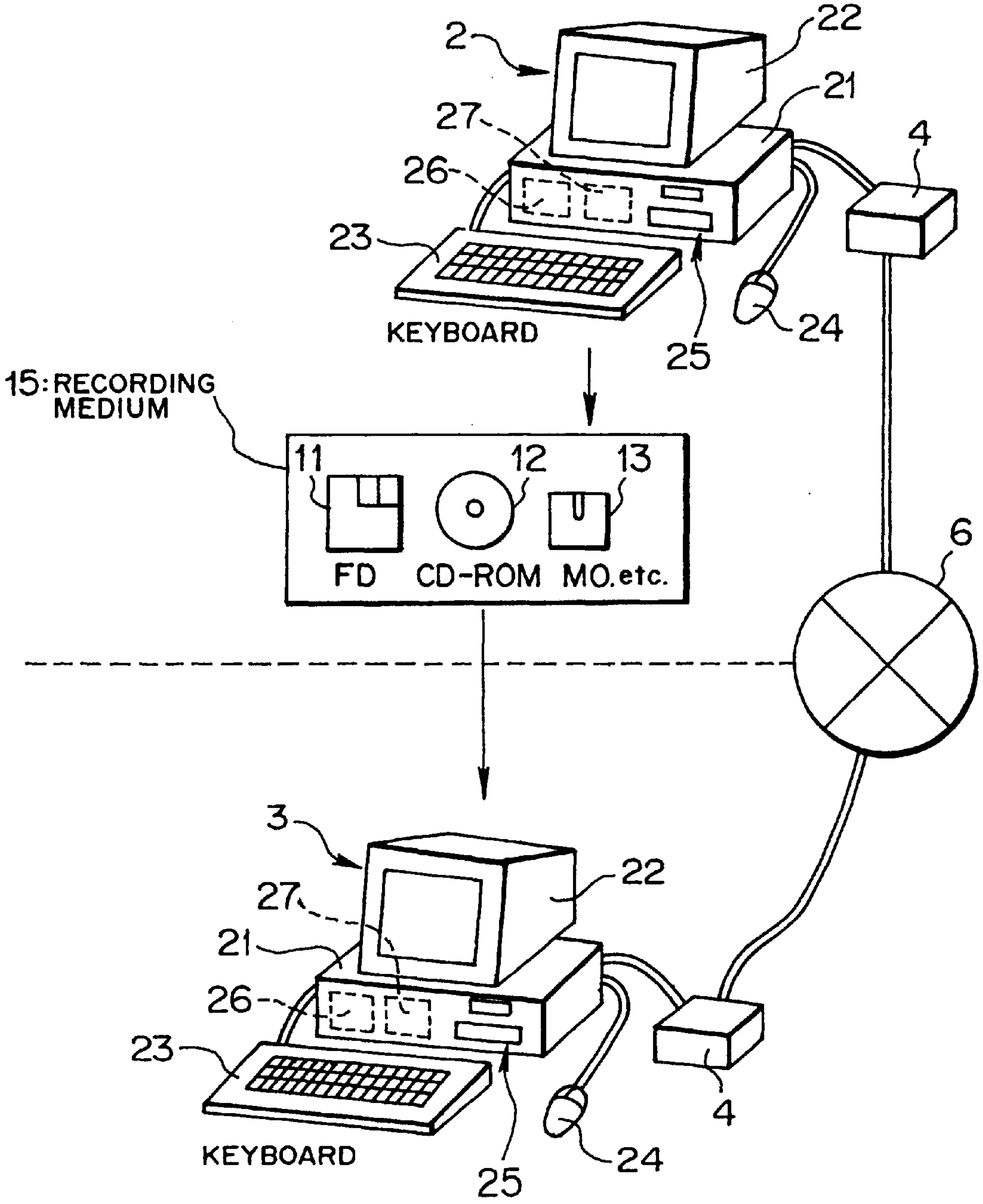
FIG. 1 is a block diagram showing a computer system to which a compressing apparatus and a decompressing apparatus for an SGML document (tag document) according to a first embodiment of this invention are applied.

Each of the personal computers 2 and 3 has, as shown in FIG. 1, a personal computer main body 21, a display (display screen) 22, a keyboard 23 and a mouse (pointing device) 24, etc. The user can make the above-described SGML document (tag document) with an editor in the personal computer 2 or 3 through the keyboard 23, stores the made document as a document file in a hard disk (storage apparatus) 27 in the main body 21 through a process by a CPU (Central Processing Unit) 26, or provide the made document (that is, transfer the file) to another personal computer 3 or 2 over the network 6.

When the above SGML document is stored in the hard disk 27 or transferred over the network 6 as above, it is desirable that the SGML document is coded, compressed, and stored/transferred in order to save memory capacity, data transmission quantity, and data transmission time. The compressed document is then decompressed (decoded) when displayed on the display 22 or printed out, since the SGML document is of a large quantity of data.

Particularly, in the case of a system in which plural kinds of SGML documents are circulated (for example, CALS system or the like), portions other than the document instance 303 of the SGML document are required to be sent each time. By encoding and compressing the SGML document and sending it rather than sending the SGML document as it is, it is possible to decrease a transmission time, a capacity of a storage apparatus on the transmitter's side (the server's side)/receiver's side (client's side) of the document.

According to this embodiment, a compression program or a decompression program for the SGML document is stored in the hard disk 27, and the CPU 26 operates according to the program, whereby the personal computer 2 or 3 (the CPU 26, in concrete) is used as a compressing apparatus which codes and compresses the SGML document or a decompressing apparatus which decodes and decompresses the SGML document having been coded and compressed.

Hereinafter, description will be made on an assumption that the personal computer 2 is a compressing apparatus for an SGML document, whereas the personal computer 3 is a decompressing apparatus for an SGML document, for the sake of convenience.

The user can make each of the above programs using the personal computer 2 or 3 and store it in the hard disk 27, in advance. Alternatively, the user can store the program in the hard disk 27 by reading the program stored in advance in a recording medium 15 in various type such as a floppy disk (FD) 11, a CD-ROM 12, an MO (magneto-optic disk) 13, or the like through a disk drive 25.

Figure 2:
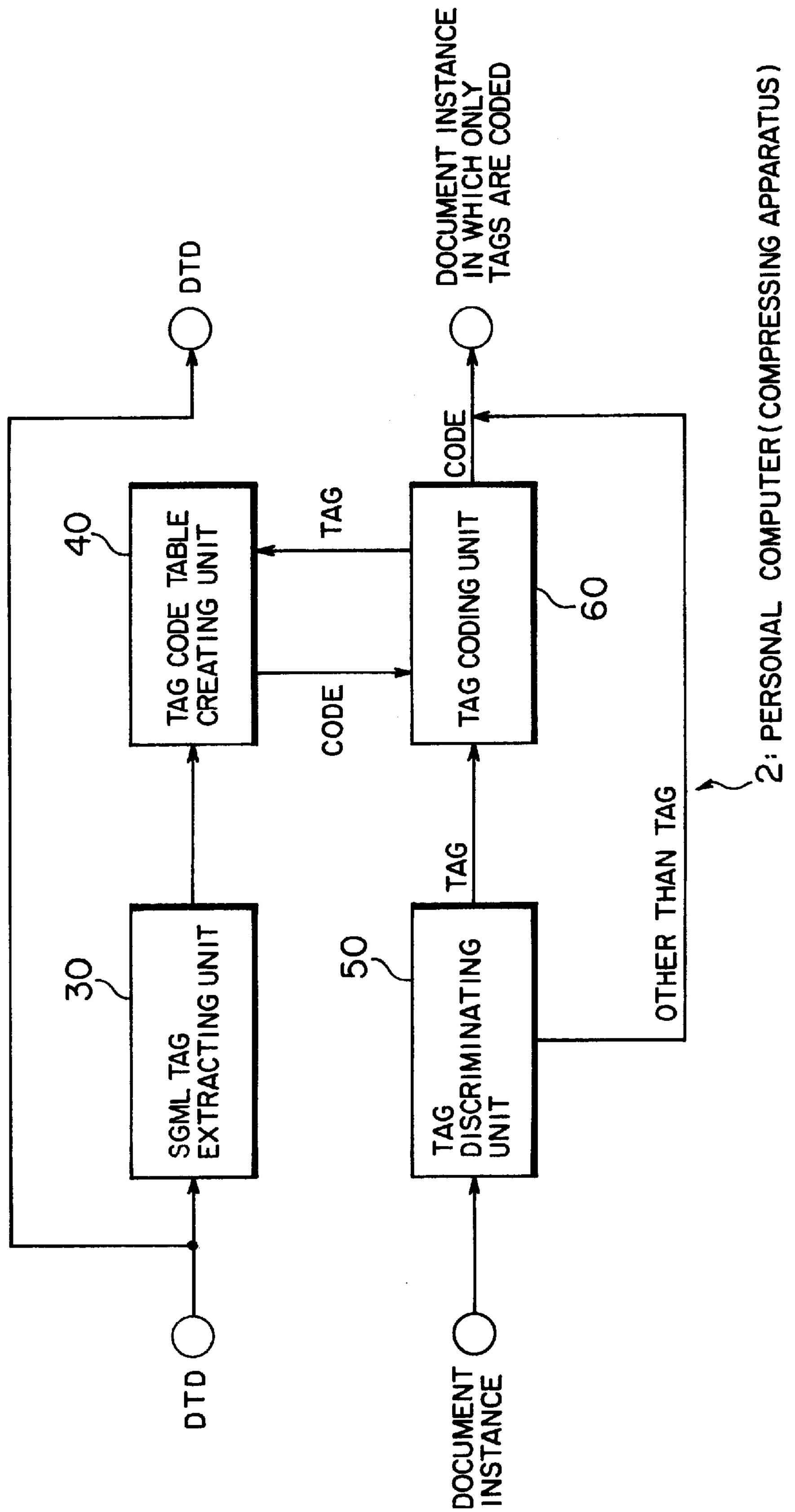
FIG. 2 is a block diagram showing a structure of an essential part of a personal computer as the compressing apparatus for an SGML document according to the first embodiment.

(a1) Description of a Compressing Apparatus (Decoding Side) for an SGML Document FIG. 2 is a block diagram showing a structure of an essential part of the personal computer 2 as a compressing apparatus for the above SGML document. As shown in FIG. 2, the personal computer (hereinafter referred as a compressing apparatus) 2 according to this embodiment has an SGML tag extracting unit 30, a tag code table creating unit 40, a tag discriminating unit 50 and a tag coding unit 60.

The SGML tag extracting unit 30 scans the DTD (document type definition) 302 (refer to FIG. 31) of an SGML document inputted by reading the SGML document stored as a document file in the hard disk 27 by the CPU 26, for example, and extracts tags defined in the DTD 302. The tag code table creating unit 40 assigns a predetermined code to each of the tags in the DTD 302 on the basis of the tags extracted by the tag extracting unit 30 so as to create a tag code table. For instance, data other than data assigned to characters (UNICODE, for example) is assigned to the codes of the tags.

The tag discriminating unit 50 determines whether data (a character or a character string) in the document instance 303 of the SGML document inputted together with the DTD 302 is a tag or not. If the inputted data is a tag, the tag discriminating unit 50 outputs the data to the tag coding unit 60. If the inputted data is not a tag, the tag discriminating unit 50 outputs the data as it is to the outside (the hard disk 27 or the network 6, for example).

The tag coding unit 60 codes the tags in the document instance 303 of the SGML document on the basis of the tag code table created by the tag code table creating unit 40. Here, the tag coding unit 60 outputs a code in the above code table corresponding to the inputted data (tag) from the tag discriminating unit 50 as a code of the tag.

Figure 3:
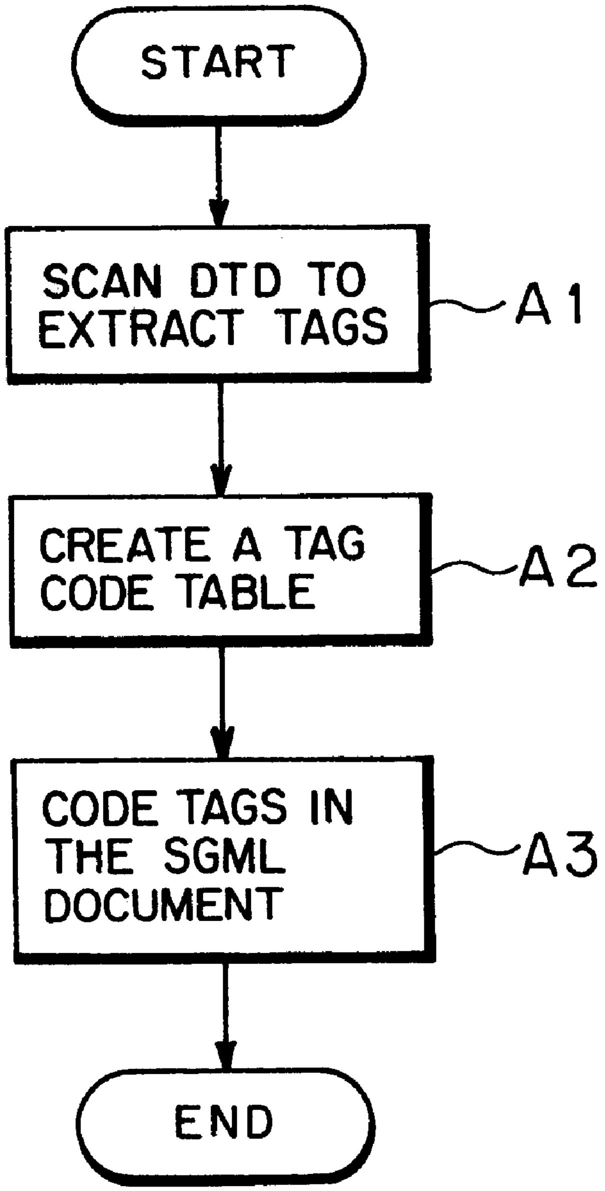
FIG. 3 is a flowchart for illustrating an operation of the compressing apparatus for an SGML document according to the first embodiment.

In the compressing apparatus 2 with the above structure according to the first embodiment, as shown in FIG. 3, the SGML tag extracting unit 30 scans the DTD 302 of the SGML document to extract tags (Step A1), and the tag code table creating unit 40 assigns a predetermined code to each of the extracted tags to create a tag code table (Step A2). When the tag discriminating unit 50 determines that data in the document instance 303 of the inputted SGML document is a tag, the tag coding unit 60 codes the data on the basis of the above tag code table and outputs the coded data (Step A3).

Assuming here that the SGML tag extracting unit 30 extracts tags <TITLE> and </TITLE>, and the tag code table creating unit 40 assigns <TITLE>="00" and </TITLE>="10" to the respective tags, so as to create a tag codes table, for example. If

<TITLE>発明(考案)明細書</TITLE> is inputted at this time as the document instance 303, for example, the tag discriminating unit 50 first determines that <TITLE> is a tag so as to output the tag to the tag coding unit 60. The tag coding unit 60 obtains a code "00" corresponding to <TITLE> by referring to the above tag code table on the basis of the inputted tag (<TITLE>), and outputs "00" as a code of <TITLE>.

The tag discriminating unit 50 secondary determines whether data inputted following the above tag (<TITLE>) is a tag or not. Following to the above <TITLE> is "発明(考案)明細書" so that the tag discriminating unit 50 determines that the inputted data is other than a tag so as to output the inputted data as it is, not coding the input data.

After that, the tag discriminating unit 50 further determines whether inputted data is a tag or not. Here, following to the above "発明(考案)明細書" is </TITLE> (an end-tag) so that the tag discriminating unit 50 outputs the tag to the tag coding unit 60. The tag coding unit 60 obtains a code "10" corresponding to </TITLE> by referring to the above tag code table on the basis of the inputted tag (</TITLE>), and outputs "10" as a code of </TITLE>.

As a result, in the above document instance 303, only the tags are coded and compressed as "00発明(考案)明細書10", and outputted, finally. According to this embodiment, the DTD 302 is not coded, thus outputted as it is.

According to this embodiment, the compressing apparatus 2 for an SGML document assigns a predetermined code to each of tags in the DTD 302 to create a tag code table, and codes tags in the document instance 303 on the basis of the tag code table. It is thereby possible to compress tags frequently used, in general, in the SGML document very efficiently, thus largely decreasing a quantity of data in the SGML document.

Therefore, not only a memory capacity used to store an SGML document is saved, but also a transmission quantity of data and a transmission time of data at the time of transmission of the SGML document over the network 6 are largely decreased.

Figure 4:
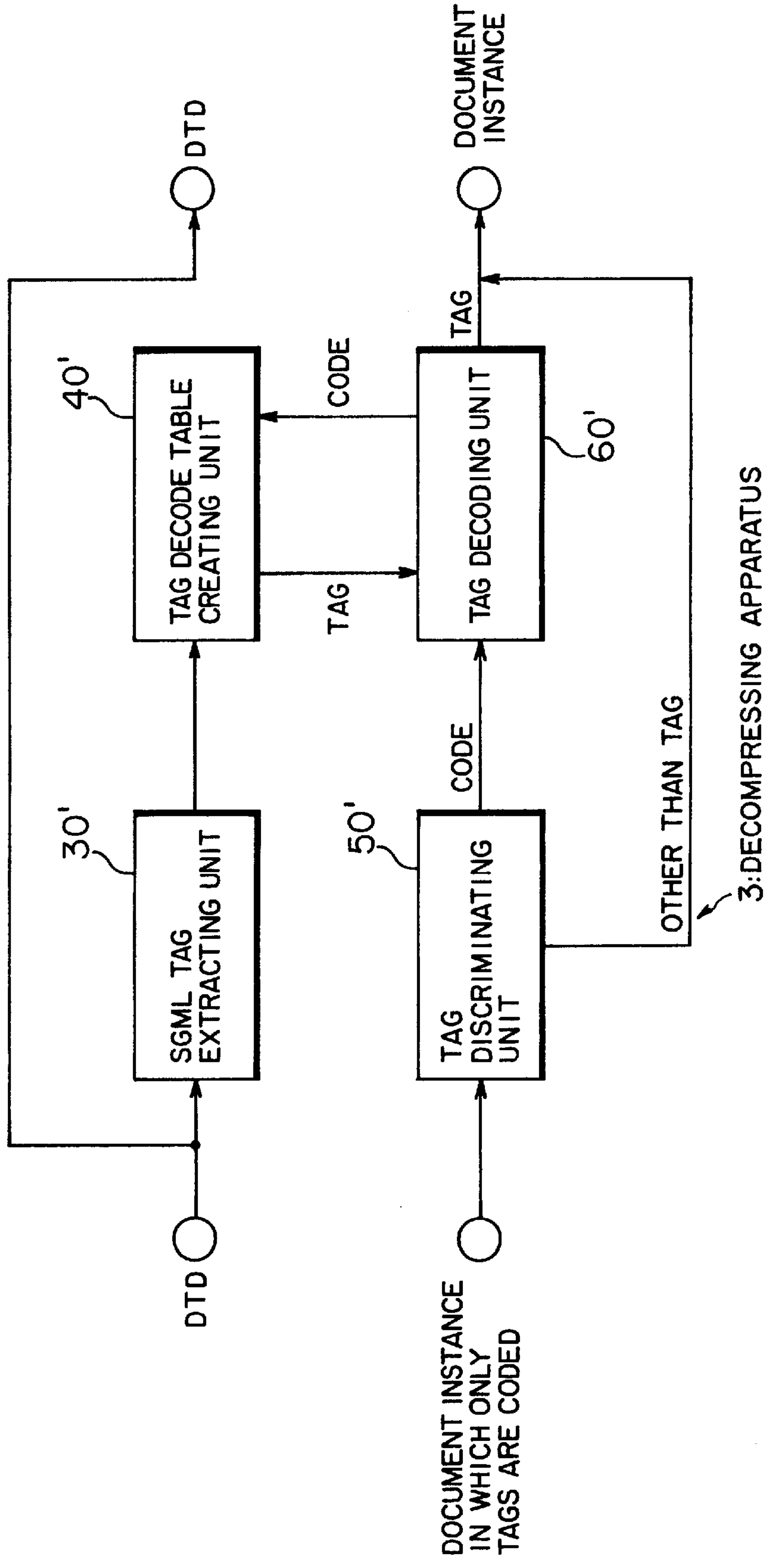
FIG. 4 is a block diagram showing a structure of an essential part of a personal computer as the decompressing apparatus for an SGML document according to the first embodiment.

(a2) Description of a Decompressing Apparatus (Decoding Side) for an SGML Document FIG. 4 is a block diagram showing a structure of an essential part of the personal computer 3 as a decompressing apparatus for the above SGML document. The personal computer (hereinafter, referred as a decompressing apparatus) 3 shown in FIG. 4 is to decompress (decode) the SGML document coded (compressed) by the above compressing apparatus 2 shown in FIG. 2. According to this embodiment, the decompressing apparatus 3 has an SGML tag extracting unit 30', a tag decode table creating unit 40', a tag discriminating unit 50' and a tag decoding unit 60'.

The SGML tag extracting unit 30' scans the DTD 302 (not coded) inputted from the compressing apparatus 2 over, for example, the network 6 to extract tags defined in the DTD 302. The tag decode table creating unit 40' assigns a predetermined code to each of the tags in the DTD 302 on the basis of the tags extracted by the tag extracting unit 30' to create a tag decode table.

The tag discriminating unit 50' determines whether data in the document instance 303 of the SGML document in which only tags have been coded on the coding side inputted together with the DTD 302 is a tag or not. If the inputted data is a tag, the tag discriminating unit 50' outputs the coded data to the tag decoding unit 60'. If the inputted data is other than a code of a tag, the tag discriminating unit 50' outputs the inputted data as it is to the outside (the hard disk 27, for example). For instance, if data other than data assigned to characters (UNICODE, for example) is assigned to codes on the coding side, it is possible to detect a code of a tag by detecting data other than characters.

The tag decoding unit 60' decodes the tags in the coded document instance 303 on the basis of the tag decode table created by the tag decode table creating unit 40'. Here, the tag decoding unit 60' outputs a tag in the above decode table corresponding to the data (a code of the tag) inputted from the tag discriminating unit 50' as a result of the decoding.

Figure 5:
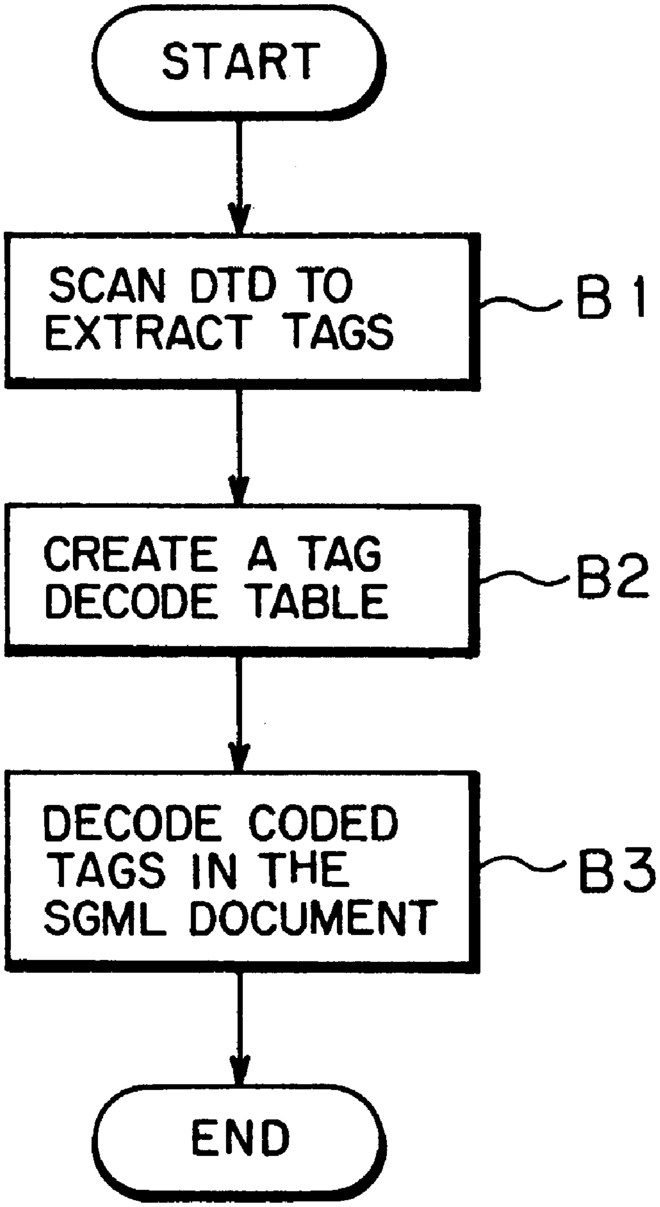
FIG. 5 is a flowchart for illustrating an operation of the decompressing apparatus for an SGML document according to the first embodiment.

In the decompressing apparatus 3 with the above structure according to the first embodiment, as shown in FIG. 5, the SGML tag extracting unit 30' scans the DTD 302 of the SGML document to extract tags (Step B1), and the tag decode table creating unit 40' assigns the same code as the coding side to each of the extracted tags to create the tag decode table (Step B2). When the tag discriminating unit 50' determines that the data in the document instance 303 of the inputted SGML document is a code of a tag, the tag decoding unit 60' decodes the data on the basis of the above tag decode table to obtain the tag and outputs the tag (Step B3).

Assuming here that tag extracting unit 30' and the tag decode table creating unit 40' create a tag decode table in which codes are assigned to respective tags, as <TITLE>="00", </TITLE>="10", for example, as well as the coding side. If "00 発明(考案)明細書10" having been coded on the coding side is inputted as inputted data at this time, for example, the tag discriminating unit 50' determines that "00" is a code of a tag so as to output the coded data to the tag decoding unit 60'.

The tag decoding unit 60' obtains a tag <TITLE> corresponding to "00" by referring to the above tag decode table on the basis of the inputted code "00" of the tag, and outputs <TITLE> as a result of the decoding of the code "00".

The tag discriminating unit 50' then determines whether inputted data following the above "00" is a code of a tag or not. Here, following the above "00" is "発明(考案)明細書" so that the tag discriminating unit 50' determines that the inputted data is other than a tag, thus outputs the data as it is, not decoding the coded data.

After that, the tag discriminating unit 50' determines whether following the inputted data is a code of a tag or not. Here, following the above "発明(考案)明細書" is a code of a tag "10" so that the tag discriminating unit 50' outputs the code of the tag to the tag decoding unit 60'. The tag decoding unit 60' obtains a tag (</TITLE>) corresponding to the code "10" by referring to the above tag decode table on the basis of the code "10" of the inputted tag, and outputs </TITLE> as a result of the decoding of the code "10".

As a result, the document instance 303 of the SGML document in which only tags have been coded is decoded to the original state as "<TITLE>発明(考案)明細書</TITLE>", and outputted.

According to this embodiment, the decompressing apparatus 3 for the SGML document assigns the same code as the coding side to each of tags in the DTD 302 to create the tag decode table, and decodes tags in the document instance 303 of the coded SGML document on the basis of the tag decode table. It is thereby possible to decode (decompress) tags in the SGML document very efficiently and correctly.

Figure 6:
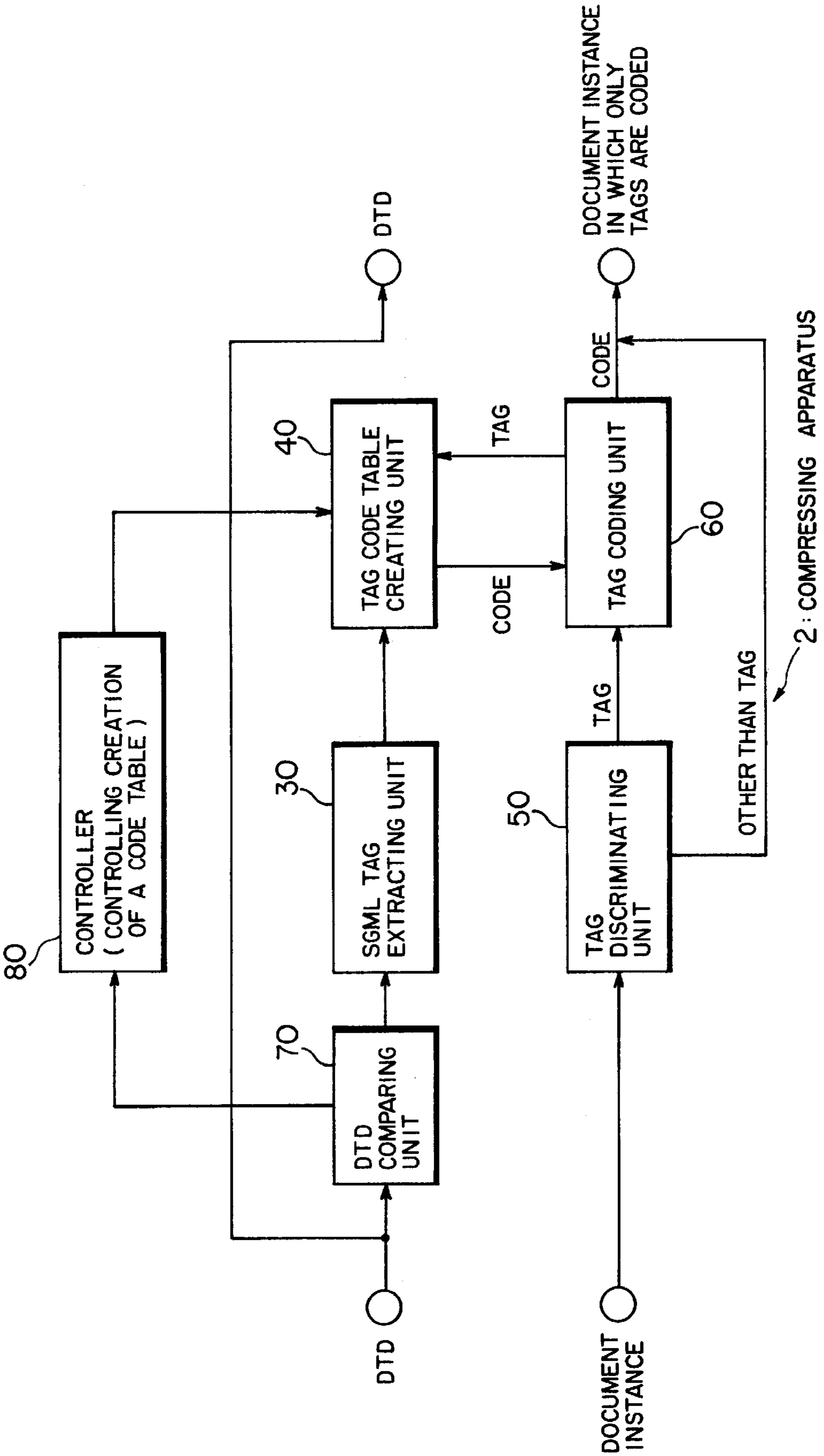
FIG. 6 is a block diagram showing a structure of an essential part of a compressing apparatus for an SGML document according to a second embodiment of this invention.

(b) Description of a Second Embodiment (b1) Description of a Compressing Apparatus (Coding Side) for an SGML Document FIG. 6 is a block diagram showing a structure of an essential part of a compressing apparatus for a tag document according to a second embodiment of this invention. A compressing apparatus 2 shown in FIG. 2 additionally has a DTD comparing unit 70 and controller 80, as compared with the compressing apparatus 2 shown in FIG. 2.

The above DTD comparing unit 70 compares a DTD 302 of an SGML document newly inputted with a DTD 302 of a past SGML document inputted immediately before the DTD 302 of the newly inputted SGML document, and outputs an agreement/disagreement signal for each pair of the DTDs 302 to the controller 80. According to this embodiment, the DTD comparing unit 70 successively holds an inputted DTD 302, and compares it with a newly inputted DTD 302.

The controller 80 controls a code table creating process by the tag code table creating unit 40 according to the agreement/disagreement signal from the DTD comparing unit 70. When receiving the agreement signal for DTDs 302 from the DTD comparing unit 70, the controller 80 directs the tag code table creating unit 40 to maintain the tag code table created in the past. When receiving the disagreement signal for the DTDs 302, the controller 80 directs the tag code table creating unit 40 to update the tag code table.

The tag code table creating unit 40 according to this embodiment maintains a tag code table created with respect to the first document among a plurality of documents while SGML documents having the same DTD 302 are inputted. When an SGML document having a different DTD 302 is inputted, the tag code table creating unit 40 assigns a predetermined code to each of tags extracted from the DTD 302 by the SGML tag extracting unit 30 to re-create a tag code table, as well as the first embodiment.

Figure 7:
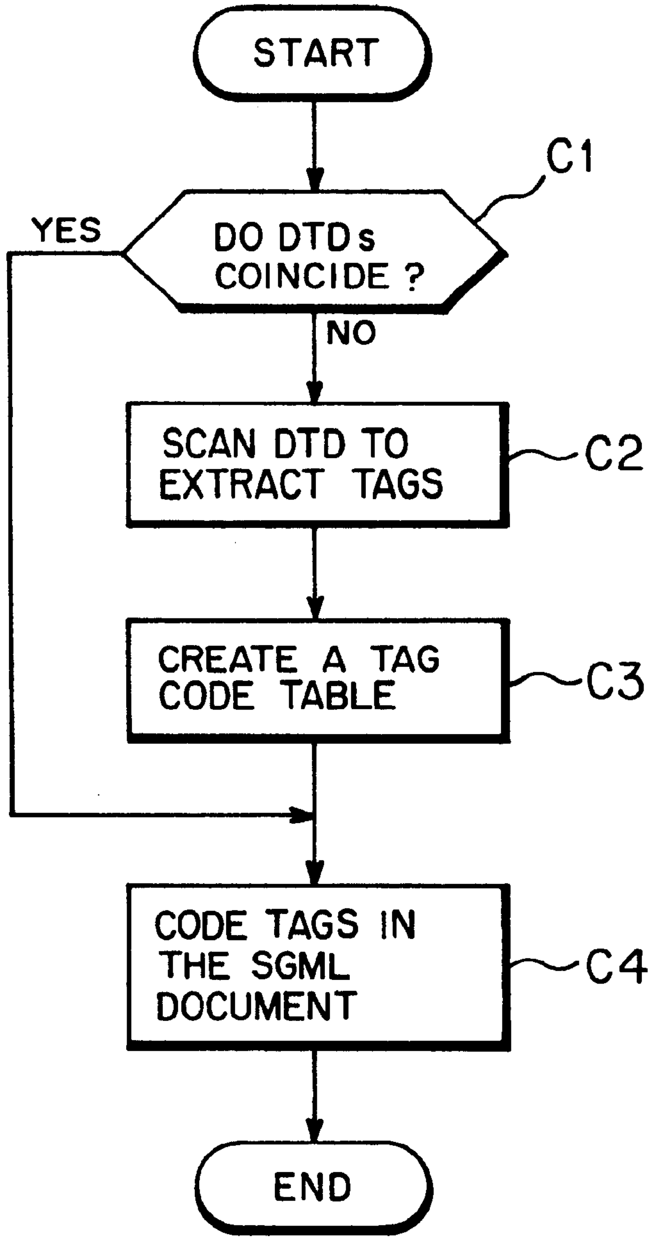
FIG. 7 is a flowchart for illustrating an operation of the compressing apparatus for an SGML document according to the second embodiment.

Next, description will be made of an operation of the compressing apparatus 2 with the above structure according to the second embodiment referring to a flowchart (Steps C1 through C4) shown in FIG. 7. When a DTD 302 is newly inputted to the compressing apparatus 2, the compressing apparatus 2 compares the DTD 302 with a DTD 302 inputted in the past by the DTD comparing unit 70 (Step C1). If the comparison results in that the DTDs 302 do not agree with each other (if NO at Step C1), the DTD comparing unit 70 outputs the disagreement signal to the controller 80, while outputting the above newly inputted DTD 302 to the SGML tag extracting unit 30.

The SGML tag extracting unit 30 scans the received DTD 302 to extract tags defined in the DTD 302 (Step C2), and outputs the extracted tags to the tag code table creating unit 40. Since the disagreement signal is outputted from the DTD comparing unit 70 to the controller 80 at this time as above, the tag code table creating unit 40 receives a direction to update the tag code table from the controller 80 so as to assign a predetermined code to each of the tags extracted by the SGML tag extracting unit 30 and re-create a tag code table (Step C3).

At this time, the document instance 303 of the SGML document inputted together with the DTD 302 is inputted to the tag discriminating unit 50. When the inputted document instance 303 is a tag, the tag discriminating unit 50 outputs the tag to the tag coding unit 60. The tag coding unit 60 obtains a code corresponding to the received tag from the tag code table created by the tag code table creating unit 40, and outputs the code as a code of the tag (Step C4)

If the comparison by the above DTD comparing unit 70 results in that the DTDs 302 agree with each other (if YES at Step C1), the DTD comparing unit 70 outputs the agreement signal to the controller 80. The controller 80 directs the tag code table creating unit 40 to maintain (not update) the tag code table. The tag coding unit 60 thereby codes tags in the document instance 303 on the basis of the tag code table created in the past, similarly to the above case (Step C4).

The compressing apparatus 2 for an SGML document according to this embodiment codes tags in the document instances 303 of all SGML documents having the same DTD 302 on the basis of a tag code table created with respect to the first document among them. It is therefore unnecessary to create a tag code table for each SGML document so that the compressing apparatus 2 can perform the tag coding process at an extremely high speed.

Meanwhile, there is a case, depending on an environment in which SGML is used, where it is already established between a provider (server) and a receiver (client) of a document what kind of DTD 302 is used in SGML documents to be sent. In such case, it is unnecessary to hand over portions other than the document instance 303 to the receiver each time.

In the case where a format of the DTD 302 to be used is unified in advance and the DTDs 302 of all document are the same such as documents in the HTML format used in WWW in Internet, a tag code table first created by the tag code table creating unit 40 is fixedly used under a control of the controller 80, whereby the tag coding process can be performed at a higher speed.

In the above embodiment, the controller 80 directly controls a creating process of a tag code table in the tag code table creating unit 40 so as to maintain/update the tag code table. It is alternatively possible that the controller 80 maintains/updates the tag code table by controlling an extracting process in the SGML tag extracting unit 30 (allowing/inhibiting extraction of tags according to a result of comparison of DTDs 302).

Figure 8:
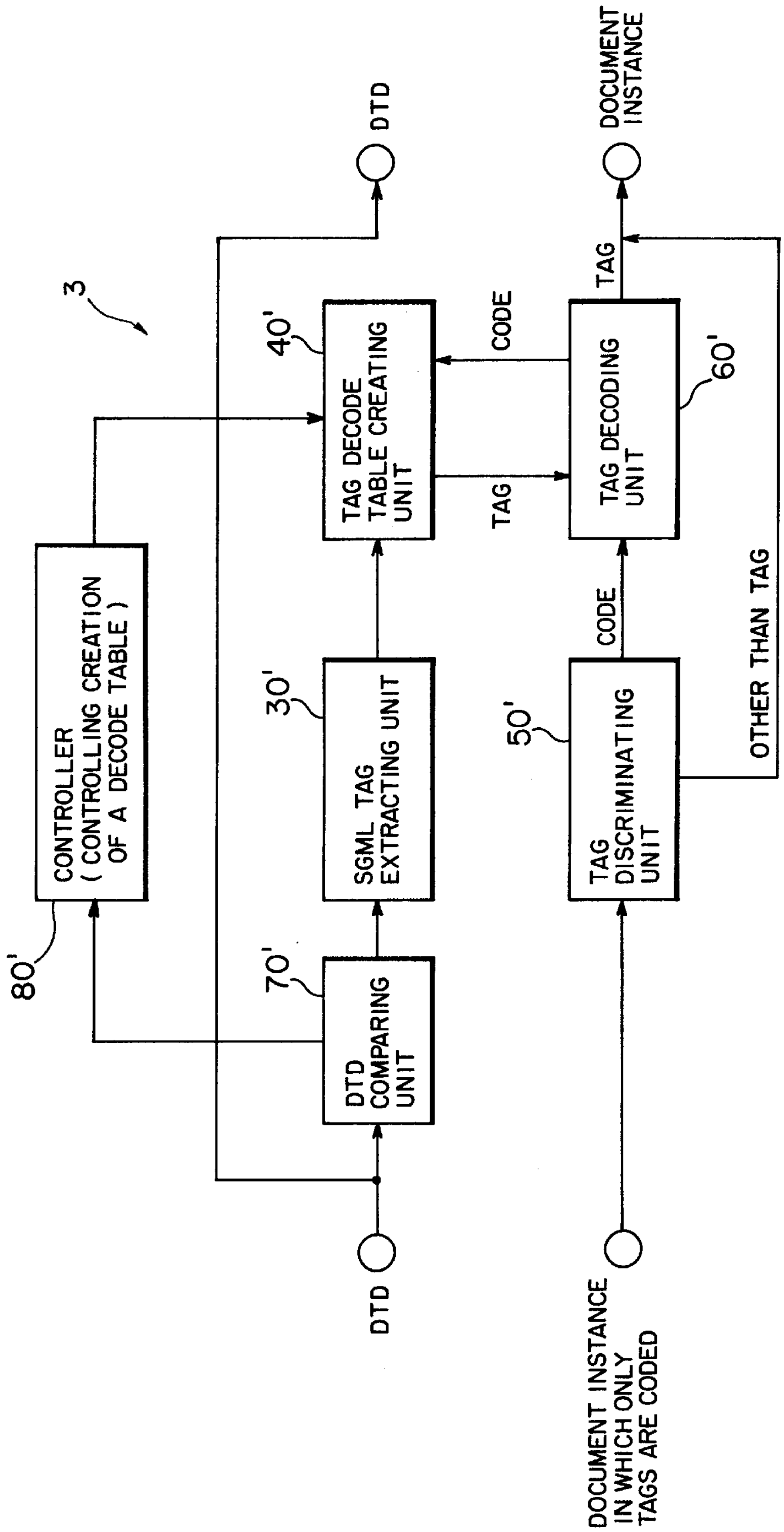
FIG. 8 is a block diagram showing a structure of an essential part of a decompressing apparatus for an SGML document according to the second embodiment of this invention.

(b2) Description of a Decompressing Apparatus (Decoding Side) for an SGML Document FIG. 8 is a block diagram showing a structure of an essential part of a decompressing apparatus for an SGML document according to the second embodiment of this invention. A decompressing apparatus 3 shown in FIG. 8 corresponds to a decoding side of the compressing apparatus 2 described above with reference to FIGS. 6 and 7, which additionally has a DTD comparing unit 70' and a controller 80' as compared with the decompressing apparatus shown in FIG. 4, which are similar to those above described with reference to FIG. 6.

In the decompressing apparatus 3 for an SGML document according to this embodiment, the tag decoding unit 60' decodes coded tags on the basis of a tag decode table created with respect to the first document among a plurality of documents by the tag decode table creating unit 40' while SGML documents having the same DTD 302 are inputted, as well as the coding side. When an SGML document having a different DTD 302 is inputted, the tag decode table creating unit 40' re-creates a tag decode table, and the tag decoding unit 60' decodes tags on the basis of the re-created tag decode table.

Figure 9:
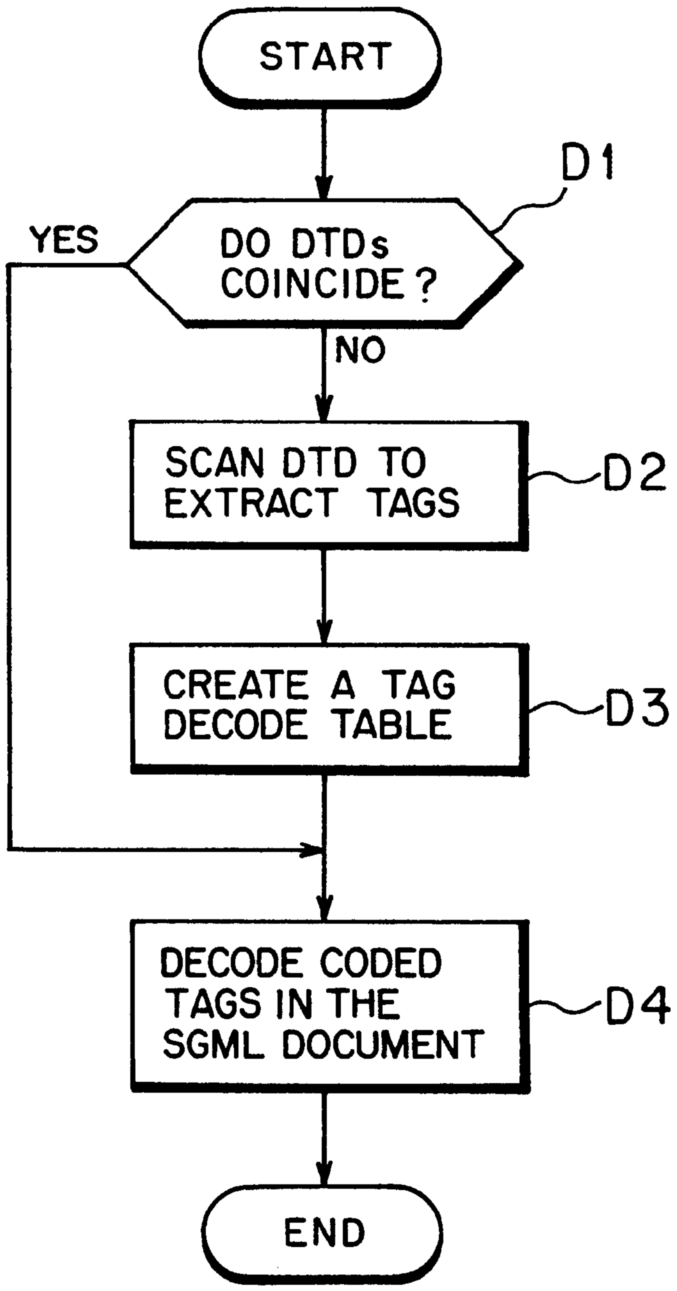
FIG. 9 is a flowchart for illustrating an operation of the decompressing apparatus for an SGML document according to the second embodiment.

Next, detailed description will be made of the above operation with reference to a flowchart (Steps D1 through D4) shown in FIG. 9. When a DTD 302 is newly inputted to the decompressing apparatus 3, the DTD comparing unit 70' compares the newly inputted DTD 302 with a DTD 302 inputted in the past (Step D1). If the comparison results in that the DTDs 302 do not agree with each other (if NO at Step D1), the DTD comparing unit 70' outputs the disagreement signal to the controller 80', while outputting the newly inputted DTD 302 to the SGML tag extracting unit 30'.

The SGML tag extracting unit 30' scans the received DTD 302 to extract tags defined in the DTD 302 (Step D2), and outputs the extracted tags to the tag decode table creating unit 40'. Since the disagreement signal is outputted from the DTD comparing unit 70' to the controller 80' at this time, the tag decode table creating unit 40' receives a direction to update the tag code table from the controller 80'. Therefore, the tag decode table creating unit 40' assigns a predetermined code to each of the tags extracted by the SGML tag extracting unit 30' so as to re-create the tag decode table (Step D3) The document instance 303 of the coded SGML document inputted together with the DTD 302 is inputted to the tag discriminating unit 50'. When a code of the inputted document instance 303 is a tag, the tag discriminating unit 50' outputs the code to the tag decoding unit 60'. The tag decoding unit 60' obtains a symbol (tag) corresponding to the received code from the tag decode table created by the tag decode table creating unit 40', and outputs the tag as a result of the decoding (Step D4).

If the above comparison by the DTD comparing unit 70' results in that the DTDs agree with each other (if YES at Step D1), the DTD comparing unit 70' outputs the agreement signal to the controller 80'. The controller 80' directs the tag decode table creating unit 40' to maintain (not update) the tag decode table. The tag decoding unit 60' decodes the coded tags in the document instance 303 on the basis of the tag decode table created in the past, similarly to the above (Step D4).

The decompressing apparatus 3 for an SGML document according to this embodiment decodes tags in the document instances 303 of all SGML documents on the basis of a tag decode table created with respect to the first SGML document among a plurality of SGML documents having the same DTD 302. It is therefore unnecessary to create a tag decode table for each SGML document so that the decompressing apparatus 3 can perform the tag decoding process at an extremely high speed.

In the case where a format of the DTD 302 to be used is unified in advance and the DTDs 302 of all documents are the same such as documents in the HTML format, the above decompressing apparatus 3 fixedly uses a tag decode table first created by the tag decode table creating unit 40' under a control of the controller 80' so as to perform the tag decoding process at a higher speed.

In the above embodiment, the controller 80' directly controls the creating process of the tag decode table in the tag decode table creating unit 40', thereby maintaining/updating the tag decode table. However, it is alternatively possible that the controller 80' controls the extracting process in the SGML tag extracting unit 30' (permits/inhibits extraction of tags according to a result of comparison of DTDs 302) so as to maintain/update the tag decode table.

Figure 10:
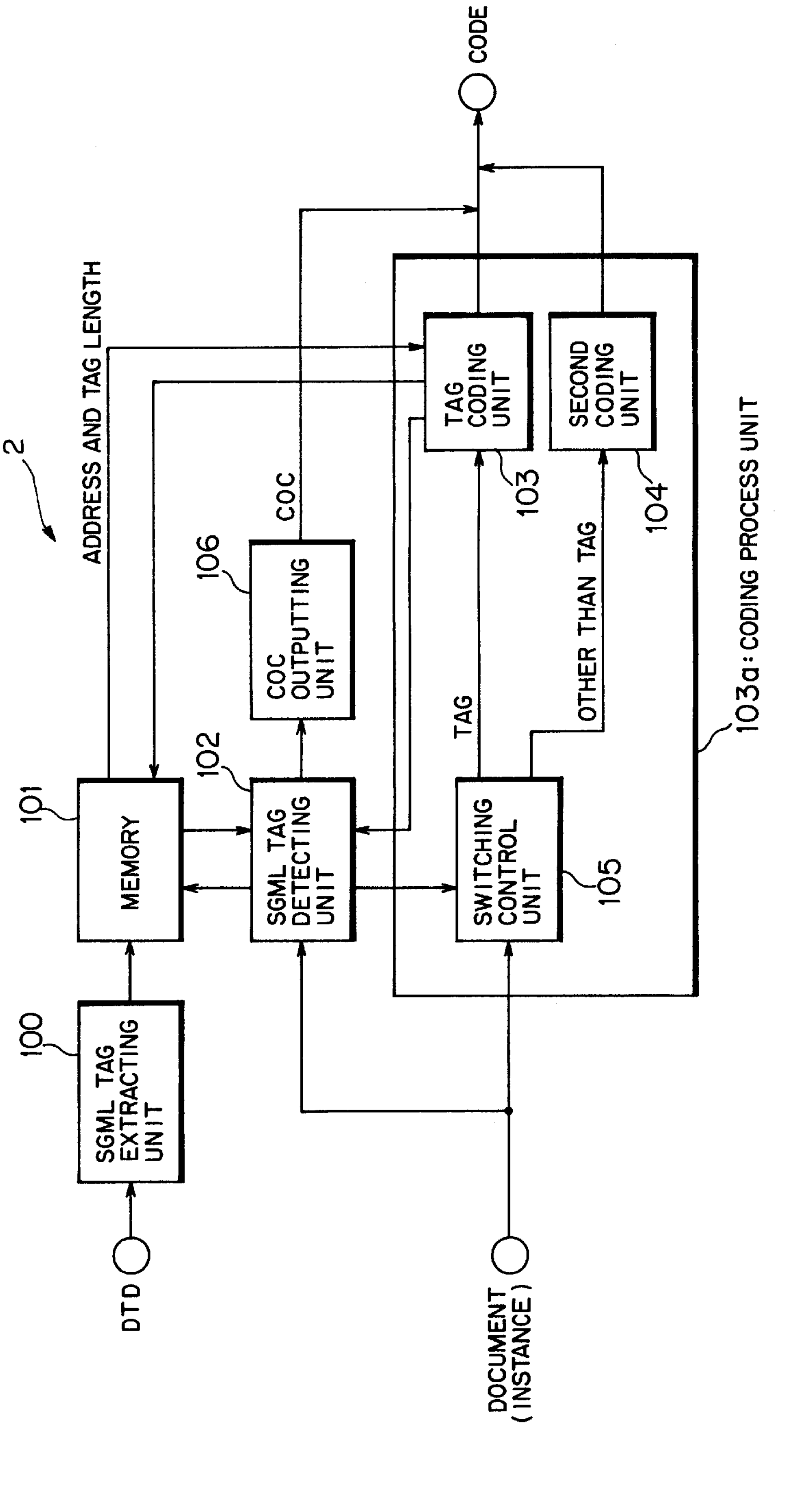
FIG. 10 is a block diagram showing a structure of an essential part of a compressing apparatus for an SGML document according to a third embodiment of this invention.

(c) Description of a Third Embodiment (c1) Description of a Compressing Apparatus (Coding Side) for an SGML Document FIG. 10 is a block diagram showing a structure of as essential part of a compressing apparatus for an SGML document according to a third embodiment of this invention. As shown in FIG. 10, a compressing apparatus 2 for an SGML document according to the third embodiment has an SGML tag extracting unit 100, a memory 101, an SGML tag detecting unit 102, a coding process unit 103*a* and a COC outputting unit 106.

The SGML tag extracting unit 100 scans the DTD 302 (refer to FIG. 31) of an inputted SGML document to extract tags defined in the DTD 302. The memory (tag storing unit) 101 fulfils a function as a tag code table creating unit. The memory 101 successively stores tags extracted by the SGML tag extracting unit 100, and assigns address information and length information on a tag in the memory 101 to each of the tags as a code of the tag, thereby creating a tag code table.

Figure 11:
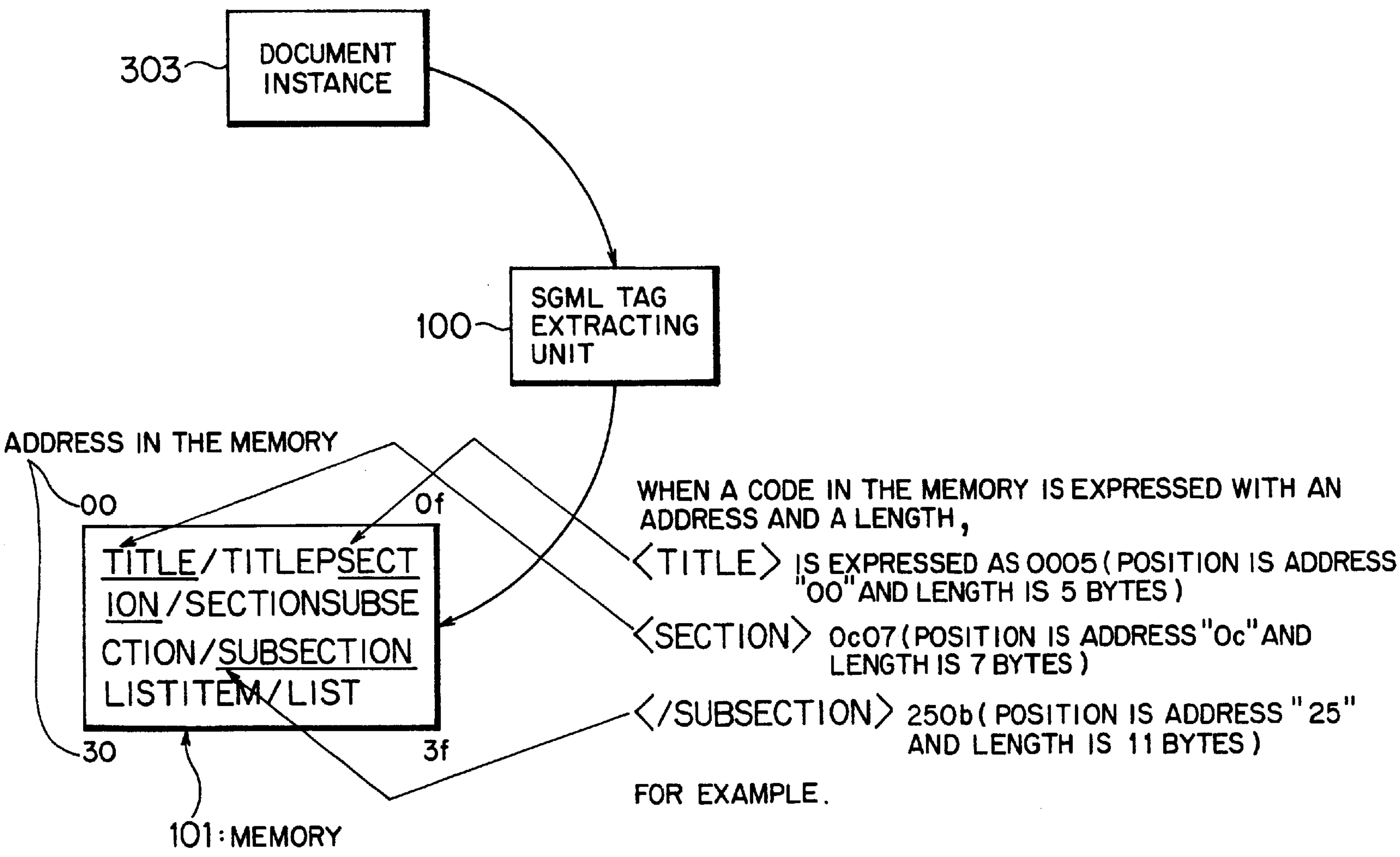
FIG. 11 is a diagram for illustrating an operation of the compressing apparatus for an SGML document according to the third embodiment.

When a document shown in FIG. 11 is inputted as the document instance 303 (one character in the document is assumed to be one byte), for example, tags such as "TITLE", "/TITLE", "SECTION", "/SECTION", "SUBSECTION", "/SUBSECTION", etc. extracted by the SGML tag extracting unit 100 are successively stored at an address "00" and the following addresses of the memory 101. Accordingly, "0005" obtained by combining a "00" address with "05"

representing a length of the tag (5 bytes) is assigned to <TITLE>, and "0c07" obtained by combining a "0c(HEX)" address with "07" representing a length (7 bytes) of the tag is assigned to <SECTION>.

The SGML tag detecting unit (tag discriminating unit) 102 determines whether data of the document instance 303 of the inputted SGML document is one of tags extracted by the SGML tag extracting unit 100 or not, thereby detecting a tag used in the document instance 303. According to this embodiment, by determining whether data of the inputted document instance 303 (hereinafter, referred as document instance data, occasionally) coincides with a tag stored in the memory 101, the tag is detected.

When the above SGML tag detecting unit 102 determines that the above inputted data is a tag, the coding process unit 103*a* codes the inputted data on the basis of stored contents in the memory 101 created as a tag code table. When the above SGML tag detecting unit 102 determines that the above inputted data is not a tag, the coding process unit 103*a* codes the inputted data in a predetermined coding system (universal coding system or the like).

The above coding process unit 103*a* therefore has a tag coding unit 103, a second coding unit 104 and a switching control unit 105, as shown in FIG. 10.

The tag coding unit (first coding unit) 103 codes inputted data on the basis of the above tag code table (stored contents of the memory 101). The second coding unit 104 codes inputted data in a predetermined coding system such as universal coding system or the like. The switching control unit 105 outputs the inputted data to the tag coding unit 103 when the SGML tag detecting unit 102 determines that the inputted data is a tag. When the SGML tag detecting unit 102 determines that the inputted data is not a tag, the switching control unit 105 outputs the inputted data to the second coding unit 104.

When the coding of the tags is completed, the above tag coding unit 103 notifies the SGML tag detecting unit 102 of it. When receiving the notification, the SGML tag detecting unit 102 again performs the tag detecting process on the next document instance data.

When the SGML tag detecting unit 102 determines that the above inputted data is a tag, the COC outputting unit (special code outputting unit) 106 outputs a special code (COC: Change Of Coding) representing coding of a tag (switching the coding system) to a decoding side of the tag described later before the inputted data is coded in the tag coding unit 103.

Figure 12:
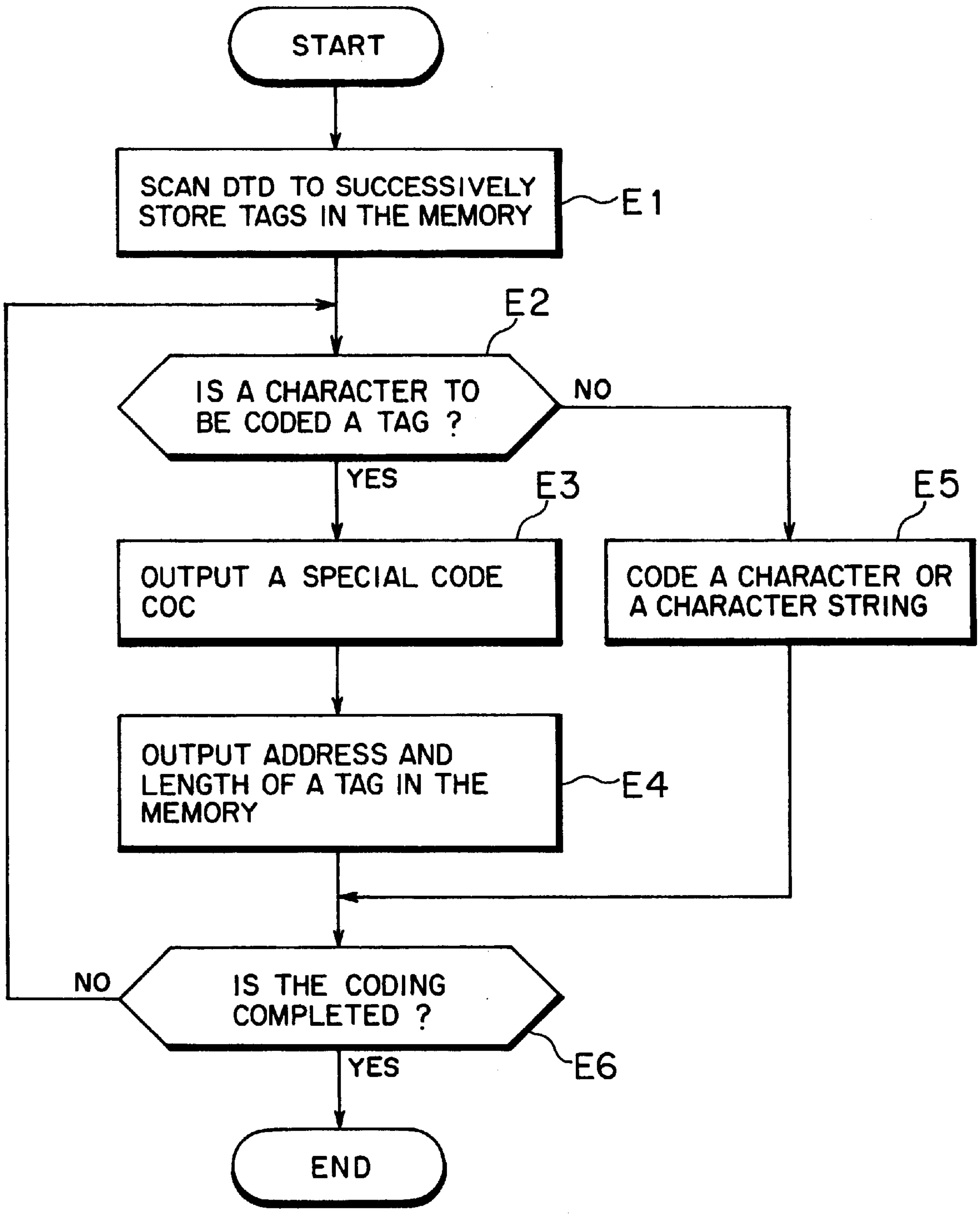
FIG. 12 is a flowchart for illustrating the operation of the compressing apparatus for an SGML document according to the third embodiment.

Next, detailed description will be made of an operation of the compressing apparatus 2 for an SGML document with the above structure according to the third embodiment with reference to a flowchart (Steps E1 through E6) shown in FIG. 12.

The compressing apparatus 2 scans the inputted DTD 302 by the SGML tag extracting unit 100 to extracts tags defined in the DTD 302, successively stores the extracted tags in the memory 101, and assigns address information and length information of the memory 101 to each of the tag as a code of the tag to create a tag code table (Step E1).

The compressing apparatus 2 determines whether the inputted document instance data is a tag or not by the SGML tag detecting unit 102 (Step E2) If the inputted document instance data is a tag, the compressing apparatus 2 directs the COC outputting unit 106 to output COC, while directing the switching control unit 105 of the coding process unit 103*a* to switch output of the document instance data to the tag coding unit 103, whereby the COC outputting unit 106 outputs COC to the decoding side to be described later (from YES route at Step E2 to Step E3). The tag coding unit 103 refers to the memory 101 on the basis of the inputted data (tag), and outputs a code (address and length) corresponding to the tag as a code of the tag (Step E4).

If the document instance data which is an object of the coding is not a tag at the above Step E2, the compressing apparatus 2 directs the switching control unit 105 to switch the output of the document instance data to the second coding unit 103 so that the second coding unit 104 codes the document instance data (character or character string) in a predetermined coding system (from NO route at Step E2 to Step E5).

The compressing apparatus 2 determines whether the coding is completed or not (Step E5). If the coding is not completed (if some of the document instance data still remain), the compressing apparatus 2 repeats the process from the above Step E2 until the coding is completed (NO route at Step E6) If the coding is completed, the compressing apparatus 2 terminates the compressing process (YES route at Step E6).

Figure 13:
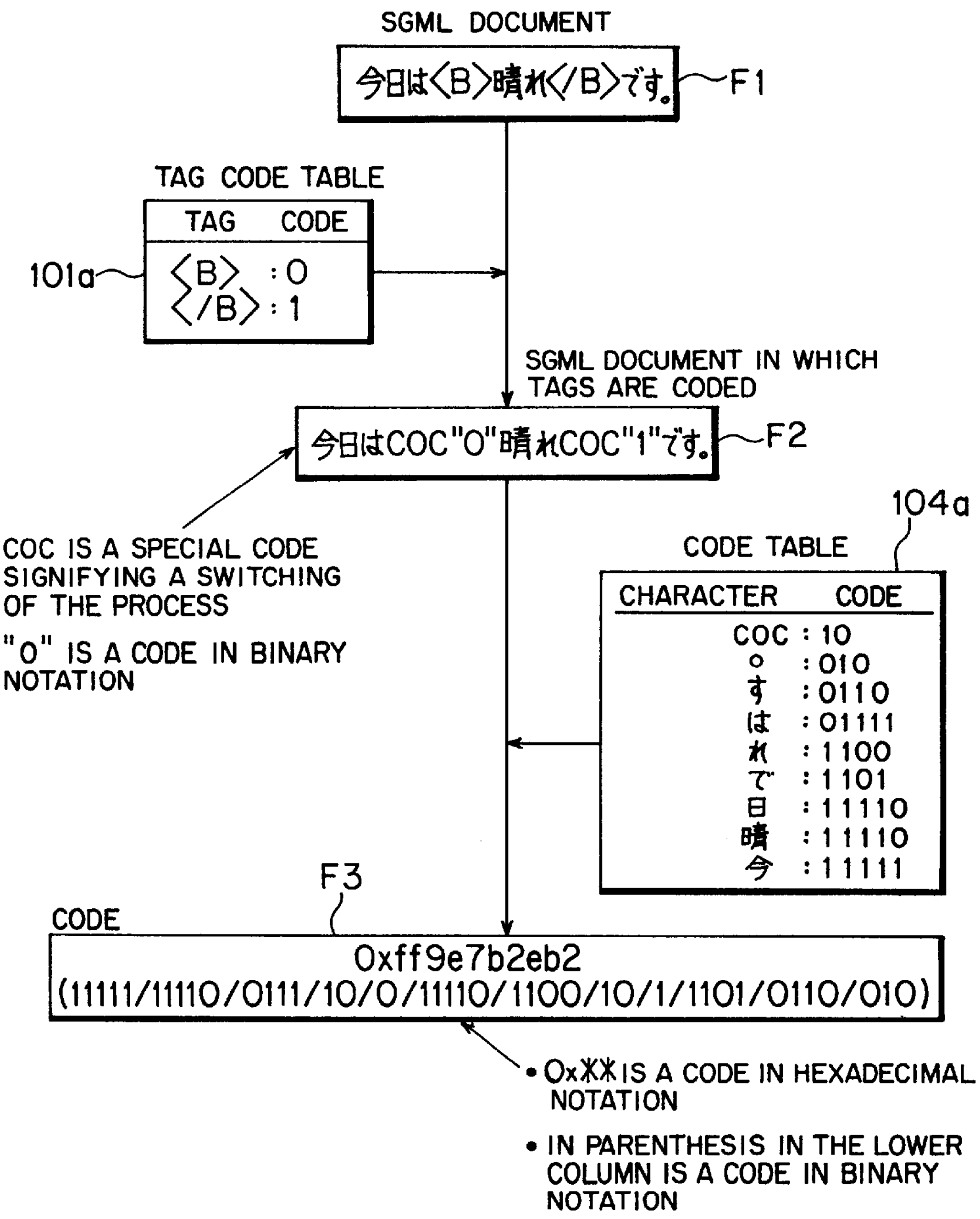
FIG. 13 is a diagram showing the operation of the compressing apparatus for an SGML document according to the third embodiment.

Assuming here, as shown in FIG. 13, that "今日は<B>晴れです。" is inputted as document instance data (Step F1), codes "0" and "1" are assigned to tags <B> and </B>, respectively, a tag code table 101*a* is created, and codes shown in FIG. 13 are assigned to respective characters other than these tags (that is, a code table 104*a* for the second coding unit 104 is created).

In the above document instance data, COC ("10") is inserted before each of the tags <B> and </B>, after that, each of the tags is coded on the basis of the tag code table 101*a* by the tag coding unit 103 (Step F2). The characters other than the tags are coded on the basis of the code table 104*a* by the second coding unit 104.

As a result, the above document instance data is finally coded into codes "ff9e7b2e2b" in hexadecimal notation (HEX), or "11111/11110/0111/10/0/11110/1100/10/1/1101/0110/0 10" in binary notation, as shown in FIG. 13 (Step F3)

The compressing apparatus 2 for an SGML document according to the third embodiment of this invention outputs COC to the tag decoding side, and codes inputted data on the basis of a tag code table by the tag coding unit 103 when the inputted document instance data is a tag. When the document instance data is not a tag, the second decoding unit 104 codes the document instance data in a predetermined coding system. It is therefore possible to compress very efficiently not only tags in an SGML document but also the document other than the tags so as to decrease a quantity of data of the SGML document much more.

Since the COC outputting unit 106 outputs COC to the decoding side, the tag decoding side can readily discriminate a tag, as will be described later. This largely contributes to speeding-up of the decoding process. Incidentally, the COC outputting unit 106 may be omitted if the process on the decoding side is not taken into account.

Since the coding process unit 103*a* has the tag coding unit 103, the second coding unit 104 and the switching control unit 105 according to this embodiment, the function of the coding process unit 103*a* can be realized with a simple structure.

Since the memory 101 as the tag code table creating unit of this embodiment assigns information on an address and a length of a tag in the memory 101 as a code of the tag to create the tag code table, a code is assigned to each tag only by successively storing tags in the memory 101. It is therefore possible to create the tag code table with such a simple structure that only one memory 101 is provided, and at a high speed.

As will be described later, the tag decoding side can readily specify a tag to be decoded on the basis of the address and the length. This largely contributes to speeding-up of the tag decoding process.

A code to be assigned to a tag is not necessarily information on the above address and length, but any information is applicable so long as it includes at least address information.

Figure 14:
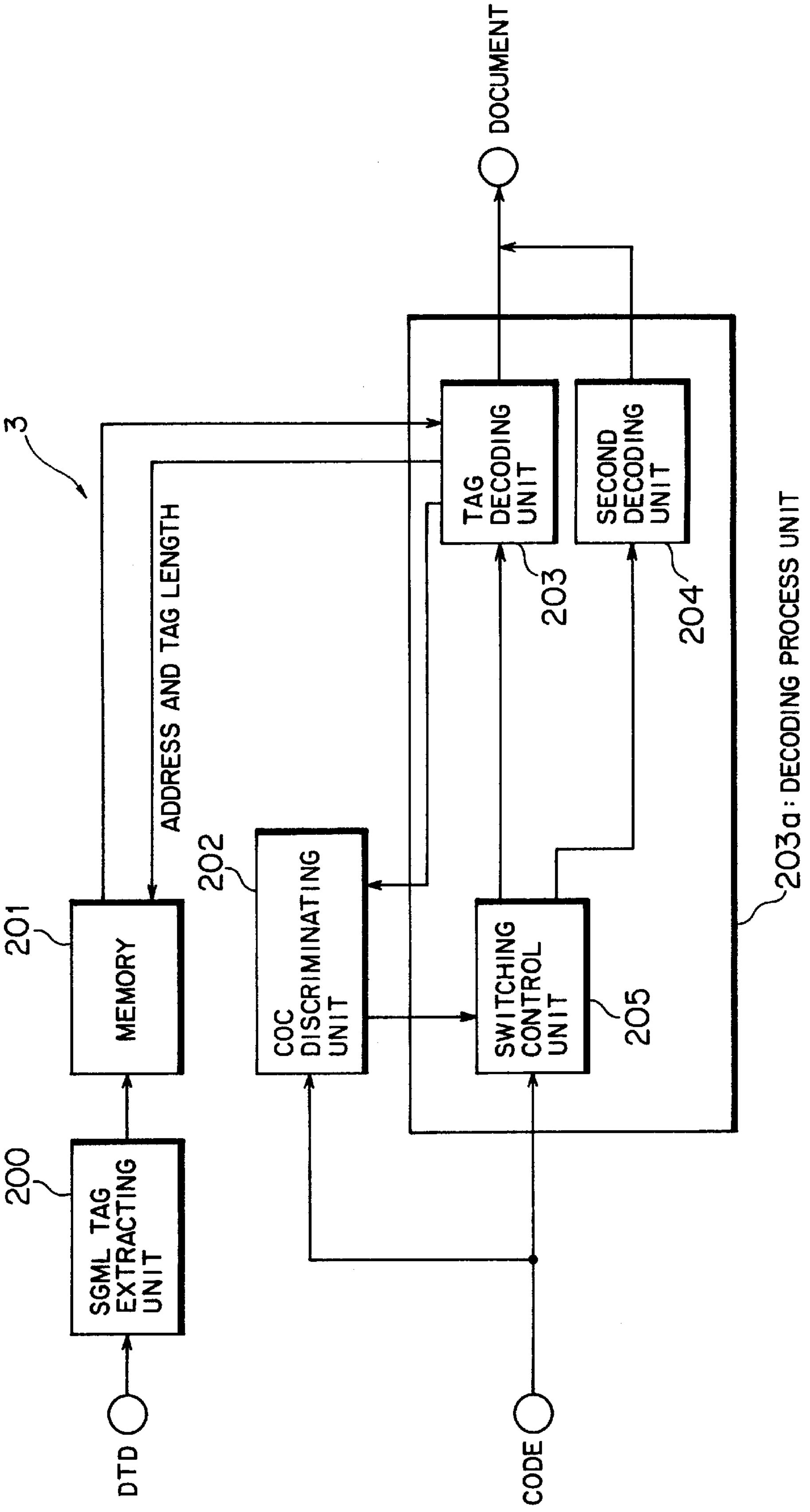
FIG. 14 is a block diagram showing a structure of an essential part of a decompressing apparatus for an SGML document according to the third embodiment of this invention.

(c2) Description of a Decompressing Apparatus (Decoding Side) for an SGML Document FIG. 14 is a block diagram showing a structure of an essential part of a decompressing apparatus for an SGML document according to a third embodiment of this invention. A decompressing apparatus 3 shown in FIG. 14 corresponds to the decoding side of the compressing apparatus 2 described above with reference to FIGS.10 through 13, which has an SGML tag extracting unit 200, a memory 201, a COC discriminating unit 202 and a decoding process unit 203*a*.

The SGML tag extracting unit 200 scans the DTD 302 (refer to FIG. 31) of an inputted SGML document to extract tags defined in the DTD 302. The memory 201 fulfils a function as the tag decode table creating unit. The memory 201 successively stores the tags extracted by the SGML tag extracting unit 200, assigns address information and length information on a tag in the memory 201 as a code of the tag so as to create the tag decoding table as in the case of the coding side.

The COC discriminating unit (special code discriminating unit) 202 determines whether the inputted coded data is COC representing that coded data of a tag is inputted. When the COC discriminating unit 202 determines that the inputted coded data is COC, the decoding process unit 203*a* decodes coded data (i.e., a code of a tag) following the COC on the basis of the tag decode table. When the COC discriminating unit 202 determines that the inputted coded data is not COC, the decoding process unit 203*a* decodes the coded data in a predetermined decoding system.

The above decoding process unit 203*a* has, as shown in FIG. 14, a tag decoding unit 203, a second decoding unit 204 and a switching control unit 205.

The tag decoding unit (first decoding unit) 203 decodes the inputted coded data on the basis of stored contents of the memory 201 created as the above tag decode table. The second decoding unit 204 decodes the inputted coded data in a predetermined decoding system. In this case, the second decoding unit 204 performs the decoding process in a decoding system corresponding to the coding system on the coding side.

When the COC discriminating unit 202 determines that the inputted coded data is COC, the switching control unit 205 outputs coded data inputted following the COC to the tag decoding unit 203. When the COC discriminating unit 202 determines that the inputted coded data is not COC, the switching control unit 205 outputs the coded data to the second decoding unit 204.

Figure 15:
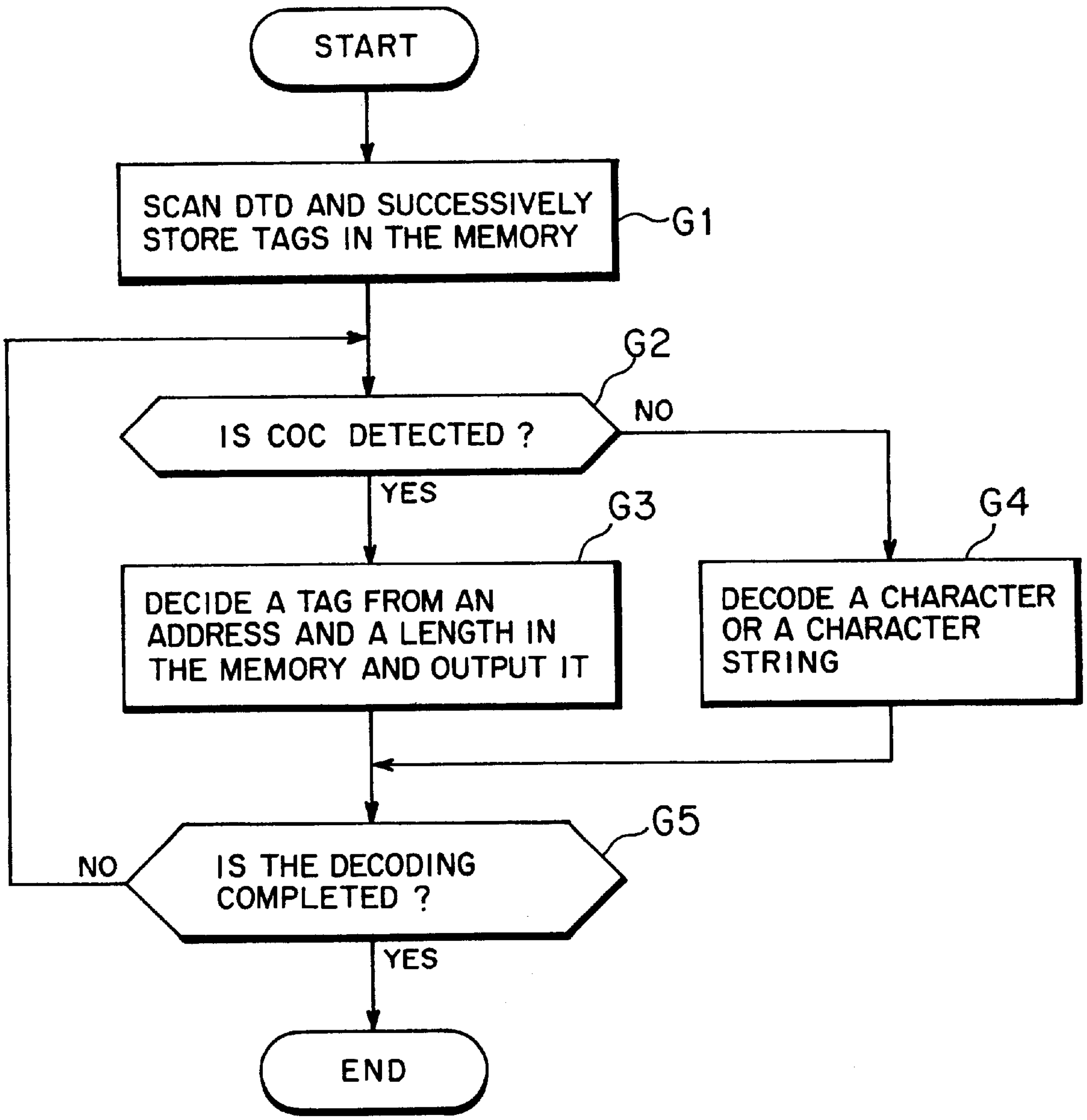
FIG. 15 is a flowchart for illustrating an operation of the decompressing apparatus for an SGML document according to the third embodiment.

Next, detailed description will be made of an operation of the decompressing apparatus 3 for an SGML document with the above structure according to the third embodiment with reference to a flowchart (Steps G1 through G5) shown in FIG. 15.

The decompressing apparatus 3 scans the inputted DTD 302 by the SGML tag extracting unit 200 to extract tags defined in the DTD 302, successively stores the extracted tags in the memory 201, assigns address information and length information on a tag in the memory 201 to each of the tags as a code of the tag, thereby creating a tag decoding table having the same stored contents as the coding side (Step G1).

The decompressing apparatus 3 determines whether the inputted coded data is COC or not by the COC discriminating unit 202 (Step G2). If the inputted coded data is COC, the decompressing apparatus 3 instructs the switching control unit 205 of the decoding process unit 203*a* to switch output of the coded data to the tag decoding unit 203. The tag decoding unit 203 refers to the memory 201 on the basis of coded data (a code of a tag; address and length) following the COC, and outputs a symbol (tag) corresponding to the coded data as a result of the decoding (Step G3)

When the discrimination at the above Step G2 results in that the coded data which is an object of the decoding is not COC, the decompressing apparatus 3 directs the switching control unit 205 to switch the output of the coded data to the second decoding unit 204, so that the second decoding unit 204 decodes the coded data (character or character string) in a decoding system corresponding to the coding system on the coding side (from NO route at Step G2 to Step G4).

The decompressing apparatus 3 determines whether the decoding is completed or not (Step G5) If the decoding is not completed (if some of the coded data still remain), the decompressing apparatus 3 repeats the process from the above Step G2 until the decoding is completed (NO route at Step G5). If the decoding is completed, the decompressing apparatus 3 terminates the decoding process (YES route at Step G5).

In the decompressing apparatus 3 for an SGML document according to the third embodiment, the tag decoding unit 203 decodes coded data following COC on the basis of the tag decode table when the inputted coded data is the COC. If the inputted coded data is not COC, the second decoding unit 204 decodes the coded data in a decoding system corresponding to the coding system on the coding side. It is therefore possible to decompress not only tags but also a coded document other than the tags, very efficiently and accurately.

Whether or not coded data that is an object of the decoding is a tag can be determined only by detecting COC so that the tag decoding process can be performed at a very high speed.

Since the decoding process unit 203*a* of this embodiment has the tag decoding unit 203, the second decoding unit 204 and the switching control unit 205, a function of the decoding process unit 203*a* can be readily realized with a simple structure.

Since the memory 201 as the above tag decode table creating unit assigns address information and length information on a tag in the memory 201 to a tag as a code of the tag to create the tag decode table, a code is automatically assigned to each tag only by successively storing tags in the memory 201 so that the tag decode table having the same contents as the coding side is created. It is therefore possible to perform the decoding process of tags at a high speed and accurately, even with an extremely simple structure.

According to this embodiment, address information and length information in the memory 201 are used as they are as a code of a tag. So long as the tag is coded as a code consisting of address information and length information on the coding side, it is possible to readily fetch a tag corresponding to coded data of the tag from the memory 201. This largely contributes to speeding-up of the tag decoding process.

A code to be assigned to a tag is not necessarily information on address and length as above. Any information including at least address information is applicable so long as it corresponds to that on the coding side.

Figure 16:
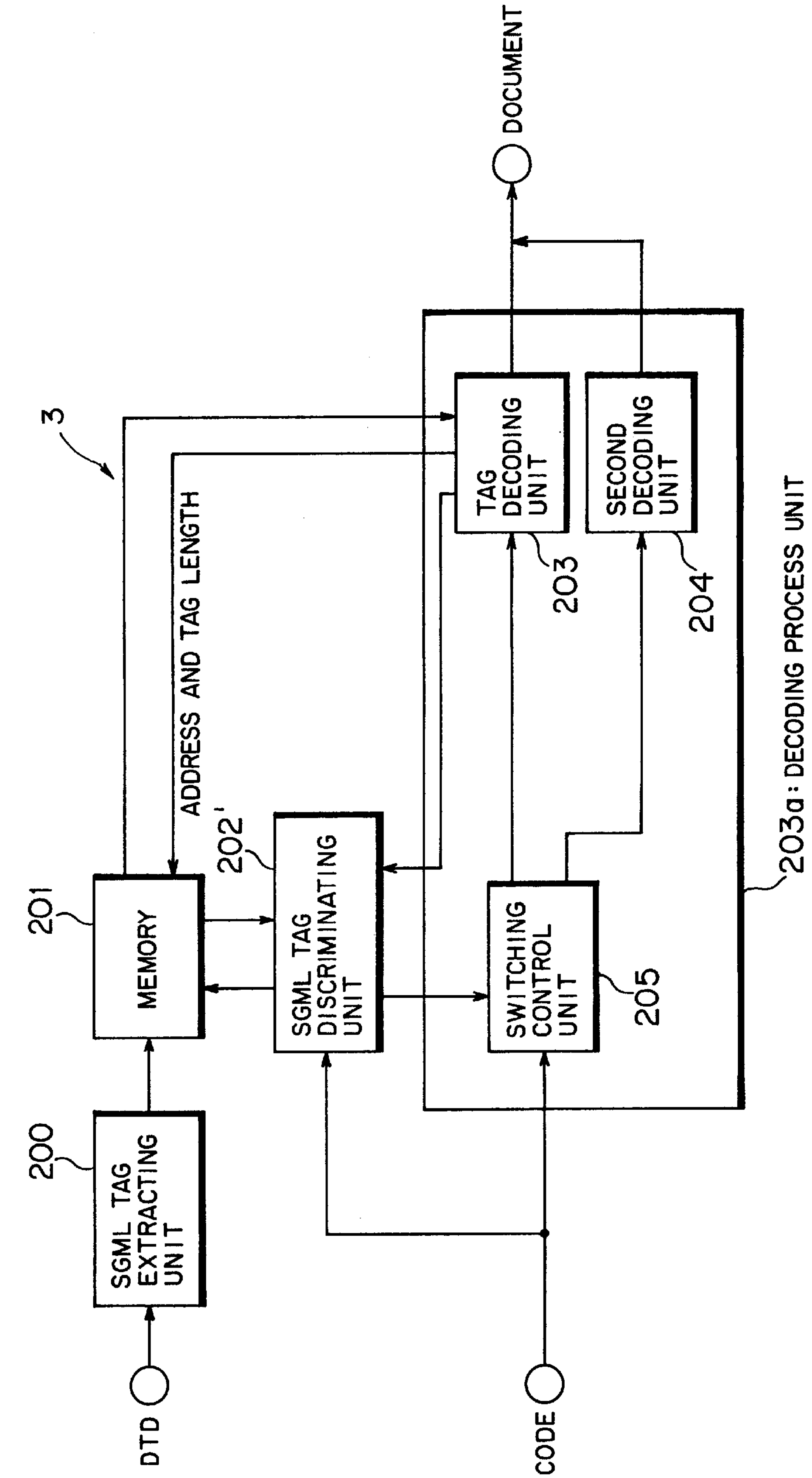
FIG. 16 is a block diagram showing a modification of the decompressing apparatus for an SGML document according to the third embodiment.

The above decompressing apparatus 3 switches between decoding of a tag and decoding of a character (character string) other than tags at a timing of COC detection. However, if codes are assigned in such a manner that codes of characters (strings) other than tags do not coincides with codes of the tags, an SGML discriminating unit 202' for determining whether inputted coded data is a tag or not is provided instead of the above COC discriminating unit 202, as shown in FIG. 16, for example, thereby switching the decoding of a character (string) other than tags to the decoding of a tag at a timing of detection of the tag itself.

Figure 17:
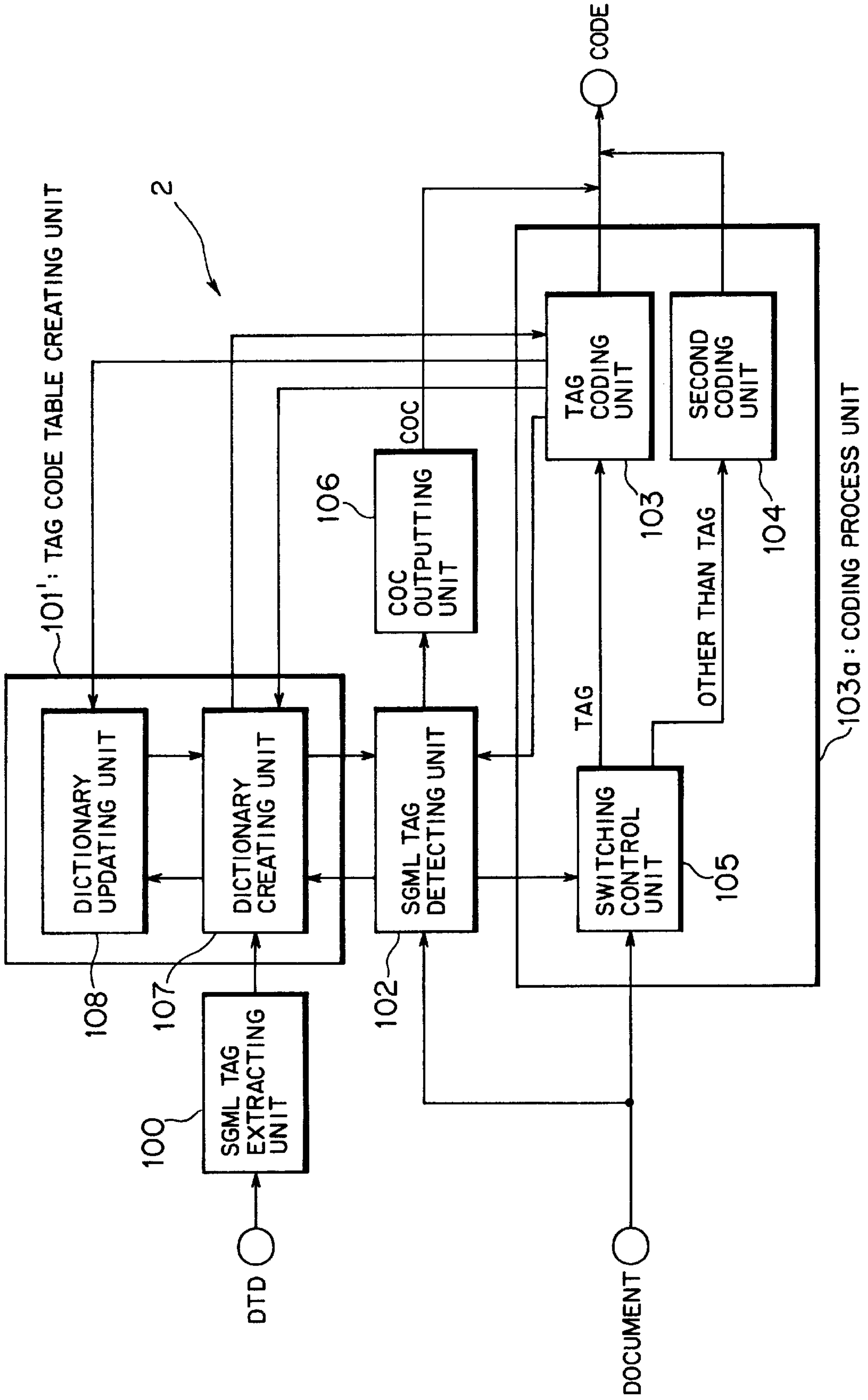
FIG. 17 is a block diagram showing a structure of an essential part of a compressing apparatus for an SGML document according to a fourth embodiment of this invention.

(d) Description of a Fourth Embodiment (d1) Description of a Compressing Apparatus (Coding Side) for an SGML Document FIG. 17 is a block diagram showing a structure of an essential part of a compressing apparatus for an SGML document according to a fourth embodiment of this invention. As shown in FIG. 17, a compressing apparatus 2 for an SGML document according to the fourth embodiment has a dictionary creating unit 107 and a dictionary updating unit 108 as the tag code table creating unit 101', instead of the memory 101 shown in FIG. 10.

The dictionary creating unit (first coding dictionary creating unit) 107 assigns a predetermined initial code to each of tags extracted by the SGML tag extracting unit 100 so as to create a dictionary of the tags (statistical dynamic dictionary: first coding dictionary) as a tag code table. The dictionary updating unit (coding dictionary updating unit) 108 updates a code in the dictionary created by the dictionary creating unit 107 according to the frequency of occurrence of a tag when the tag is coded by the coding process unit 103*a* (tag coding unit 103). According to this embodiment, a shorter code (a code having a length inversely proportional to the frequency of occurrence) is assigned to a tag more frequently occurring.

The compressing apparatus 2 for an SGML document according to the fourth embodiment updates the dictionary (code table) used when a tag is coded in consideration of the frequency of occurrence of the tag, and codes the tag.

Figure 18:
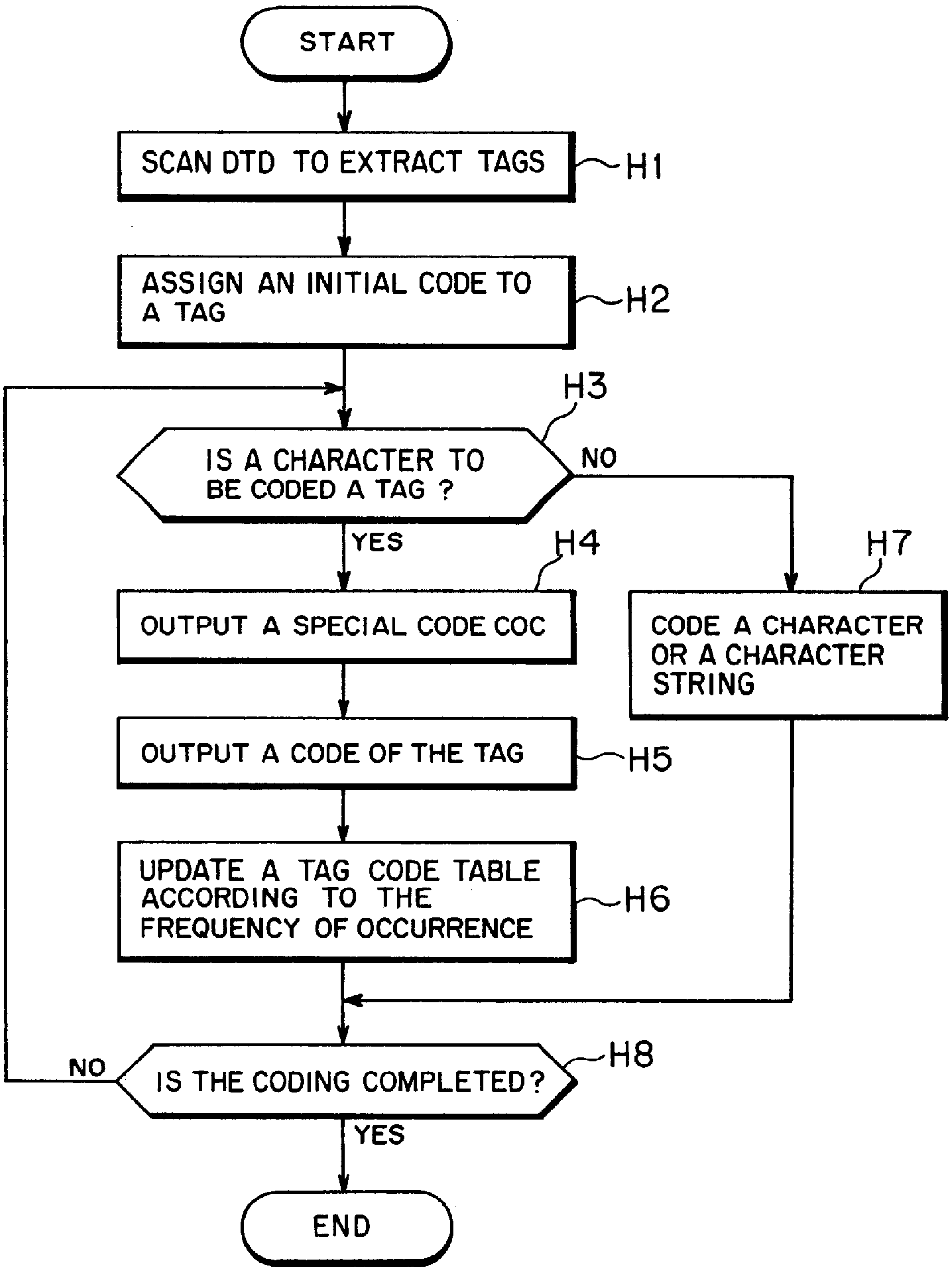
FIG. 18 is a flowchart for illustrating an operation of the compressing apparatus for an SGML document according to the fourth embodiment.

Next, detailed description will be made of an operation of the compressing apparatus 2 for an SGML document with the above structure according to the fourth embodiment with reference to a flowchart (Steps H1 through H8) shown in FIG. 18.

The compressing apparatus 2 scans the inputted DTD 302 by the SGML tag extracting unit 100 to extract tags defined in the DTD 302 (Step H1), and outputs the tags to the dictionary creating unit 107 of the tag code table creating unit 101'. The dictionary creating unit 107 successively assigns a predetermined initial code to each of the inputted tags so as to create a tag code table (Step H2).

The compressing apparatus 2 determines whether data of the document instance 303 inputted together with the above DTD 302 is a tag or not by the SGML tag detecting unit 102 (Step H3). If the data is a tag, the compressing apparatus 2 directs the COC outputting unit 106 to output COC, while directing the switching control unit 105 of the coding process unit 103*a* to switch output of the document instance data to the tag coding unit 103.

The COC outputting unit 106 outputs COC to the decoding side described later (from YES route at Step H3 to Step H4). The tag coding unit 103 refers to the dictionary (tag code table) created by the dictionary creating unit 107 on the basis of the inputted data (tag), and outputs a code corresponding to the tag as a code of the tag (Step H5).

The compressing apparatus 2 calculates the frequency of occurrence of the tag coded by the tag coding unit 103, re-assigns a code according to a result of the calculation (a code shorter than the initial code) to the coded tag to update the dictionary by the dictionary updating unit 108 (Step H6).

If the document instance data that is an object of the coding is not a tag at the above Step H3, the compressing apparatus 2 directs the switching control unit 105 to switch the output of the document instance data to the second coding unit 104. The second coding unit 104 codes the document instance data (character or character string) in a predetermined coding system (from NO route at Step H3 to Step H7).

The compressing apparatus 2 determines whether the coding is completed or not (Step H8). If the coding is not completed (if some of the document instance data still remain), the compressing apparatus 2 repeats the process from the above Step H3 until the coding is completed (NO route at Step H8) If the coding is completed, the compressing apparatus 2 terminates the compressing process (YES route at Step H8).

The compressing apparatus 2 for an SGML document according to the fourth embodiment assgines a predetermined initial code to each of tags extracted by the SGML tag extracting unit 100 to create a dictionary of the tags, and updates a code in the dictionary according to the frequency of occurrence of a tag in such a manner that a tag more frequently occurring has a shorter code when the tag is coded. Accordingly, the compressing apparatus 2 re-assigns a shorter code to a tag more frequently occurring, as the coding of tags is proceeded. This largely improves a compressing rate of tags.

Figure 19:
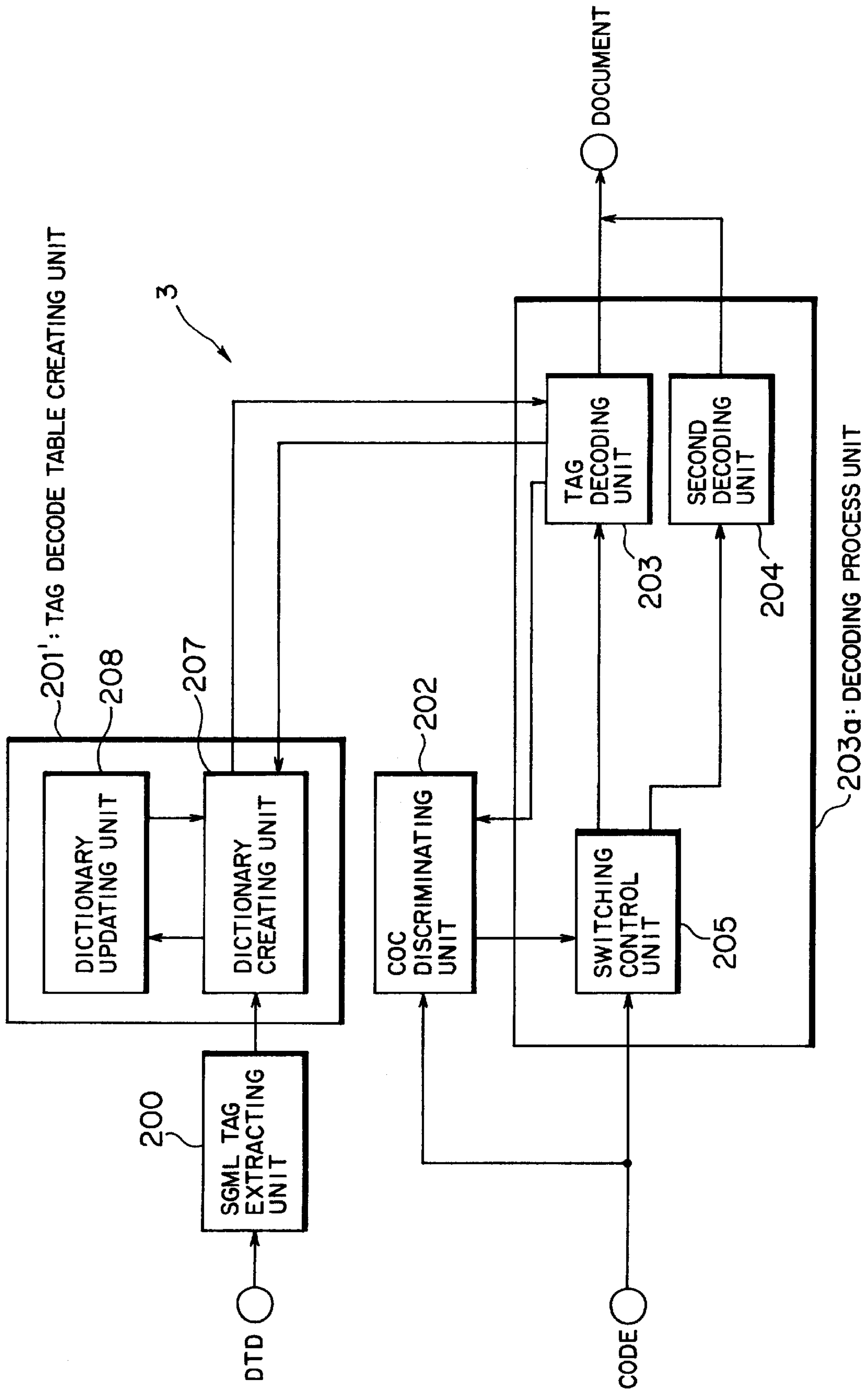
FIG. 19 is a block diagram showing a structure of an essential part of a decompressing apparatus for an SGML document according to the fourth embodiment of this invention.

(d2) Description of a Decompressing Apparatus (Decoding Side) for an SGML Document FIG. 19 is a block diagram showing a structure of an essential part of a decompressing apparatus for an SGML document according to a fourth embodiment of this invention. A decompressing apparatus 3 shown in FIG. 19 corresponds to the decoding side of the compressing apparatus 2 described above with reference to FIGS. 17 and 18. According to this embodiment, the decompressing apparatus 3 has a dictionary creating unit 207 and a dictionary updating unit 208 as the tag decode table creating unit 201', as compared with the decompressing apparatus 3 shown in FIG. 14.

The dictionary creating unit (first decoding dictionary creating unit) 208 assigns a predetermined initial code to each of tags extracted by the SGML tag extracting unit 200 so as to create a dictionary of the tags (first decoding dictionary) as a tag decode table. According to this embodiment, the dictionary creating unit 208 assigns an initial code to each tag in the same rule as the above coding side.

The dictionary updating unit (decoding dictionary updating unit) 207 updates (re-assigns) a code in the dictionary created by the dictionary creating unit 207 when the tag is decoded by the decoding process unit 203*a* (tag decoding unit 203) according to the frequency of occurrence of the tag in such a manner that a code of a tag more frequently occurring has a shorter length.

Figure 20:
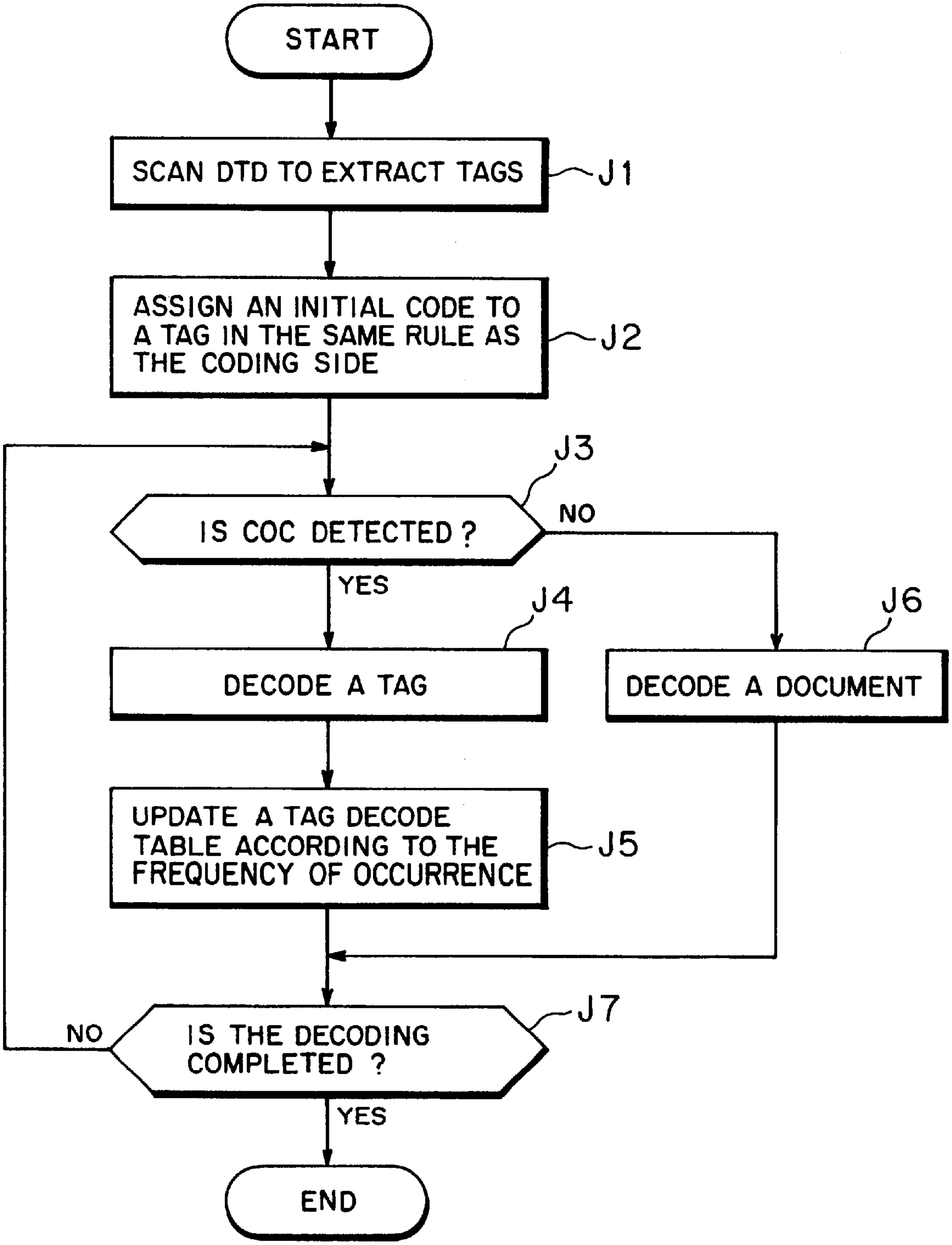
FIG. 20 is a flowchart for illustrating an operation of the decompressing apparatus for an SGML document according to the fourth embodiment.

Next, detailed description will be made of an operation of the decompressing apparatus 3 for an SGML document with the above structure according to the fourth embodiment with reference to a flowchart (Steps J1 through J7) shown in FIG. 20.

The decompressing apparatus 3 scans the inputted DTD 302 to extract tags defined in the DTD 302 by the SGML tag extracting unit 200 (Step J1), and outputs the tags to the dictionary creating unit 207 of the tag decode table creating unit 201'. The dictionary creating unit 207 successively assigns an initial code to each of the received tags in the same rule to assign initial codes as the coding side, so as to create the dictionary (tag decode table) (Step J2).

The decompressing apparatus 3 determines whether inputted coded data is COC or not by the COC discriminating unit 202 (Step J3). If the inputted coded data is COC, the decompressing apparatus 3 directs the switching control unit 205 of the decoding process unit 203*a* to switch output of the coded data to the tag decoding unit 203. The tag decoding unit 203 refers to the dictionary created by the dictionary creating unit 207 on the basis of coded data following the COC, and outputs a symbol (tag) corresponding to the coded data as a result of the decoding (Step J4).

The decompressing apparatus 3 calculates the frequency of occurrence of the tag decoded by the tag decoding unit 203, and re-assigns a code according to a result of the calculation (a code shorter than the initial code) to the decoded tag to update the dictionary by the dictionary updating unit 208 (Step J5).

If the coded data that is an object of the decoding is not COC at the above Step J3, the decompressing apparatus 3 directs the switching control unit 205 to switch the output of the coded data to the second decoding unit 204. The second decoding unit 204 decodes the coded data (character or character string) in a decoding system corresponding to the coding system on the coding side (from NO route at Step J3 to Step J6).

The decompressing apparatus 3 determines whether the decoding is completed or not (Step J7). If the decoding is not completed (if some of the coded data still remain), the decompressing apparatus 3 repeats the process from the above Step J3 until the decoding is completed (NO route at Step J7). If the decoding is completed, the decompressing apparatus 3 terminates the decompressing process (YES route at Step J7).

The decompressing apparatus 3 for an SGML document according to the fourth embodiment assigns a predetermined initial code to each of tags extracted by the SGML tag extracting unit 200 in the same rule as the coding side so as to create a dictionary of the tags, and updates a code in the first decoding dictionary according to the frequency of occurrence of a tag when the tag is decoded. As the decoding is proceeded, a shorter code is re-assigned to a tag more frequently occurring. This can largely improve an efficiency of decoding of tags and enables accurate decoding of coded tags.

Figure 21:
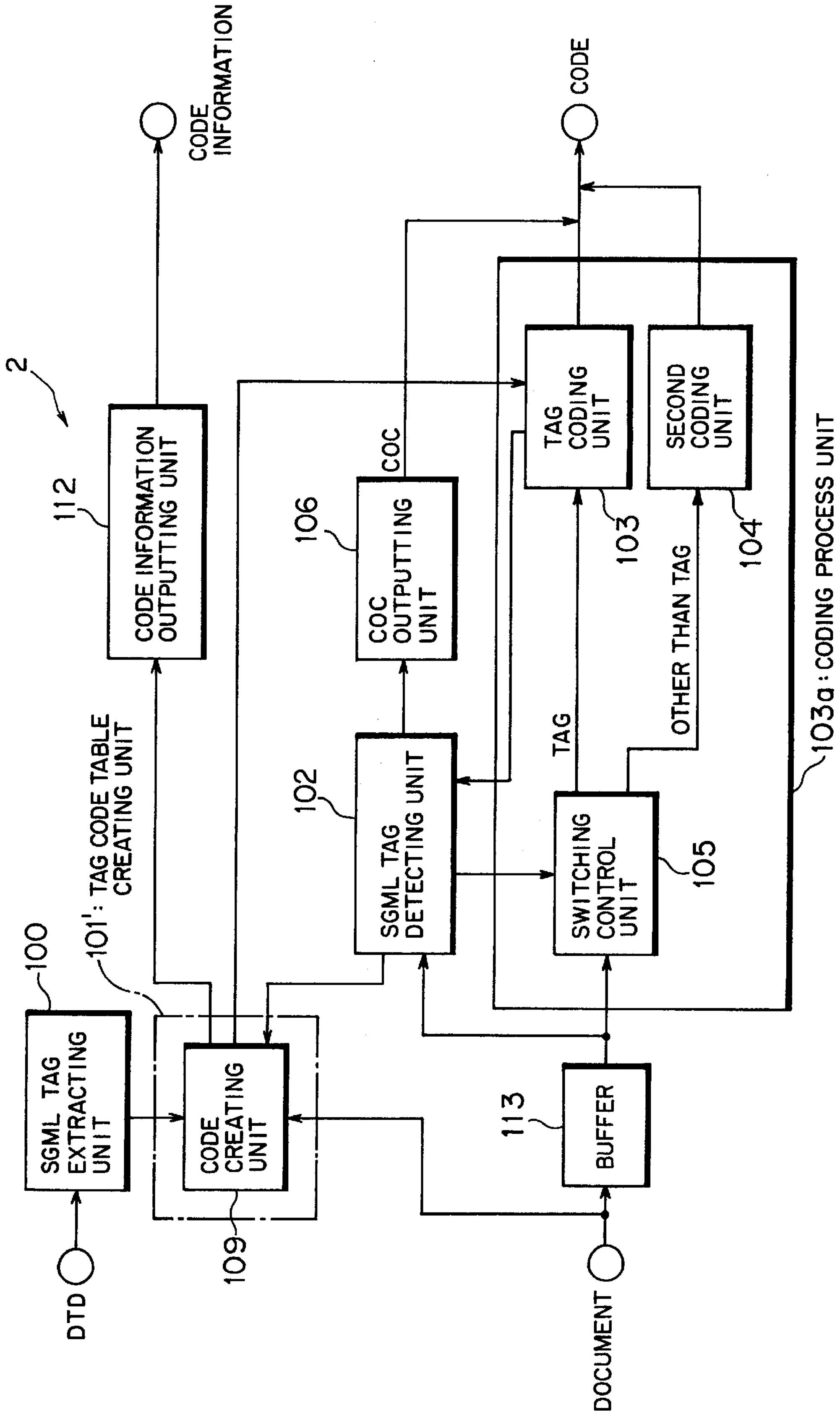
FIG. 21 is a block diagram showing a structure of an essential part of a compressing apparatus for an SGML document according to a fifth embodiment of this invention.

(e) Description of a Fifth Embodiment (e1) Description of a Compressing Apparatus (Coding Side) for an SGML Document FIG. 21 is a block diagram showing a structure of an essential part of a compressing apparatus for an SGML document according to a fifth embodiment of this invention. As shown in FIG. 21, a compressing apparatus 2 for an SGML document according to the fifth embodiment has a code information outputting unit 112 and a buffer 113 in addition to a code creating unit 109 as the tag code table creating unit 101', as compared with the compressing apparatus 2 shown in FIG. 17.

The above code creating unit (second coding dictionary creating unit) 109 calculates the frequency of occurrence of a tag in the document instance 303 on the basis of tags extracted by the SGML tag extracting unit 100, and assigns a code according to a result of the calculation to the tag so as to create a dictionary of tags (statistical quasi-dynamic dictionary: second coding dictionary) as a tag code table. The code information outputting unit (occurrence frequency information outputting unit) 112 outputs information on the frequency of occurrence of the above tag to the tag decoding side.

The buffer 113 holds document instance data until the tag code table (dictionary) is created by the code creating unit 109.

Figure 22:
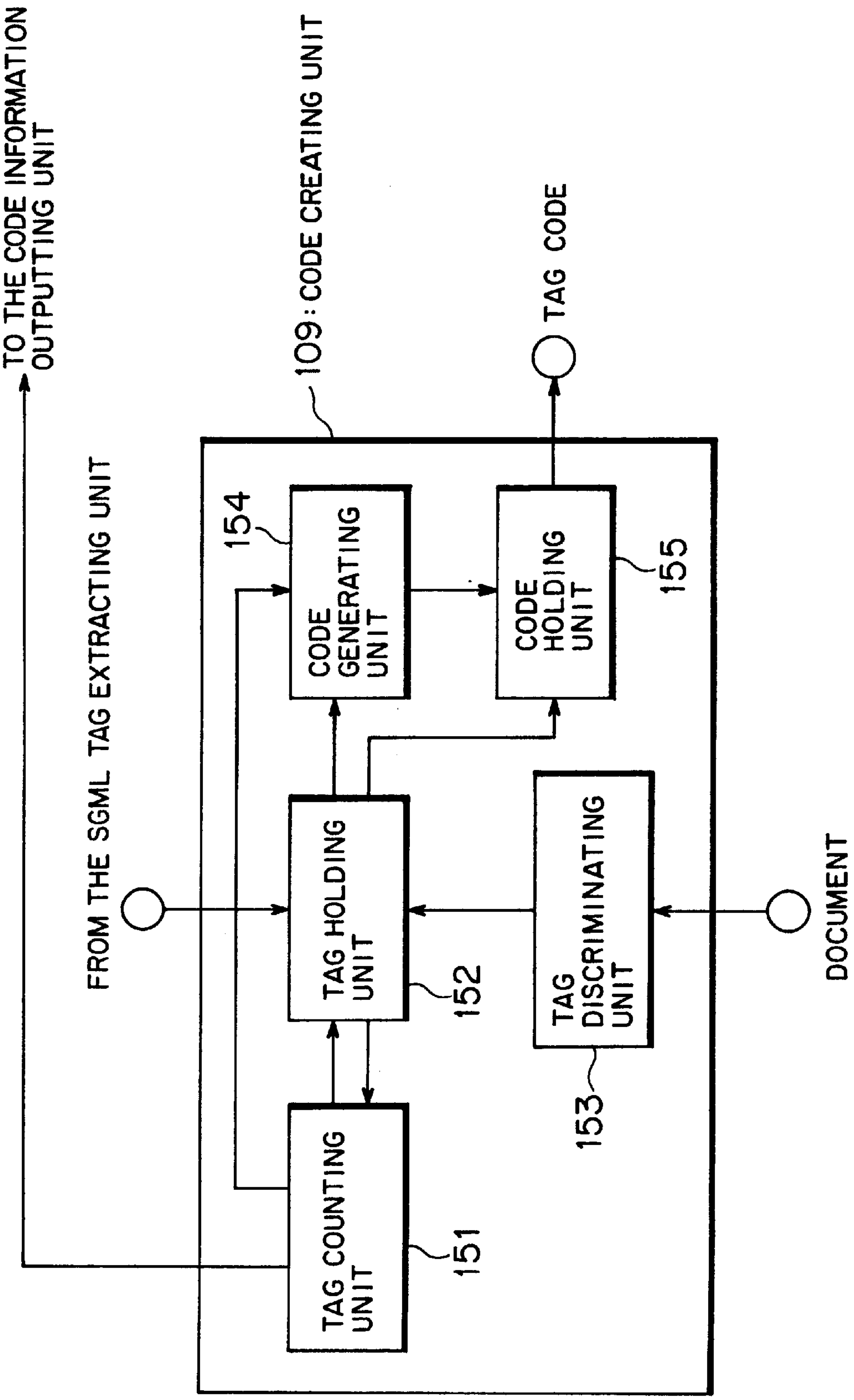
FIG. 22 is a block diagram showing a structure of a code creating unit of the compressing apparatus for an SGML document according to the fifth embodiment.

The above code creating unit 109 has, according to this embodiment, a tag counting unit 151, a tag holding unit 152, a tag determining unit 153, a code generating unit 154 and a code holding unit 155, as shown in FIG. 22, for example, to readily create the above statistical quasi-dynamic dictionary.

The tag counting unit 151 determines whether a tag extracted by the SGML tag extracting unit 100 coincides with a tag in the document instance 303 or not to count the frequency of occurrence of the tag in the document instance 303. According to this embodiment, the tag extracted by the SGML tag extracting unit 100 and the tag in the document instance 303 determined as a tag by the tag determining unit 153 are held in the tag holding unit 152, and the frequency of occurrence of each tag is determined by counting the number of times of coincidence of each of held tags.

The code generating unit 154 generates a code according to a result of the counting by the tag counting unit 151 as a code to be assigned to a tag. The code holding unit 155 relates the code generated by the code generating unit 154 to the tag held in the tag holding unit 152 fed through the tag determining unit 153 and holds them, so as to create a dictionary of tags.

The compressing apparatus 2 for an SGML document according to the fifth embodiment first creates a dictionary (code table) of tags in consideration of the frequencies of occurrence of the tags in the document instance 303, and codes the tags on the basis of the dictionary (not updating the dictionary) in the following coding process.

Figure 23:
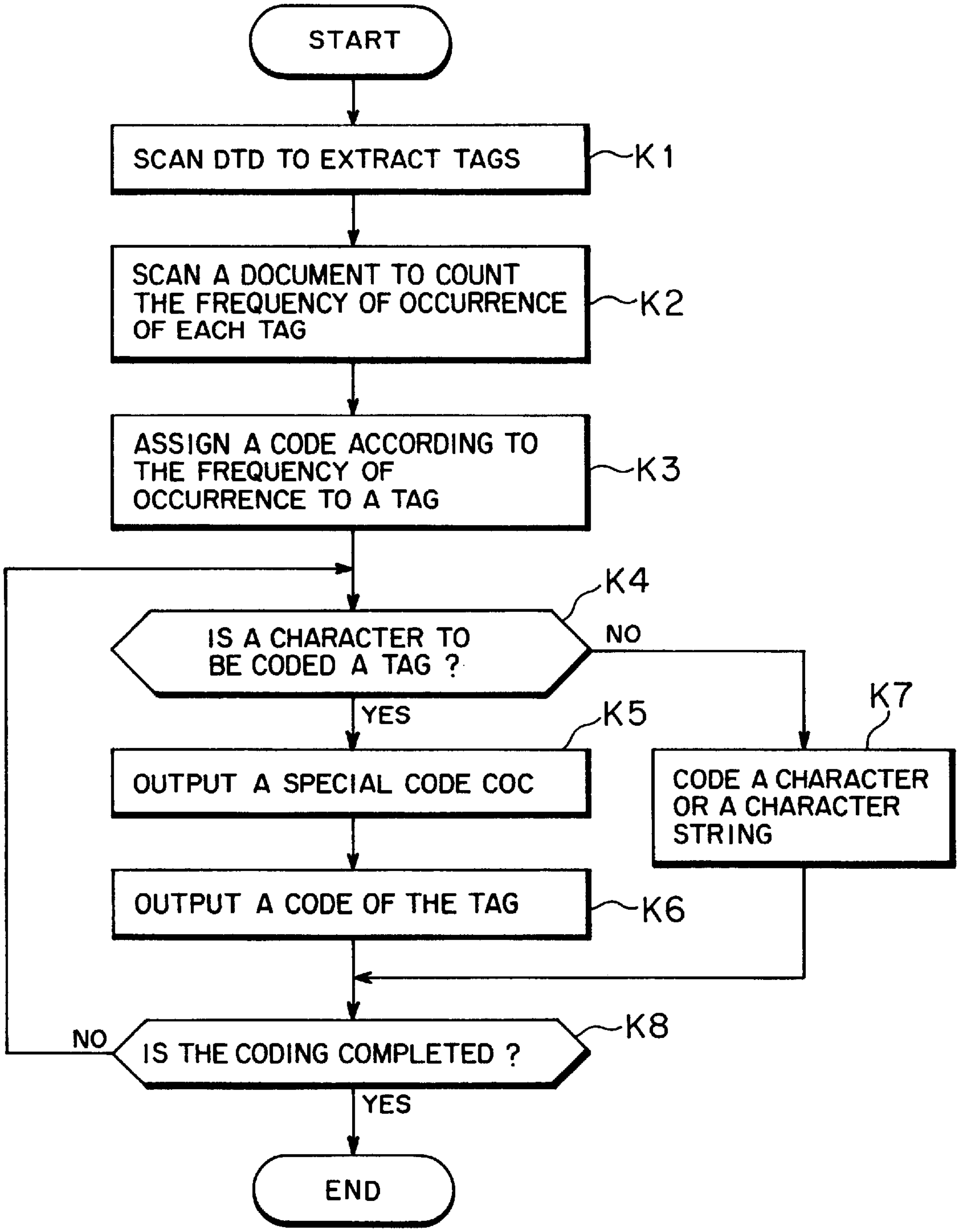
FIG. 23 is a flowchart for illustrating an operation of the compressing apparatus for an SGML document according to the fifth embodiment.

Next, detailed description will be made of an operation of the compressing apparatus 2 for an SGML document with the above structure according to the fifth embodiment with reference to a flowchart (Steps K1 through K8) shown in FIG. 23.

The compressing apparatus 2 scans the inputted DTD 302 to extract tags defined in the DTD 302 by the SGML tag extracting unit 100 (Step K1), and outputs the tags to the code creating unit 109.

The code creating unit 109 holds the received tags in the tag holding unit 152, while determining whether data in the inputted document instance 303 is a tag or not, thereby holding only tags in the document instance data in the tag holding unit 152. The tag counting unit 151 counts the number of times of coincidence of each of the tags held in the tag holding unit 152 to calculate the frequency of occurrence of each of the tags (Step K2).

The code creating unit 109 generates a code according to the frequency of occurrence of a tag obtained as above by the code generating unit 154 and assigns each code to a corresponding tag, and holds the code (create a dictionary of tags) by the code holding unit 155 (Step K3). At this time, the occurrence frequency information on each of tags counted by the tag counting unit 151 is outputted to the decoding side through the code information outputting unit 112 as information used to create the same dictionary as the coding side by the decoding side.

The compressing apparatus 2 determines whether the inputted document instance data is a tag or not by the SGML tag detecting unit 102 (Step K4). If the inputted document instance data is a tag, the compressing apparatus 2 directs the COC outputting unit 106 to output COC, and directs the switching control unit 105 in the coding process unit 103*a* to switch output of the document instance data to the tag coding unit 103, at the same time. The COC outputting unit 106 outputs the COC to the decoding side described later (from YES route at Step K4 to Step K5). The tag coding unit 103 refers to the dictionary created by the code creating unit 109 on the basis of the inputted data (tag), and outputs a code corresponding to the tag as a code of the tag (Step K6).

If the document instance data that is an object of the coding is not a tag at the above Step K4, the compressing apparatus 2 directs the switching control unit 105 to switch the output of the document instance data to the second coding unit 104. The second coding unit 104 codes the document instance data (character or character string) in a predetermined coding system (from NO route at Step K4 to Step K7).

The compressing apparatus 2 determines whether the coding is completed or not (Step K8). If the coding is not completed (if some of the document instance data still remain), the compressing apparatus 2 repeats the process from the above Step K4 until the coding is completed (NO route at Step K8) If the coding is completed, the compressing apparatus 2 terminates the compressing process (YES route at Step K8).

The compressing apparatus 2 for an SGML document according to the fifth embodiment counts the frequency of occurrence of a tag in the document instance 303, assigns a code according to a result of the counting to the tag (i.e., assigns a shorter code to a tag more frequently occurring) to create a dictionary of tags (statistical quasi-dynamic dictionary). It is therefore possible to assign in advance a short code to a tag frequently occurring before the tag is coded.

Accordingly, it is unnecessary to update the dictionary each time the tag is coded unlike the above statistical dynamic dictionary so that the compressing process can be sped up while a compression rate of tags is improved.

In the above compressing apparatus 2, the code information outputting unit 112 outputs information on the frequency of occurrence of a tag to the decoding side of the tag. Therefore, the decoding side can readily make the same dictionary as the coding side. This largely contributes to improvement of accuracy in the tag decoding process on the decoding side. Incidentally, it is possible to send not information on the frequency of occurrence of a tag, but information on a code table created on the coding side to the decoding side.

Figure 24:
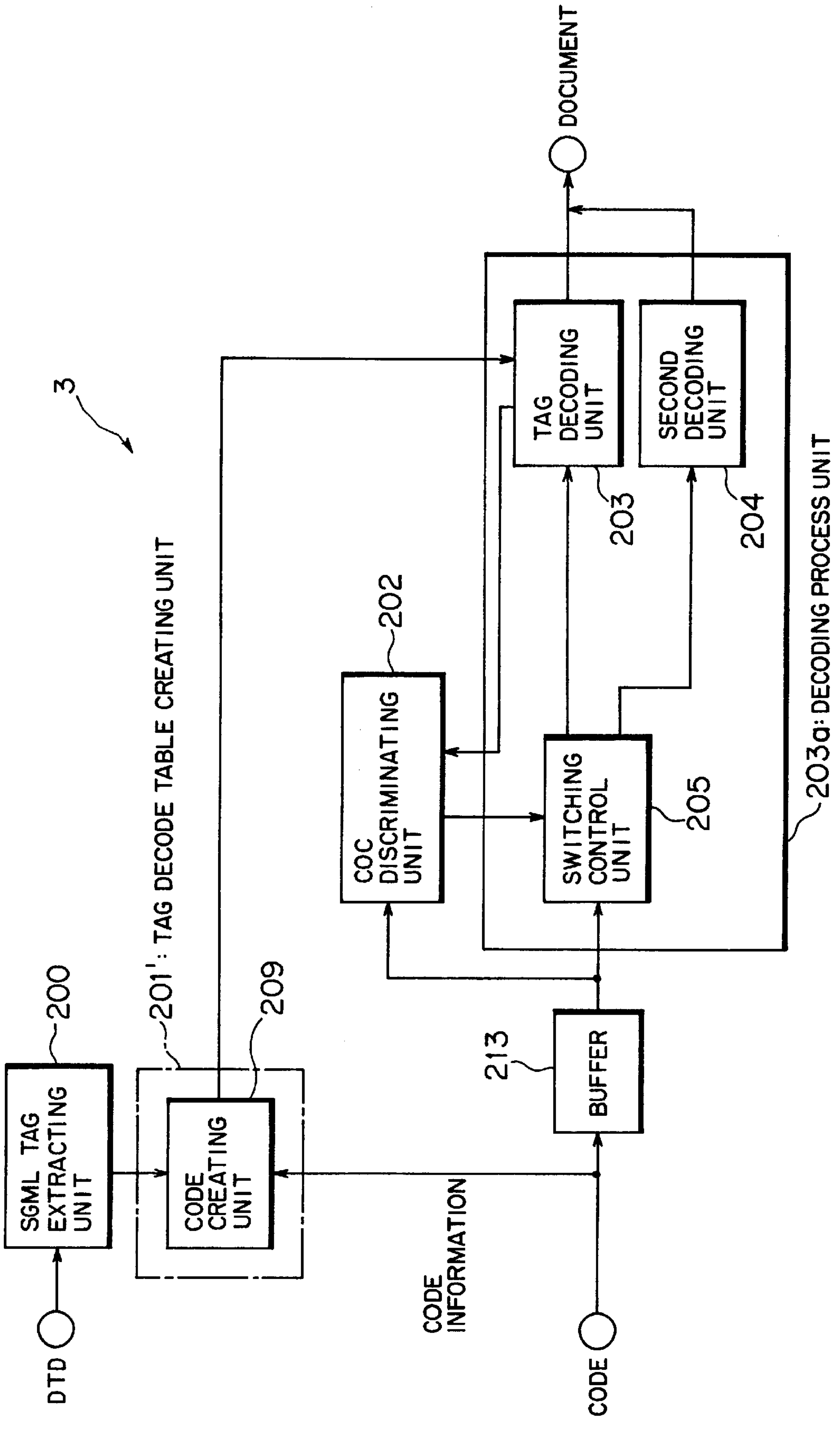
FIG. 24 is a block diagram showing a structure of an essential part of a decompressing apparatus for an SGML document according to the fifth embodiment of this invention.

(e2) Description of a Decompressing Apparatus (Decoding Side) for an SGML Document FIG. 24 is a block diagram showing a structure of an essential part of a decompressing apparatus for an SGML document according to a fifth embodiment of this invention. A decompressing apparatus 3 shown in FIG. 24 corresponds to the decoding side of the compressing apparatus 2 described above with reference to FIGS. 21 through 23. According to this embodiment, the decompressing apparatus 3 has a buffer 213, in addition to a code creating unit 209 as the tag decode table creating unit 201' instead of the memory 201 shown in FIG. 14.

The above code creating unit (second decoding dictionary creating unit) 209 creates a dictionary (statistical quasi-dynamic dictionary: second decoding dictionary) of tags having the same code contents as the coding side as a tag decode table on the basis of the tags extracted by the SGML tag extracting unit 200 and the information on the frequency of occurrence of each tag sent through the code information outputting unit 112 on the coding side.

The buffer 213 holds inputted coded data until the code creating unit 209 creates a tag decode table (dictionary).

Figure 25:
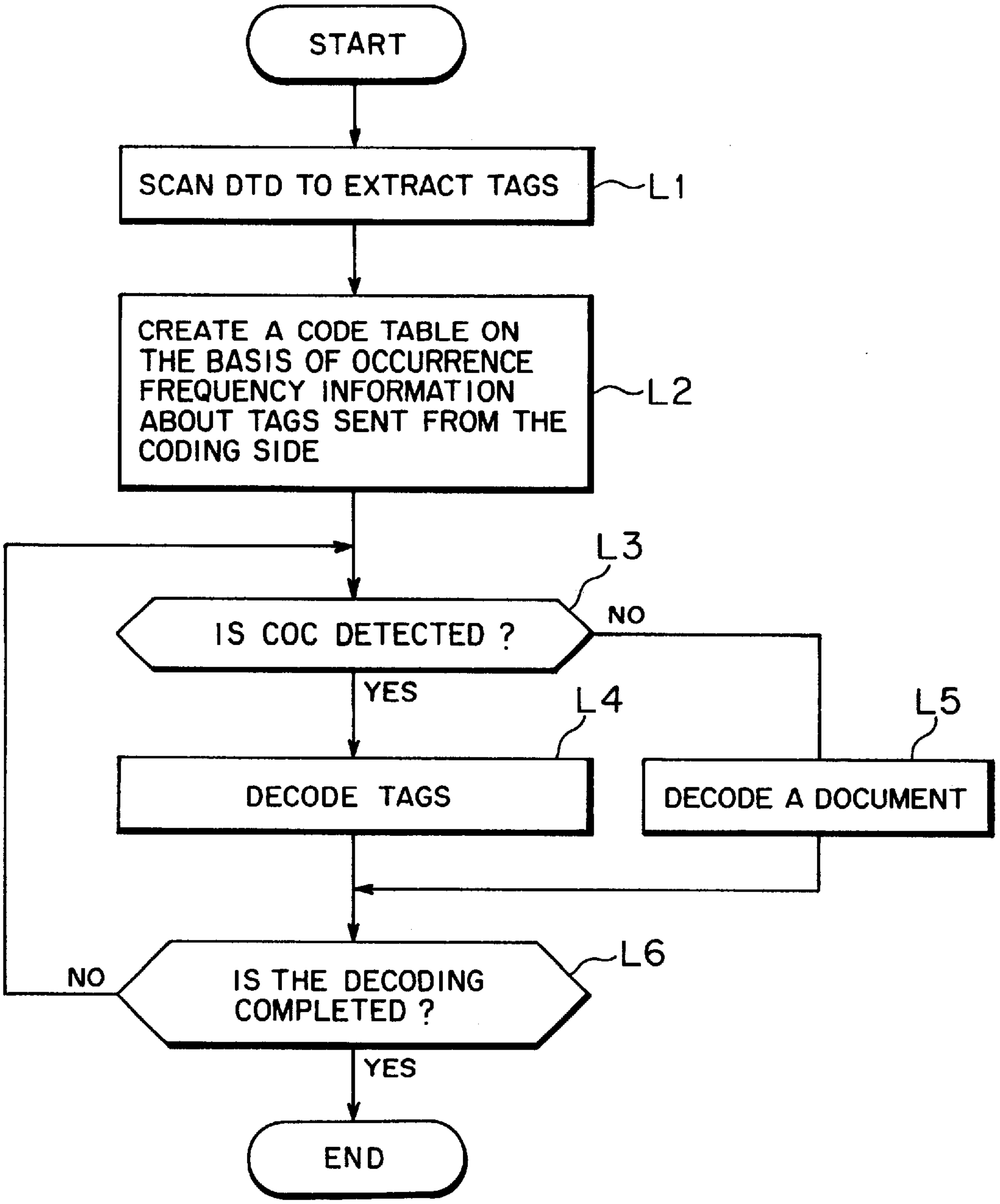
FIG. 25 is a flowchart for illustrating an operation of the decompressing apparatus for an SGML document according to the fifth embodiment.

Next, detailed description will be made of an operation of the decompressing apparatus 3 for an SGML document with the above structure according to the fifth embodiment with reference to a flowchart (Steps L1 through L6) shown in FIG. 25.

The decompressing apparatus 3 scans the inputted DTD 302 to extract tags defined in the DTD 302 by the SGML tag extracting unit 200 (Step L1), and outputs the tags to the dictionary creating unit 209 of the tag decode table creating unit 201'. The dictionary creating unit 209 creates a decode table (dictionary) of tags having the same contents of codes as the code table created on the coding side on the basis of the received tags and information on the frequency of occurrence of each of the tags sent from the coding side (Step L2).

The decompressing apparatus 3 determines whether inputted coded data is COC or not by the COC determining unit 202 (Step L3). If the inputted coded data is COC, the decompressing apparatus 3 directs the switching control unit 205 of the decoding process unit 203*a* to switch output of the coded data to the tag decoding unit 203. The tag decoding unit 203 refers to the dictionary created by the dictionary creating unit 207 on the basis of coded data following the COC, and outputs a symbol (tag) corresponding to the coded data as a result of the decoding (from YES route at Step L3 to Step L4).

If the coded data that is an object of the decoding is not COC, the decompressing apparatus 3 directs the switching control unit 205 to switch the output of the coded data to the second decoding unit 204. The second decoding unit 204 decodes the coded data (character or character string) in a decoding system corresponding to the coding system on the coding side (from NO route at Step L3 to Step L5).

The decompressing apparatus 3 determines whether the decoding is completed or not (Step L6). If the decoding is not completed (if some of the coded data still remain), the decompressing apparatus 3 repeats the process from the above Step L3 until the decoding is completed (NO route at Step L6). If the decoding is completed, the decompressing apparatus 3 terminates the decompressing process (YES route at Step L6).

The decompressing apparatus 3 for an SGML document according to the fifth embodiment creates a tag decode table having the same contents of codes as the coding side on the basis of tags in the DTD 302 extracted by the SGML tag extracting unit 200 and information on the frequency of occurrence of each of the tags in the document instance 303 of the SGML document sent form the coding side. It is therefore possible to accurately decode tags coded on the coding side. Since a shorter code is assigned to a tag more frequently occurring in advance as same as the coding side, it is possible to improve an efficiency of tag decoding and speed up the decoding process.

Figure 26:
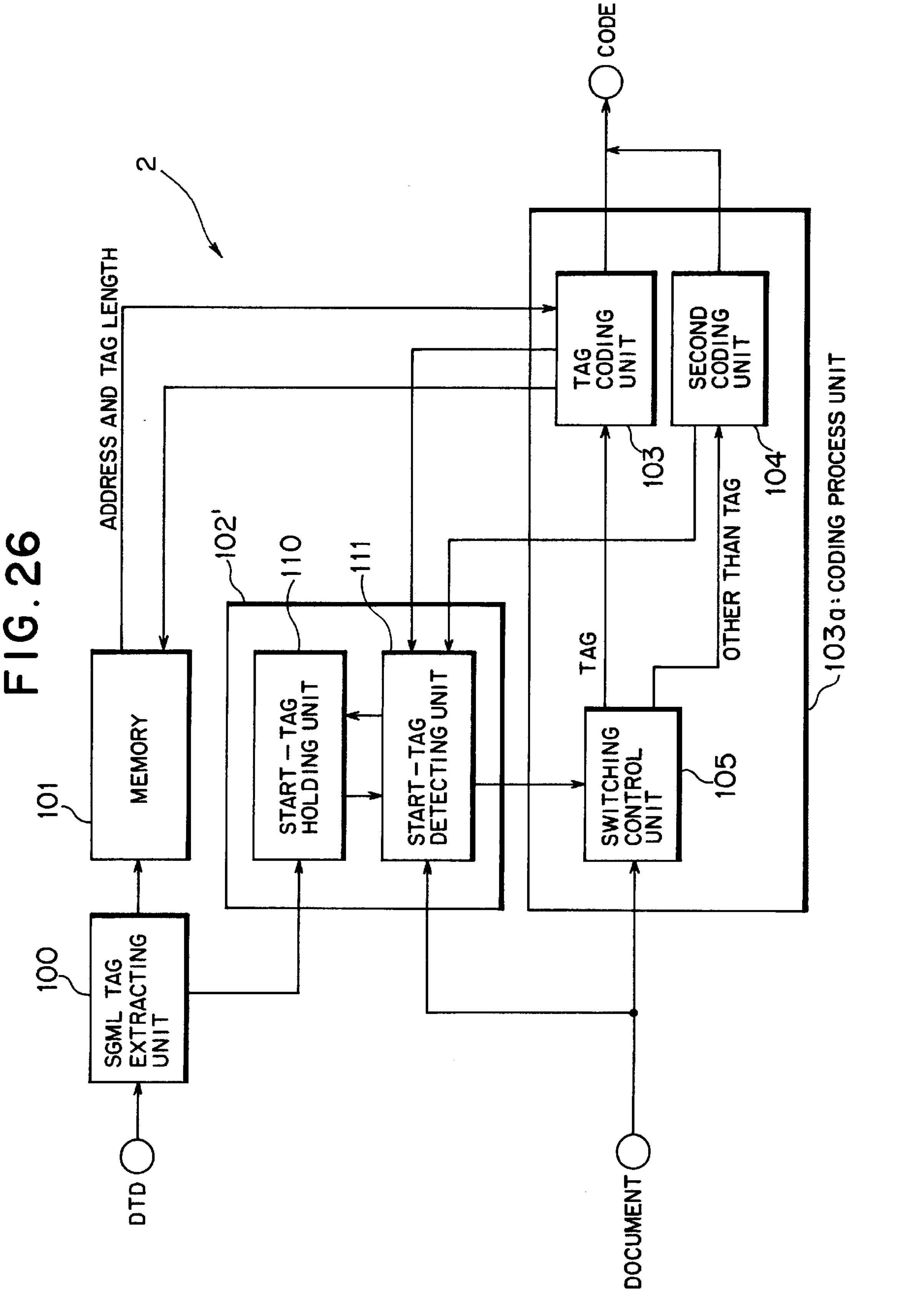
FIG. 26 is a block diagram showing a structure of an essential part of a compressing apparatus for an SGML document according to a sixth embodiment of this invention.

(f) Description of a Sixth Embodiment (f1) Description of a Compressing Apparatus (Coding Side) for an SGML Document FIG. 26 is a block diagram showing a structure of an essential part of a compressing apparatus for an SGML document according to a sixth embodiment of this invention. A compressing apparatus 2 shown in FIG. 26 has an SGML tag detecting unit 102' instead of the SGML tag detecting unit 102 shown in FIG. 10, which includes a start-tag holding unit 110 and a start-tag detecting unit 111.

The above start-tag holding unit 110 holds only a tag start character (string) ("<" or "</", for example) showing a start of a tag in the DTD 302 extracted by the SGML tag extracting unit 100. The start-tag detecting unit 111 detects whether data of inputted document instance 303 is a start-tag or not on the basis of the tag start characters (strings) (hereinafter referred as start-tags) held in the start-tag holding unit 110.

The SGML tag detecting unit (tag discriminating unit) 102' according to this embodiment detects a start-tag showing a start of a tag on the basis of the tags extracted by the SGML tag extracting unit 100, thereby determining that input data is a tag.

According to this embodiment, when the above start-tag is detected, the above start-tag detecting unit 111 gives a direction to the switching control unit 205 so that the start-tag itself ("<" or "</") is coded as data other than tags by the second coding unit 104, after that, gives a direction to the switching control unit 205 so that data following the above start-tag is coded as a body of a tag by the tag coding unit 103.

Figure 27:
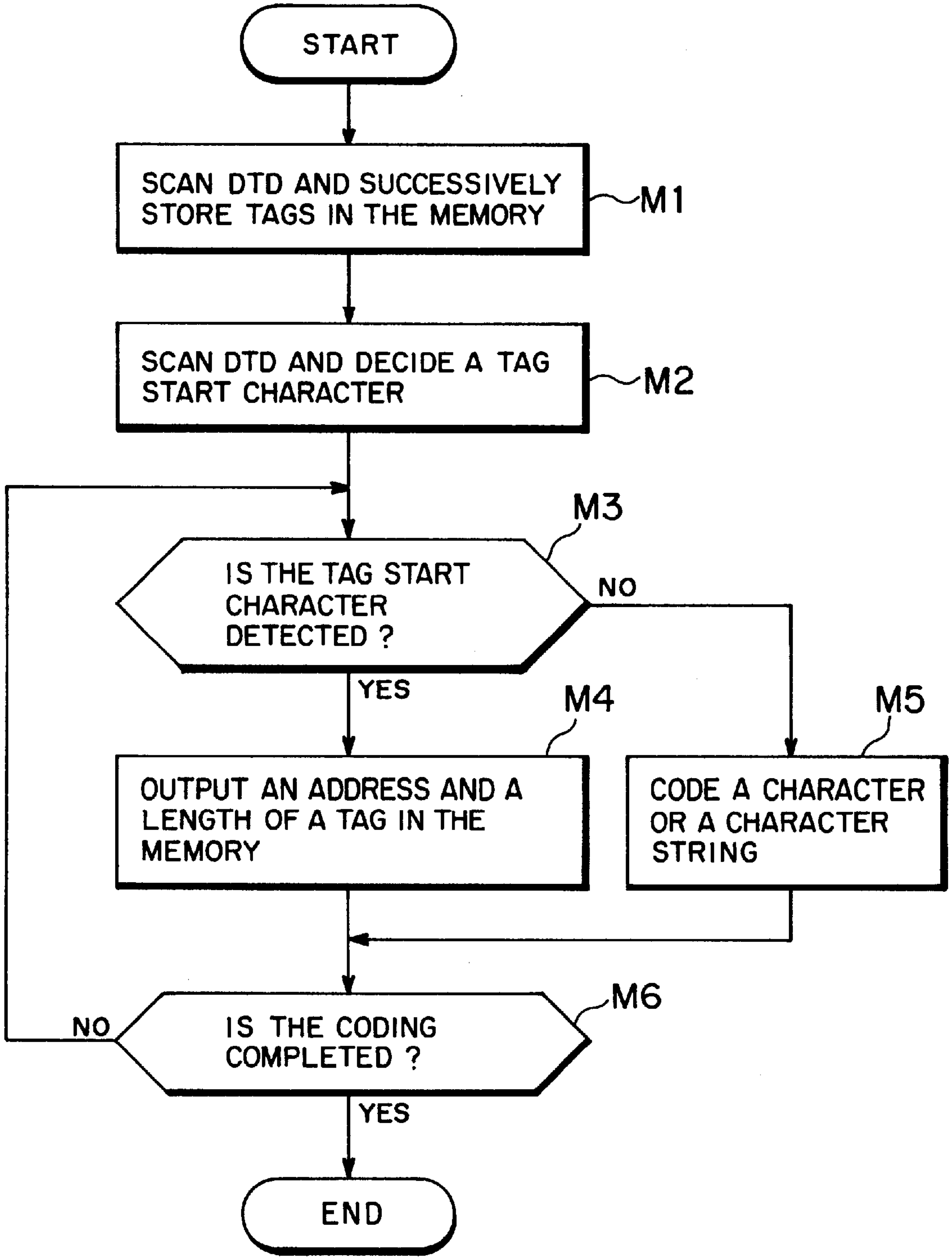
FIG. 27 is a flowchart for illustrating an operation of the compressing apparatus for an SGML document according to the sixth embodiment.

Next, detailed description will be made of an operation of the compressing apparatus 2 for an SGML document with the above structure according to the sixth embodiment with reference to a flowchart (Steps M1 through M6) shown in FIG. 27.

The compressing apparatus 2 scans the inputted DTD 302 to extract tags defined in the DTD 302 by the SGML tag extracting unit 100, successively stores the tags in the memory 101, and assigns address information and length information of the memory 101 to each of the tags to create a tag code table (Step M1).

At this time, only start-tags among the tags extracted by the SGML tag extracting unit 100 are outputted to the start-tag holding unit 110. The start-tag holding unit 110 successively holds the inputted start-tags to decide the start-tags (Step M2).

The compressing apparatus 2 determines whether inputted document instance data is a start-tag or not by the start-tag detecting unit 111 (Step M3) If the inputted document instance data is a start-tag, the compressing apparatus 2 directs the switching control unit 105 of the coding process unit 103*a* to switch output of the document instance data to the second coding unit 104. The second coding unit 104 codes the input data (start-tag) in a predetermined coding system.

After that, the start-tag detecting unit 111 directs the switching control unit 105 to switch the output of the document instance data to the tag coding unit 103, whereby a body of a tag following the above start-tag is inputted to the tag coding unit 103. The tag coding unit 103 refers to the memory 101 on the basis of the inputted data (body of the tag), and outputs an address and a length of the tag as a code of the tag (from YES route at Step M3 to Step M4).

If the inputted document instance data is not a start-tag, the start-tag detecting unit 111 directs the switching control unit 105 to switch the output of the document instance data to the second coding unit 104. The second coding unit 104 codes the document instance data (character or character string) in a predetermined coding system (from NO route at Step M3 to Step M5).

The compressing apparatus 2 determines whether the coding is completed or not (Step M6). If the coding is not completed (if some of the document instance data still remain), the compressing apparatus 2 repeats the process from the above Step M3 until the coding is completed (NO route at Step M6) If the coding is completed, the compressing apparatus 2 terminates the compressing process (YES route at Step M6).

The compressing apparatus 2 for an SGML document according to the sixth embodiment determines whether the inputted document instance data is a tag or not by detecting a start-tag. It is therefore possible to determine a tag from a start-tag on the decoding side in the similar manner even if the above COC is not outputted to the decoding side. Since the COC is not outputted, it is possible to more increase a compression rate of SGML documents.

Since determination of a tag is done by detecting only a start-tag, it is possible to determine a tag with a simpler structure and at a high speed. This largely contributes to speeding-up of the tag compressing process.

Figure 28:
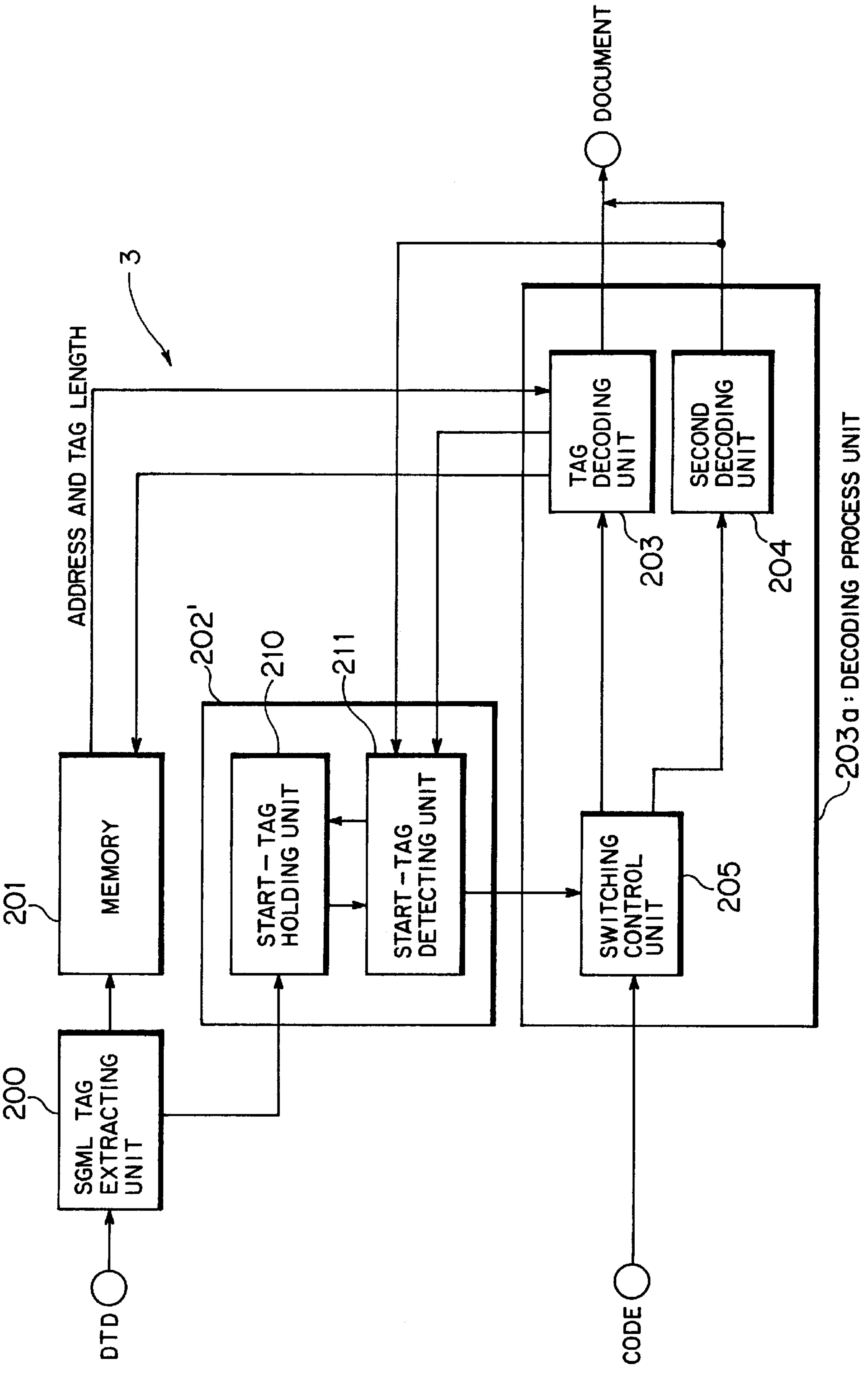
FIG. 28 is a block diagram showing a structure of an essential part of a decompressing apparatus for an SGML document according to the sixth embodiment of this invention.

(f2) Description of a Decompressing Apparatus (Decoding Side) for an SGML Document FIG. 28 is a block diagram showing a structure of an essential part of a decompressing apparatus for an SGML document according to the sixth embodiment of this invention. A decompressing apparatus 3 shown in FIG. 28 corresponds to the decoding side of the compressing apparatus 2 described above with reference to FIGS. 26 and 27. According to this embodiment, the decompressing apparatus 3 has an SGML tag detecting unit 202' including a start-tag holding unit 210 and a start-tag detecting unit 211, instead of the COC discriminating unit 202 shown in FIG. 14.

The above start-tag holding unit 210 and the start-tag detecting unit 211 are similar to the start-tag holding unit 110 and the start-tag detecting unit 111 on the coding side, respectively. The start-tag holding unit 210 holds only start-tags ("<", "</", and the like) in the DTD 302 extracted by the SGML tag extracting unit 200. The start-tag detecting unit 211 detects whether a symbol decoded by the second decoding unit 204 is a start-tag or not on the basis of the start-tags held in the start-tag holding unit 210. When a start-tag is detected, the start-tag detecting unit 211 directs the switching control unit 205 to switch output of coded data to the tag decoding unit 203 since the coded data following the start-tag, which is an object of the decoding, is a code of the tag.

Figure 29:
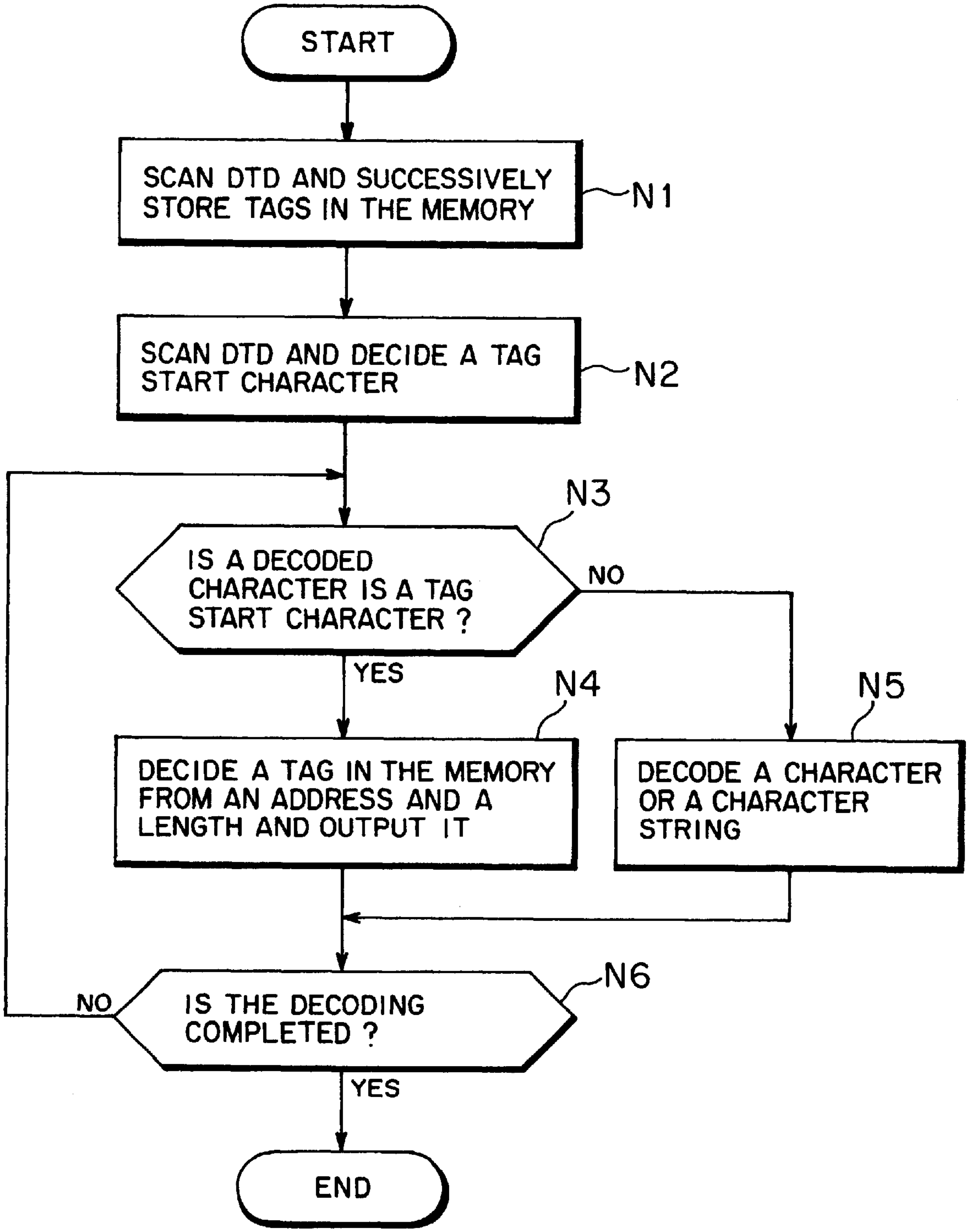
FIG. 29 is a flowchart for illustrating an operation of the decompressing apparatus for an SGML document according to the sixth embodiment.

Next, detailed description will be made of an operation of the decompressing apparatus 3 with the above structure according to the sixth embodiment with reference to a flowchart (Steps N1 through N6) shown in FIG. 29.

The decompressing apparatus 3 scans the inputted DTD 302 to extract tags defined in the DTD 302 by the SGML tag extracting unit 200, successively stores the extracted tags in the memory 101, and assigns address information and length information of the memory 101 to each of the tags as a code of a tag to create a tag decode table (Step N1).

At this time, only start-tags among the tags extracted by the SGML tag extracting unit 200 are outputted to the start-tag holding unit 210. The start-tag holding unit 210 successively holds the inputted start-tags to determine the start-tags (Step N2).

The decompressing apparatus 3 determines whether a symbol decoded by the second decoding unit 204 is a start-tag or not by the start-tag detecting unit 211 (Step N3) If the symbol is a start-tag, the decompressing apparatus 3 directs the switching control unit 205 to switch output of coded data (code of body of a tag=address and length) inputted following the start-tag to the tag decoding unit 203 so that the coded data is outputted to the tag decoding unit 203.

The tag decoding unit 203 refers to the memory 201 on the basis of the inputted data (address and length), and outputs a corresponding tag as a result of the decoding (from YES route at Step N3 to Step N4).

If the symbol decoded by the second decoding unit 204 is not a start-tag, the start-tag detecting unit 211 directs the switching control unit 205 to switch the output of the coded data to the second decoding unit 204. The second decoding unit 204 decodes the coded data in a decoding system corresponding to the coding system on the coding side (from NO route at Step N3 to Step N5).

The decompressing apparatus 3 determines whether the decoding is completed or not (Step N6). If the decoding is not completed (if some of the coded data still remain), the decompressing apparatus 3 repeats the process from the above Step N3 until the decoding is completed (NO route at Step N6). If the decoding is completed, the decompressing apparatus 3 terminates the decompressing process (YES route at Step N6).

The decompressing apparatus 3 for an SGML document according to the sixth embodiment detects whether decoded coded data is a start-tag or not to determine a start position of a tag, so as to switch between decoding of a tag and decoding of a character (string) other than tags without receiving the above COC. It is therefore possible to accurately decompress tags while more increasing a compression rate on the coding side since no COC is received.

Since determination of a tag is done by detecting only a start-tag, it is possible to determine a tag with a simpler structure and at a higher speed. This largely contributes to speeding-up of the tag decoding process.

The compressing apparatus 2 for an SGML document in each of the above embodiments can code tags in the document instance 303 and compress them so as to largely decrease a quantity of data of an SGML document. Since not only tags but also characters (strings) other than tags are coded in a predetermined coding system to be compressed, a quantity of data of an SGML document can be largely decreased.

The decompressing apparatus 3 for an SGML document in each of the above embodiments can decode coded tags or tags and characters (strings) other than tags, efficiently and accurately. It is therefore possible to accurately decompress tags or tags and characters (strings) other than tags at any time.

Each of the above compressing apparatus 2 and decompressing apparatus 3 can be accomplished by providing the recording medium 15 such as the floppy disk 11, the CD-ROM 12, the MO 13 or the like storing a compression program and a decompression program having the above functions to the computers 2 and 3. This largely improves versatility of this invention so that spread of this invention is largely expected.

(g) Others

In each of the above embodiments, the compressing apparatus 2 and the decompressing apparatus 3 are realized as different units in different personal computers. However, it is alternatively possible to realized both of the compressing apparatus 2 and the decompressing apparatus 3 as a compressing/decompressing apparatus in one personal computer.

Figure 30:
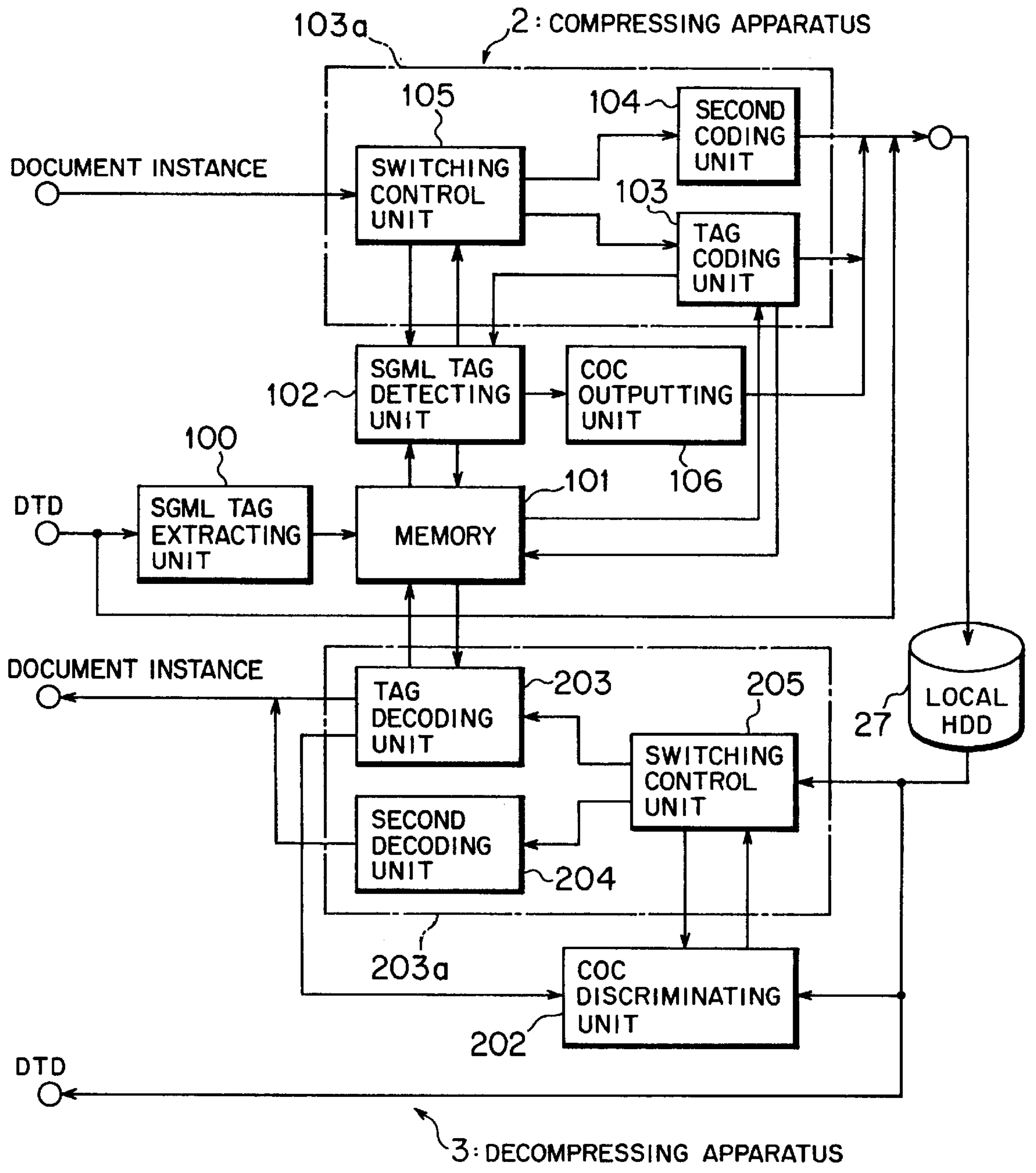
FIG. 30 is a block diagram showing a structure of an essential part of a compressing/decompressing apparatus for an SGML document according to an embodiment of this invention.

When the compressing apparatus 2 (refer to FIG. 10) and the decompressing apparatus (refer to FIG. 14) described before in the third embodiment are realized in one personal computer, a structure of which is as shown in FIG. 30.

In this case, the decoding side may use a tag code table created on the coding side to decode tags. Therefore, the memory 101 is commonly used on both of the coding and decoding sides (functioning as a tag code/decode table creating unit), as shown in FIG. 30. An operation of each part of the compressing/decompressing apparatus for an SGML document shown in FIG. 30 is similar to that described in the third embodiment, detailed description of which is omitted here.

When the tags are decoded, the above compressing/decompressing apparatus for an SGML document decodes tags on the basis of stored contents (tag code/decode table) of the memory 101 created and used when the tags are coded. Accordingly, it is at least unnecessary to separately create a decode table for decoding tags and a code table for coding the tags unlike each of the above embodiment. This largely contributes to speeding-up of the tag decoding (decompressing) process and a decrease of a scale of the apparatus.

As to the compressing apparatus 2 and the decompressing apparatus 3 in each of the above embodiments excepting the third embodiment, it is possible to realize them as a compressing/decompressing apparatus in one apparatus (personal computer), as well.

In each of the above embodiments, a tag defined in the DTD 302 of an SGML document is extracted and assigned a code thereto. However, if a tag is also defined in the SGML declaration 301 as well as the DTD 302, the tag in the SGML declaration 301 may be extracted and assigned a code thereto.

Further, in each of the above embodiments, only the document instance 303 of an SGML document is compressed/decompressed. However, it is possible to compress/decompress portions (SGML declaration 301 and DTD 302) other than the document instance 303.

What is claimed is:

1. A tag document compressing apparatus to encode a tag document including a document type definition (DTD) defining a tag showing a document structure and a document instance described using said tag defined in said DTD to compress said tag document comprising:

- a tag extracting unit to scan a DTD of an inputted tag documents, which is object of compressing, to extract said tag;
- a tag code table creating unit to assign a code to said tag, in the same DTD, extracted by said tag extracting unit to create a tag code table dedicated to tag encoding to compress said tag document; and
- a tag coding unit to encode said tag in said document instance corresponding to said DTD of said tag document on the basis of said tag code table created by said tag code table creating unit.

2. The tag document compressing apparatus according to claim 1, wherein when a plurality of tag documents having the same DTD are encoded, said tag coding unit encodes tags in the document instances of all of the tag documents on the basis of a single tag code table created with respect to the first tag document by said tag extracted unit and said tag code table creating unit.

3. A tag document compressing apparatus to encode a tag document including a document type definition (DTD) defining a tag showing a document structure and a document instance described using said tag defined in said DTD to compress said tag document comprising:

- a tag extracting unit to scan the DTD of an inputted tag document, to be compressed, to extract said tag;
- a tag code creating unit to assign a code to said tag, in the same DTD, extracted by said tag extracting unit to create a tag code table dedicated to tag encoding to compress said tag document;
- a tag discriminating unit to determine whether data in said inputted document instance is said tag extracted by said tag extracting unit;
- a coding process unit to encode said inputted data of said document instance corresponding to said DTD on the basis of said tag code table when said tag discriminating unit determines that said inputted data is said tag, whereas encoding said inputted data in a predetermined encoding system when said tag discriminating unit determines that said inputted data is not said tag; and
- a special code outputting unit to output a special code showing encoding of a tag to a decoding side of said tag before said inputted data is encoded when said tag discriminating unit discriminates that said inputted data is said tag.

4. The tag document compressing apparatus according to claim 3, wherein said coding process unit comprises:

a first coding unit to encode said inputted data on the basis of said tag code table;

a second coding unit to encode said inputted data in a predetermined encoding system; and a switching control unit to output said inputted data to said first coding unit when said tag discriminating unit determines that said inputted data is said tag, whereas outputting said inputted data to said second coding unit when said tag discriminating unit determines that said inputted data is not said tag.

5. The tag document compressing apparatus according to claim 3, wherein said tag code table creating unit has a tag storing unit to store said tag extracted by said tag extracting unit, and assigns information on a position in which said tag is stored in said tag storing unit as a code of said tag to create said tag code table.

6. The tag document compressing apparatus according to claim 5, wherein said information on a storing position is information including address information of said tag storing unit.

7. The tag document compressing apparatus according to claim 6, wherein said information on a storing position is said address information and information on a length of a relevant tag.

8. The tag document compressing apparatus according to claim 3, wherein said tag code table creating unit comprises:

a first coding dictionary creating unit to assign an initial code to said tag extracted by said tag extracting unit to create a first coding dictionary of said tag as said tag code table; and a coding dictionary updating unit to update said code in said first coding dictionary created by said first coding dictionary creating unit according to the frequency of occurrence of a corresponding tag when said coding process unit encodes said tag.

9. The tag document compressing apparatus according to claim 3, wherein said tag code table creating unit comprises:

a second coding dictionary creating unit to count the frequency of occurrence of said tag in said document instance on the basis of said tag extracted by said tag extracting unit, and assigning a code according to a result of the counting to said tag to create a second coding dictionary of said tag as said tag code table.

10. The tag document compressing apparatus according to claim 9, further comprising an occurrence frequency information outputting unit to output information on the frequency of occurrence of said tag to said decoding side of said tags.

11. The tag document compressing apparatus according to claim 9, wherein said second coding dictionary creating unit comprises:

a tag counting unit to determine whether said tag extracted by said tag extracting unit coincides with said tag in said document instance to count the frequency of occurrence of said tag in said document instance;

a code generating unit to generate a code according to a result of the counting by said tag counting unit; and a code holding unit to hold said code generated by said code generating unit to create said second coding dictionary.

12. A tag document compressing apparatus to encode a tag document including a document type definition (DTD) defining a tag showing a document structure and a document instance described using said tag defined in said DTD to compress said tag document comprising:

a tag extracting unit to scan said DTD of an inputted tag document, to be compressed, to extract said tag;

a tag code table creating unit to assign a code to said tag, in the same DTD, extracted by said tag extracting unit to create a tag code table dedicated to tag encoding to compress said tag document;

a tag discriminating unit to determine whether inputted data in said document instance is said tag extracted by said tag extracting unit; and a coding process unit to encode said inputted data of said document instance corresponding to said DTD on the basis of said tag code table when said tag discriminating unit determines that said inputted data is said tag, whereas encoding said inputted data in a predetermined encoding system when said tag discriminating unit determines that said inputted data is not said tag.

13. The tag document compressing apparatus according to claim 12, wherein said tag discriminating unit detects a start-tag showing a start of a tag on the basis of said tag extracted by said tag extracting unit to determine that said inputted data is said tag.

14. A tag document decompressing apparatus to decode an encoded tag document having a document type definition (DTD) defining a tag showing a document structure and a document instance described using said tag defined in said DTD to decompress said encoded tag document comprising:

a tag extracting unit to scan said DTD of an inputted tag document, to be decompressed, to extract said tag;

a tag decode table creating unit to assign a code to said tag, in the same DTD, extracted by said tag extracting unit to create a tag decode table dedicated to tag decoding to decompress said encoded tag document; and a tag decoding unit to decode said tag in said encoded document instance corresponding to said DTD on the basis of said tag decode table created by said tag decode table creating unit.

15. The tag document decompressing apparatus according to claim 14, wherein when a plurality of tag document having the same DTD are decoded, said tag decoding unit decodes tags in document instances of all of said tag documents on the basis of said single tag decode table created with respect to the first tag document by said tag extracting unit and said tag decode table creating unit.

16. A tag document decompressing apparatus to decode an encoded tag document having a document type definition (DTD) defining a tag showing a document structure and a document instance described using said tag defined in said DTD to decompress said encoded tag document comprising:

a tag extracting unit to scan the DTD of an inputted tag document, to be decompressed, to extract said tag;

a tag decode table creating unit to assign a code to said tag, in the same DTD, extracted by said tag extracting unit to create a tag decode table dedicated to tag decoding to decompress said encoded tag document;

a special code discriminating unit to determine whether inputted encoded data is a special code showing inputting of encoded data of a tag; and a decoding process unit to decode encoded data, following said special code, of said document instance corresponding to said DTD on the basis of said tag decode table when said special code discriminating unit determines that said encoded data is said special code, whereas decoding said encoded data in a predetermined decoding system when said special code discriminating unit determines that said encoded data is not said special code.

17. The tag document decompressing apparatus according to claim 16, wherein said decoding process unit comprises:

a first decoding unit to decode said inputted encoded data on the basis of said tag decode table;

a second decoding unit to decode said inputted encoded data in a predetermined decoding system; and a switching control unit to output encoded data following said special code to said first decoding unit when said special code discriminating unit determines that said encoded data is said special code, whereas outputting said encoded data to said second decoding unit when said special code discriminating unit determines that said encoded data is not said special code.

18. The tag document decompressing apparatus according to claim 16, wherein said tag decode table creating unit has a tag storing unit to store said tag extracted by said tag extracting unit, and assigns information on a position in which said tag is stored in said tag storing unit as a code of said tag to create said tag decode table.

19. The tag document decompressing apparatus according to claim 18, wherein said information on the position is information including address information of said tag storing unit.

20. The tag document decompressing apparatus according to claim 19, wherein said information on the position is said address information and information on a length of a relevant tag.

21. The tag document decompressing apparatus according to claim 16, wherein said tag decode table creating unit comprises:

a first decoding dictionary creating unit to assign an initial code to each of said tag extracted by said tag extracting unit to create a first decoding dictionary of said tag as said tag decode table; and a decoding dictionary updating unit to update said code in said first decoding dictionary created by said first decoding dictionary creating unit according to the frequency of occurrence of a corresponding tag when said decoding process unit decodes said tag.

22. The tag document decompressing apparatus according to claim 16, wherein said tag decode table creating unit comprises:

a second decoding dictionary creating unit to create a second decoding dictionary of said tag on the basis of said tag extracted by said tag extracting unit and information on the frequency of occurrence of said tag.

23. A tag document decompressing apparatus to decode an encoded tag document having a document type definition (DTD) defining a tag showing a document structure and a document instance described using said tag defined in said DTD to decompress said encoded tag document comprising:

a tag extracting unit to scan the DTD of an inputted tag document, to be decompressed, to extract said tag;

a tag decode table creating unit to assign a code to said tag, in the same DTD, extracted by said tag extracting unit to create a tag decode table dedicated to tag decoding to decompress said encoded tag document;

a tag code discriminating unit to determine whether inputted encoded data is encoded data of said tag; and a decoding process unit to decode said encoded data of said document instance corresponding to said DTD on the basis of said tag decode table when said tag code discriminating unit determines that said encoded data is said tag, whereas decoding said encoded data in a predetermined decoding system when said code discriminating unit determines that said encoded data is not said tag.

24. The tag document decompressing apparatus according to claim 23, wherein said tag code discriminating unit detects a start-tag showing a start of a tag on the basis of said tag extracted by said tag extracting unit to determine that said encoded data is said tag.

25. A tag document compressing/decompressing apparatus to encode a tag document having a document type definition (DTD) defining a tag showing a document structure and a document instance described using said tag defined in said DTD to compress said tag document, and decoding said encoded tag document to decompress the same comprising:

a tag extracting unit to scan said DTD of an inputted tag document to extract said tag;

a tag code/decode table creating unit to assign a code to said tag, in the same DTD, extracted by said tag extracting unit to create a tag code/decode table dedicated to tag coding and tag decoding to compress said tag document and decompress said encoded tag document;

a tag coding unit to encode said tag in said document instance corresponding to said DTD on the basis of said tag code/decode table created by said tag code/decode table creating unit; and a tag decoding unit to decode said tag in said document instance encoded by said tag coding unit on the basis of said tag code/decode table created by said tag code/decode table creating unit.

26. A tag document compressing/decompressing apparatus to encode a tag document having a document type definition (DTD) defining a tag showing a document structure and a document instance described using said tag defined in said DTD to compress said tag document, and decoding said encoded tag document to decompress the same comprising:

a tag extracting unit to scan said DTD of an inputted tag document to extract said tag;

a tag code/decode table creating unit to assign a code to said tag, in the same DTD, extracted by said tag extracting unit to create a tag code/decode table dedicated to tag coding and tag decoding to compress said tag document and decompress said encoded tag document;

a tag discriminating unit to determine whether inputted data in said document instance is said tag extracted by said tag extracting unit;

a coding process unit to encode said inputted data of said document instance corresponding to said DTD on the basis said tag code/decode table when said tag discriminating unit determines that said inputted data is said tag, whereas encoding said inputted data in a predetermined encoding system when said tag discriminating unit determines that said inputted data is not said tag;

a special code outputting unit to output a special code showing encoding of a tag before said inputted data is encoded when said tag discriminating unit determines that said inputted data is said tag;

a special code discriminating unit to determine whether encoded data outputted from said encoding process unit is said special code; and a decoding process unit to decode encoded data following said special code outputted from said coding process unit on the basis of said tag code/decode table when said special code discriminating unit determines that said encoded data is said special code, whereas decoding said encoded data outputted from said encoding process unit in a predetermined decoding system when said special code discriminating unit determines that said encoded data is not said special code.

27. A tag document compressing method to encode a tag document including a document type definition (DTD) defining a tag showing a document structure and a document instance described using said tag defined in the DTD to compress said tag document, comprising:

assigning a code to said tag in the same DTD to create a tag code table dedicated to tag coding to compress said tag document, and encoding said tag in said document instance corresponding to said DTD on the basis of said tag code table.

28. The tag document compressing method according to claim 27, wherein when a plurality of tag documents having the same DTD are encoded, tags in the document instances of all of said tag documents are encoded on the basis of a single tag code table created with respect to the first tag document.

29. A tag document compressing method to encode a tag document including a document type definition (DTD) defining a tag showing a document structure and a document instance described using said tag defined in said DTD to compress said tag document, comprising:

assigning a code to said tag in the same DTD to create a tag code table dedicated to tag coding to compress said tag document;

outputting a special code showing encoding of a tag to a decoding side of said tag when inputted data of said document instance is said tag and encoding said inputted data of said document instance corresponding to said DTD on the basis of said tag code table, whereas encoding said inputted data in a predetermined encoding system when said inputted data is not said tag.

30. A tag document compressing method to encode a tag document including a document type definition (DTD) defining a tag showing a document structure and a document instance described using said tag defined in said DTD to compress said tag document, comprising the steps of:

assigning a code to said tag in the same DTD to create a tag code table dedicated to tag coding to compress said tag document;

encoding inputted data in said document instance corresponding to said DTD on the basis of said tag code table when said inputted data is said tag, whereas encoding said inputted data in a predetermined encoding system when said inputted data is not said tag.

31. A tag document decompressing method to decode an encoded tag document having a document type definition (DTD) defining a tag showing a document structure and a document instance described using said tag defined in said DTD to decompress said encoded tag document, comprising:

assigning a code to said tag in the same DTD to create a tag decode table dedicated to tag decoding to decode to decompress said encoded tag document; and decoding said tag in said encoded document instance corresponding to said DTD on the basis of said tag decode table.

32. The tag document decompressing method according to claim 31, wherein when a plurality of tag documents having the same DTD are decoded, tags in the document instances of all of said tag documents are decoded on the basis of a single tag decode table created with respect to the first tag document.

33. A tag document decompressing method to decode an encoded tag document having a document type definition (DTD) type defining a tag showing a document structure and a document instance described using said tag defined in said DTD to decompress said encoded tag document, comprising:

assigning a code to said tag in the same DTD to create a tag decode table dedicated to tag decoding to decompress said encoded tag document; and decoding encoded data of said document instance corresponding to said DTD inputted following a special code showing that encoded data is said tag on the basis of said tag decode table when said inputted encoded data is said special code, whereas decoding said encoded data in a predetermined decoding system when said inputted encoded data is not said special code.

34. A tag document decompressing method to decode an encoded tag document having a document type definition (DTD) defining a tag showing a document structure and a document instance described using said tag defined in said DTD to decompress said encoded tag document, comprising:

assigning a code to said tag in the same DTD to create a tag decode table dedicated to tag decoding to decompress said encoded tag document; and decoding inputted encoded data of said document instance corresponding to said DTD on the basis of said tag decode table when said inputted encoded data is encoded data of said tag, whereas decoding said inputted encoded data in a predetermined decoding system when said inputted encoded data is not encoded data of said tag.

35. A tag document compressing/decompressing method to encode a tag document having a document type definition (DTD) defining a tag showing a document structure and a document instance described using said tag defined in said DTD to compress said tag document, and decoding said encoded tag document to decompress the same, comprising:

assigning a code to said tag in the same DTD to create a tag code/decode table dedicated to tag coding and tag decoding to compress said tag document and decompress said encoded tag document; and encoding said tag in said document instance corresponding to said DTD on the basis of said tag code/decode table, and decoding said encoded tag on the basis of said tag code/decode table.

36. A tag document compressing/decompressing method to encode a tag document having a document type definition (DTD) defining a tag showing a document structure and a document instance described using said tag defined in said DTD to compress said tag document, and decoding said encoded tag document to decompress the same, comprising:

assigning a code to said tag in the same DTD to create a tag code/decode table dedicated to tag coding and tag decoding to compress said tag document and decompress said encoded tag document;

outputting a special code showing encoding of a tag when inputted data in said document instance is said tag and encoding said inputted data of said document instance corresponding to said DTD on the basis of said tag code/decode table, whereas encoding said inputted data in a predetermined encoding system when said inputted data is not said tag; and when encoded data is decoded, decoding encoded data following said special code on the basis of said tag code/decode table when said encoded data is said special code, whereas decoding said encoded data in a predetermined decoding system when said encoded data is not said special code.

37. A recording medium readable by a computer storing a tag document compressing program to encode a tag document including a document type definition (DTD) defining a tag showing a document structure and a document instance described using said tag defined in said DTD to compress said tag document, characterized by that said tag document compressing program makes said computer function as a tag extracting unit to scan said DTD of an inputted tag document, to be compressed, to extract said tag, a tag code table creating unit to assign a code to said tag, in the same DTD, extracted by said tag extracting unit to create a tag code table dedicated to tag coding to compress said tag document, and a tag coding unit to encode said tag in said document instance corresponding to said DTD on the basis of said tag code table created by said tag code table creating unit.

38. A recording medium readable by a computer storing a tag document compressing program to encode a tag document including a document type definition (DTD) defining a tag showing a document structure and a document instance described using said tag defined in said DTD to compress said tag document, characterized by that said tag document compressing program makes said computer function as a tag extracting unit to scan said DTD of an inputted tag document, to be compressed, to extract said tag, a tag code table creating unit to assign a code to said tag, in the same DTD, extracted by said tag extracting unit to create a tag code table dedicated to tag coding to compress said tag document, a tag discriminating unit to determine whether inputted data in said document instance is said tag extracted by said tag extracting unit, a coding process unit to encode said inputted data of said document instance corresponding to said DTD on the basis of said tag code table when said tag discriminating unit determines that said inputted data is said tag, whereas encoding said inputted data in a predetermined encoding system when said tag discriminating unit determines that said inputted data is not said tag, and a special code outputting unit to output a special code showing encoding of a tag to a decoding side of said tag before said inputted data is encoded when said tag discriminating unit determines that said inputted data is said tag.

39. A recording medium readable by a computer storing a tag document decompressing program to decode an encoded tag document having a document type definition (DTD) defining a tag showing a document structure and a document instance described using said tag defined in said DTD to decompress said encoded tag document, characterized by that said tag document decompressing program makes said computer function as a tag extracting unit to scan said DTD of an inputted tag document, to be decompressed, to extract said tag, a tag decode table creating unit to assign a code to said tag, in the same DTD, extracted by said tag extracting unit to create a tag decode table dedicated to tag decoding to compress said tag document and decompress said encoded tag document, and a tag decoding unit to decode said tag in said encoded document instance corresponding to said DTD on the basis of said tag decode table created by said tag decode table creating unit.

40. A recording medium readable by a computer storing a tag document decompressing program to decode an encoded tag document having a document type definition (DTD) defining a tag showing a document structure and a document instance described using said tag defined in said DTD to decompress said tag document, characterized by that said tag document decompressing program makes said computer function as a tag extracting unit to scan said DTD of an inputted tag document to extract said tag, a tag decode table creating unit to assign a code to said tag, in the same DTD, extracted by said tag extracting unit to create a tag decode table dedicated to tag decoding to decompress said encoded tag document, a special code discriminating unit to determine whether inputted encoded data is a special code showing that encoded data of a tag is inputted, and a decoding process unit to decode encoded data of said document instance corresponding to said DTD inputted following said special code on the basis of said tag decode table when said special code discriminating unit determines that said encoded data is said special code, whereas decoding said encoded data in a predetermined decoding system when said special code discriminating unit determines that said encoded data is not said special code.

41. A recording medium readable by a computer storing a tag document compressing/decompressing program to encode a tag document having a document type definition (DTD) defining a tag showing a document structure and a document instance described using said tag defined in said DTD to compress said tag document and decoding said encoded tag document to decompress the same, characterized by that said tag document compressing/decompressing program makes said computer function as a tag extracting unit to scan said DTD of an inputted tag document to extract said tag, a tag code/decode table creating unit to assign a code to said tag, in the same DTD, extracted by said tag extracting unit to create a tag code/decode table dedicated to tag coding and tag decoding to compress said tag document and decompress said encoded tag document, a tag coding unit to encode said tag in said document instance corresponding to said DTD on the basis of said tag code/decode table created by said tag code/decode table creating unit, and a tag decoding unit to decode said tag in said document instance encoded by said tag coding unit on the basis of said tag code/decode table created by said tag code/decode table creating unit.

42. A recording medium readable by a computer storing a tag document compressing/decompressing program to code a tag document having a document type definition (DTD) defining a tag showing a document structure and a document instance described using said tag defined in said DTD to compress said tag document and decoding said encoded tag document to decompress the same, characterized by that said tag document compressing/decompressing program makes said computer function as a tag extracting unit to scan said DTD of an inputted tag document to extract said tag, a tag code/decode table creating unit to assign a code to said tag, in the same DTD, extracted by said tag extracting unit to create a tag code/decode table dedicated to tag coding and tag decoding to compress said tag document and decompress said encoded tag document, a tag discriminating unit to determine whether inputted data in said document instance is said tag extracted by said tag extracting unit, a coding process unit to encode said inputted data of said document instance corresponding to said DTD on the basis of said tag code/decode table when said tag discriminating unit determines that said inputted data is said tag, whereas encoding said inputted data in a predetermined system when said tag discriminating unit determines that said inputted data is not said tag, a special code outputting unit to output a special code showing encoding of a tag before said inputted data is encoded when said tag discriminating unit determines that said inputted is said tag, and a decoding process unit to decode encoded data following said special code outputted from said coding process unit on the basis of said tag code/decode table when said special code discriminating unit determines that said encoded data is said special code, whereas decoding said encoded data in a predetermined decoding system when said special code discriminating unit determines that said encoded data is not said special code.

* * * * *